United States Patent
Kamimura

(10) Patent No.: US 11,327,402 B2
(45) Date of Patent: May 10, 2022

(54) TREATMENT LIQUID FOR MANUFACTURING SEMICONDUCTOR, METHOD OF MANUFACTURING TREATMENT LIQUID FOR MANUFACTURING SEMICONDUCTOR, PATTERN FORMING METHOD, AND METHOD OF MANUFACTURING ELECTRONIC DEVICE

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 246 days.

(21) Appl. No.: 16/143,492

(22) Filed: Sep. 27, 2018

(65) Prior Publication Data
US 2019/0025701 A1  Jan. 24, 2019

Related U.S. Application Data

(63) Continuation of application No. PCT/JP2017/010619, filed on Mar. 16, 2017.

(30) Foreign Application Priority Data

Mar. 31, 2016 (JP) ............................. JP2016-073256
Mar. 10, 2017 (JP) ............................. JP2017-045815

(51) Int. Cl.
*G03F 7/32* (2006.01)
*G03F 7/16* (2006.01)
*G03F 7/40* (2006.01)
*G03F 7/20* (2006.01)
*G03F 7/38* (2006.01)
*G03F 7/42* (2006.01)
*H01L 21/02* (2006.01)
*H01L 21/027* (2006.01)

(52) U.S. Cl.
CPC ................. *G03F 7/32* (2013.01); *G03F 7/16* (2013.01); *G03F 7/168* (2013.01); *G03F 7/2006* (2013.01); *G03F 7/325* (2013.01); *G03F 7/38* (2013.01); *G03F 7/40* (2013.01); *G03F 7/422* (2013.01); *H01L 21/0206* (2013.01); *H01L 21/0274* (2013.01)

(58) Field of Classification Search
CPC . G03F 7/32; G03F 7/325; G03F 7/327; G03F 7/168; G03F 7/42; G03F 7/422
See application file for complete search history.

(56) References Cited

U.S. PATENT DOCUMENTS

| | | | |
|---|---|---|---|
| 8,540,960 B2 | 9/2013 | Zhan et al. | |
| 10,088,752 B2 | 10/2018 | Yamanaka et al. | |
| 10,705,428 B2 | 7/2020 | Yamanaka et al. | |
| 2007/0084792 A1* | 4/2007 | Mullee .................. | B01J 47/026 210/638 |
| 2008/0029487 A1* | 2/2008 | Kikuyama ................ | C23F 1/26 216/99 |
| 2012/0003591 A1 | 1/2012 | Enomoto et al. | |
| 2013/0174868 A1 | 7/2013 | Muraoka et al. | |
| 2014/0187041 A1 | 7/2014 | Duong et al. | |
| 2015/0144557 A1 | 5/2015 | Ly et al. | |

(Continued)

FOREIGN PATENT DOCUMENTS

| | | |
|---|---|---|
| CN | 103189965 | 7/2013 |
| CN | 104797982 | 7/2015 |

(Continued)

OTHER PUBLICATIONS

Ministry of the Environment, "Water Pollution Related Material", Aug. 2012, with Partial English translation, pp. 1-29.
Thermo Scientific, "A new chapter in GC-MS:Thermo Scientific Q Exactive GC Orbitrap GC-MS/MS System", pp. 1-12.
Yutaka Takahashi et al., "Introductory Course, Organic Mass Spectrometry", Bunseki (Analytical Sciences), Jul. 2007, with Partial English translation, pp. 328-335.
"Information Statement of Japaness Patent Application No. 2018-509012," received on Dec. 26, 2019, with English translation thereof, pp. 1-19.
"JP Notification Information Statement (2018-509012)" with English translation thereof, issued on Dec. 11, 2018, pp. 1-36.

(Continued)

*Primary Examiner* — Daborah Chacko-Davis
(74) *Attorney, Agent, or Firm* — JCIPRNET

(57) ABSTRACT

An object of the present invention is to provide a treatment liquid for manufacturing a semiconductor with which the deterioration of lithographic performance or the occurrence of defects is suppressed such that a fine resist pattern or a fine semiconductor element can be manufactured.
A treatment liquid for manufacturing a semiconductor according to an embodiment of the present invention includes: one compound (A) that satisfies the following requirement (a); one compound (B) or two or more compounds (B) that satisfy the following requirement (b); and one inorganic matter (C) or two or more inorganic matters (C) having any element selected from the group consisting of Al, B, S, N, and K. Here, a total content of the compound (B) in the treatment liquid is $10^{-10}$ to 0.1 mass %, and a ratio P of the inorganic matter (C) to the compound (B) represented by the following Expression I is $10^3$ to $10^{-6}$.
Requirement (a): a compound that is selected from the group consisting of an alcohol compound, a ketone compound, and an ester compound and of which a content in the treatment liquid is 90.0 to 99.9999999 mass %
Requirement (b): a compound that is selected from the group consisting of an alcohol compound having 6 or more carbon atoms, a ketone compound, an ester compound, an ether compound, and an aldehyde compound and of which a content in the treatment liquid is $10^{-11}$ to 0.1 mass %

$$P=[\text{Total Mass of Inorganic Matter (C)}]/[\text{Total Mass of Compound (B)}] \qquad \text{Expression I.}$$

25 Claims, 1 Drawing Sheet

(56) References Cited

U.S. PATENT DOCUMENTS

| | | | |
|---|---|---|---|
| 2015/0227049 A1 | 8/2015 | Yamanaka et al. | |
| 2015/0343391 A1 | 12/2015 | Ly et al. | |
| 2016/0054658 A1 | 2/2016 | Yoshidome et al. | |
| 2016/0056054 A1* | 2/2016 | Takahashi | H01L 21/324 438/754 |
| 2016/0254139 A1* | 9/2016 | Kamimura | C11D 7/265 510/176 |

FOREIGN PATENT DOCUMENTS

| | | |
|---|---|---|
| CN | 105122143 | 12/2015 |
| JP | S60237043 | 11/1985 |
| JP | H0331304 | 2/1991 |
| JP | H0949000 | 2/1997 |
| JP | H10436 | 1/1998 |
| JP | H11236660 | 8/1999 |
| JP | 2002121160 | 4/2002 |
| JP | 2004010530 | 1/2004 |
| JP | 2005232093 | 9/2005 |
| JP | 2008192641 | 8/2008 |
| JP | 2009025708 | 2/2009 |
| JP | 2012032788 | 2/2012 |
| JP | 2012062300 | 3/2012 |
| JP | 2013023441 | 2/2013 |
| JP | 2014054582 | 3/2014 |
| JP | 2014112176 | 6/2014 |
| JP | 2014125383 | 7/2014 |
| JP | 2015064494 | 4/2015 |
| JP | 2015084122 | 4/2015 |
| JP | 2015521101 | 7/2015 |
| KR | 20130139945 | 12/2013 |
| KR | 20150126641 | 11/2015 |
| WO | 2014069245 | 5/2014 |
| WO | 2016208299 | 12/2016 |

OTHER PUBLICATIONS

"JP Notification Information Statement (2018-509012)" with English translation thereof, issued on Dec. 11, 2018, pp. 1-38.

"International Search Report (Form PCT/ISA/210) of PCT/JP2017/010619," dated Jun. 6, 2017, with English translation thereof, pp. 1-7.

"Written Opinion of the International Searching Authority (Form PCT/ISA/237) of PCT/JP2017/010619," dated Jun. 6, 2017, with English translation thereof, pp. 1-9.

"Third Party Observation", submitted on Apr. 25, 2018, pp. 1-7.

"Office Action of Japan Counterpart Application", dated Jul. 23, 2019, with English translation thereof, pp. 1-8.

"Office Action of Japan Counterpart Application", dated Jun. 23, 2020, with English translation thereof, p. 1-p. 6.

"Office Action of Korea Counterpart Application", dated Jul. 1, 2020, with English translation thereof, pp. 1-10.

"Office Action of Japan Counterpart Application", dated Feb. 4, 2020, with English translation thereof, pp. 1-10.

Office Action of Korea Counterpart Application, with English translation thereof, dated Mar. 4, 2020, pp. 1-21.

"Office Action of Taiwan Counterpart Application", dated Apr. 17, 2020, with English translation thereof, pp. 1-12.

"Office Action of China Counterpart Application", dated May 11, 2021, with English translation thereof, pp. 1-21.

"The electrolytic polishing (Electro Polishing) related website." Aug. 7, 2009, pp. 1-4, with concise English explanation, Available at: https://m.blog.naver.com/PostView.nhn?blogId=dohyuni 1018 &logNo=80085683276&proxyReferer=https:%2F%2Fwww.google.com%2F.

"Office Action of Korea Counterpart Application" with English translation thereof, dated Aug. 3, 2021, p. 1-p. 12.

"Office Action of Korea Counterpart Application" with English translation thereof, dated Jan. 14, 2022, p. 1-p. 9.

Wenyu Lee et al., "Organic chemistry" with English concise explanation, Tianjin University, Sep. 2013, pp. 1-4.

"Office Action of China Counterpart Application" with English translation thereof, dated Feb. 14, 2022, p. 1-p. 20.

"Office Action of Japan Counterpart Application" with English translation thereof, dated Mar. 29, 2022, p. 1-p. 12.

"Third Party Observation of Korea Counterpart Application", dated Dec. 21, 2021, with English translation thereof, p. 1-p. 61.

* cited by examiner

TREATMENT LIQUID FOR MANUFACTURING SEMICONDUCTOR, METHOD OF MANUFACTURING TREATMENT LIQUID FOR MANUFACTURING SEMICONDUCTOR, PATTERN FORMING METHOD, AND METHOD OF MANUFACTURING ELECTRONIC DEVICE

CROSS-REFERENCE TO RELATED APPLICATIONS

This application is a Continuation Application of PCT Application No. PCT/JP2017/010619, filed Mar. 16, 2017, and based upon and claiming the benefit of priority from Japanese Patent Applications No. 2016-073256, filed Mar. 31, 2016; and No. 2017-045815, filed Mar. 10, 2017, the entire contents of all of which are incorporated herein by reference.

BACKGROUND OF THE INVENTION

1. Field of the Invention

The present invention relates to a treatment liquid for manufacturing a semiconductor, such as a developer, a rinsing liquid, a pre-wet liquid, or a peeling liquid, that is used in manufacturing steps of a semiconductor device, a method of manufacturing the treatment liquid for manufacturing a semiconductor, a pattern forming method, and a method of manufacturing an electronic device.

2. Description of the Related Art

The manufacturing steps of a semiconductor device include various steps such as a lithography step, an etching step, an ion implantation step, or a peeling step. In general, a step of treating unnecessary organic matters and inorganic matters using a treatment liquid is provided after the end of each step or before the start of the next step. For example, a development step of treating an exposed resist film using a developer, a peeling step of treating a resist remaining on a surface of a treated substrate using a peeling liquid, or a rinsing step of further purifying the surface using a rinsing liquid after the peeling step or the development step may be provided.

Various treatment liquids, such as a developer, a rinsing liquid, a pre-wet liquid, or a peeling liquid used in the manufacturing steps of a semiconductor device (hereinafter, referred to as "treatment liquids for manufacturing a semiconductor") are required to have high purity. Along with a reduction in size and functionality improvement of semiconductors, market needs for high-purity treatment liquids have been increasing, and the market is expected to expand in the future.

In order for the treatment liquid for manufacturing a semiconductor to have high purity, low metal concentration and low particle concentration are basic requirements. For example, JP2015-84122A discloses a technique capable of reducing the formation of particles in an organic developer. In addition, metal in the treatment liquid causes a phenomenon called migration in which the metal is diffused into a target material during a treatment. The migration inhibits transmission of an electrical signal and causes defects such as short-circuiting. In addition, this metal may function as a nucleus such that dust remains as a residue after a treatment, which causes deterioration of lithographic performance or the occurrence of defects. As a result, there is an adverse effect on the formation of a fine resist pattern or a semiconductor element. Under the above-described circumstances, higher purity of the treatment liquid for manufacturing a semiconductor has been strongly desired.

SUMMARY OF THE INVENTION

The latest treatment liquid for manufacturing a semiconductor that is used in the current semiconductor manufacturing industry achieves high purity to some extent. For example, in a rinsing liquid including isopropanol (IPA) (manufactured by FEUS) that is famous for high purity and low metal concentration, the total metal concentration is several tens to sever hundreds of mass ppt (parts per trillion). However, performance required in the future is, for example, a metal concentration of 10 mass ppt or lower, which cannot be satisfied under the present circumstances.

The present invention has been developed under the above-described circumstances, and an object thereof is to provide a treatment liquid for manufacturing a semiconductor with which deterioration of lithographic performance or the occurrence of defects is suppressed such that a fine resist pattern or a fine semiconductor element can be manufactured, and a method of manufacturing the treatment liquid for manufacturing a semiconductor. Another object of the present invention is to provide a pattern forming method using the treatment liquid for manufacturing a semiconductor and a method of manufacturing a semiconductor element including the pattern forming method.

One aspect of the present invention is as follows.

[1] A treatment liquid for manufacturing a semiconductor comprising:

one compound (A) that satisfies the following requirement (a);

one compound (B) or two or more compounds (B) that satisfy the following requirement (b); and one inorganic matter (C) or two or more inorganic matters (C) having any element selected from the group consisting of Al, B, S, N, and K, in which a total content of the compound (B) in the treatment liquid is $10^{-10}$ to 0.1 mass %, a ratio P of the inorganic matter (C) to the compound (B) represented by the following Expression I is $10^3$ to $10^{-6}$, the requirement (a): a compound that is selected from the group consisting of an alcohol compound, a ketone compound, and an ester compound and of which a content in the treatment liquid is 90.0 to 99.9999999 mass %, the requirement (b): a compound that is selected from the group consisting of an alcohol compound having 6 or more carbon atoms, a ketone compound, an ester compound, an ether compound, and an aldehyde compound and of which a content in the treatment liquid is $10^{-11}$ to 0.1 mass %, and $$P = [\text{Total Mass of Inorganic Matter (C)}]/[\text{Total Mass of Compound (B)}] \qquad \text{Expression I.}$$

[2] The treatment liquid for manufacturing a semiconductor according to [1], in which the inorganic matter (C) is a compound having any element selected from the group consisting of Al, B, and S.

[3] The treatment liquid for manufacturing a semiconductor according to [1] or [2], in which a content of the one inorganic matter (C) or each of the two or more inorganic matters (C) in the treatment liquid for manufacturing a semiconductor is 0.0001 to 100 mass ppb.

[4] The treatment liquid for manufacturing a semiconductor according to any one of [1] to [3],
in which a content of the one inorganic matter (C) or each of the two or more inorganic matters (C) in the treatment liquid for manufacturing a semiconductor is 0.001 to 100 mass ppb.

[5] The treatment liquid for manufacturing a semiconductor according to any one of [1] to [4],
in which the treatment liquid for manufacturing a semiconductor comprises Na, Ca, and Fe, and
a content of each of Na, Ca, and Fe is 0.01 mass ppt to 1000 mass ppb.

[6] The treatment liquid for manufacturing a semiconductor according to any one of [1] to [5],
in which a total content of metal particles measured by a SNP-ICP-MS method is 0.001 to 100 mass ppt.

[7] The treatment liquid for manufacturing a semiconductor according to any one of [1] to [6],
in which a total content of metal particles measured by a SNP-ICP-MS method is 1 to 100 mass ppt.

[8] The treatment liquid for manufacturing a semiconductor according to any one of [1] to [7],
in which the treatment liquid for manufacturing a semiconductor comprises at least one of compounds represented by the following Formulae I to V as the compound (B),

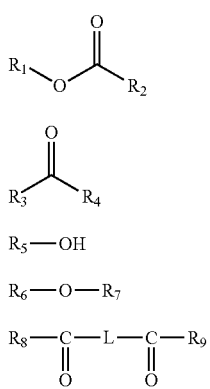

in Formula I, $R_1$ and $R_2$ each independently represent an alkyl group or a cycloalkyl group or may be bonded to each other to form a ring,
in Formula II, $R_3$ and $R_4$ each independently represent a hydrogen atom, an alkyl group, an alkenyl group, a cycloalkyl group, or a cycloalkenyl group or may be bonded to each other to form a ring, and both $R_3$ and $R_4$ do not represent a hydrogen atom,
in Formula III, $R_5$ represents an alkyl group or a cycloalkyl group,
in Formula IV, $R_6$ and $R_7$ each independently represent an alkyl group or a cycloalkyl group or may be bonded to each other to form a ring,
in Formula V, $R_8$ and $R_9$ each independently represent an alkyl group or a cycloalkyl group or may be bonded to each other to form a ring, and L represents a single bond or an alkylene group.

[9] The treatment liquid for manufacturing a semiconductor according to any one of [1] to [8],
in which a ratio Q of the compound (A) to the compound (B) represented by the following Expression II is $10^4$ to $10^{10}$, $$Q=[\text{Total Mass of Compound (A)}]/[\text{Total Mass of Compound (B)}] \quad \text{Expression II.}$$

[10] A treatment liquid for manufacturing a semiconductor comprising:
two or more treatment liquids for manufacturing a semiconductor among the treatment liquids for manufacturing a semiconductor according to [1] to [9].

[11] The treatment liquid for manufacturing a semiconductor according to any one of [1] to [10],
in which the treatment liquid for manufacturing a semiconductor is a developer.

[12] The treatment liquid for manufacturing a semiconductor according to any one of [1] to [10],
in which the treatment liquid for manufacturing a semiconductor is a rinsing liquid.

[13] The treatment liquid for manufacturing a semiconductor according to any one of [1] to [10],
wherein the treatment liquid for manufacturing a semiconductor is a pre-wet liquid.

[14] A method of manufacturing the treatment liquid for manufacturing a semiconductor according to any one of [1] to [13], the method comprising:
obtaining a crude liquid including the compound (A), the compound (B), and the inorganic matter (C) by causing one raw material or two or more raw materials to react with each other in the presence of a catalyst so as to synthesize the compound (A); and
purifying the crude liquid.

[15] A pattern forming method comprising:
a step of applying an actinic ray-sensitive or radiation-sensitive resin composition to a substrate to form an actinic ray-sensitive or radiation-sensitive film;
a step of exposing the actinic ray-sensitive or radiation-sensitive film; and
a step of treating the substrate or the actinic ray-sensitive or radiation-sensitive film using the treatment liquid for manufacturing a semiconductor according to any one of [1] to [13].

[16] The pattern forming method according to [15],
in which the pattern forming method comprises at least a step of developing the actinic ray-sensitive or radiation-sensitive film by using the treatment liquid for manufacturing a semiconductor as a developer as the step of treating the substrate or the actinic ray-sensitive or radiation-sensitive film using the treatment liquid for manufacturing a semiconductor.

[17] The pattern forming method according to [15] or [16],
in which the pattern forming method comprises at least a step of cleaning the actinic ray-sensitive or radiation-sensitive film by using the treatment liquid for manufacturing a semiconductor as a rinsing liquid as the step of treating the substrate or the actinic ray-sensitive or radiation-sensitive film using the treatment liquid for manufacturing a semiconductor.

[18] The pattern forming method according to any one of [15] to [17],
in which the pattern forming method comprises at least a step of treating the substrate by using the treatment liquid for manufacturing a semiconductor as a pre-wet liquid as the step of treating the substrate or the actinic ray-sensitive or radiation-sensitive film using the treatment liquid for manufacturing a semiconductor.

[19] The pattern forming method according to any one of [15] to [18],
in which in a case where the actinic ray-sensitive or radiation-sensitive film before exposure is dipped in the treatment liquid for manufacturing a semiconductor, a dissolution rate of the actinic ray-sensitive or radiation-sensitive film at 23° C. is 0.0016 to 0.33 nm/sec.

[20] A method of manufacturing an electronic device comprising:

the pattern forming method according to any one of [15] to [19].

According to the present invention, it is possible to provide a treatment liquid for manufacturing a semiconductor with which deterioration of lithographic performance or the occurrence of defects is suppressed such that a fine resist pattern or a fine semiconductor element can be manufactured, and a method of manufacturing the treatment liquid for manufacturing a semiconductor. In addition, according to the present invention, it is possible to provide a pattern forming method using the treatment liquid for manufacturing a semiconductor and a method of manufacturing a semiconductor element including the pattern forming method.

DESCRIPTION OF THE PREFERRED EMBODIMENTS

Figure 1:
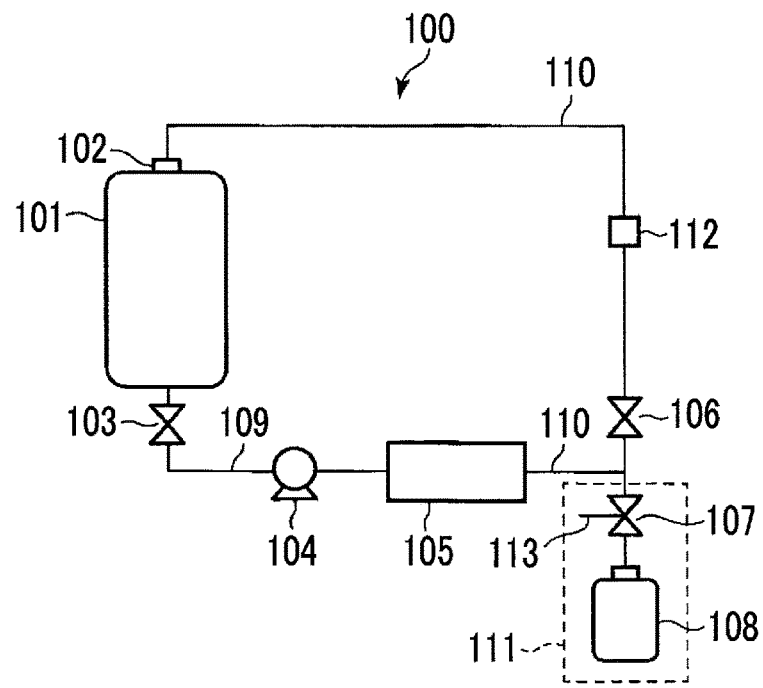
FIG. 1 is a schematic diagram showing an aspect of a manufacturing device that can be used in a method of manufacturing a treatment liquid according to an embodiment of the present invention.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "actinic ray" or "radiation" denotes, for example, a bright light spectrum of a mercury lamp, a far ultraviolet ray represented by excimer laser, an extreme ultraviolet lithography ray (EUV ray), an X-ray, or an electron beam (EB). In addition, in the present invention, "light" denotes an actinic ray or radiation.

In addition, in this specification, unless specified otherwise, "exposure" denotes not only exposure using a mercury lamp, a far ultraviolet ray represented by excimer laser, an X-ray, an EUV ray, or the like but also drawing using a corpuscular beam such as an electron beam or an ion beam.

In this specification, "(meth)acrylate" represents "at least one of acrylate or methacrylate". In addition, "(meth)acrylic acid" represents "at least one of acrylic acid or methacrylic acid". In addition, in this specification, numerical ranges represented by "to" include numerical values before and after "to" as lower limit values and upper limit values.

Hereinafter, embodiments of the present invention will be described in detail.

<Treatment Liquid for Manufacturing Semiconductor>

As described above, in manufacturing steps of a semiconductor device including an lithography step, an etching step, an ion implantation step, and a peeling step, "treatment liquid for manufacturing a semiconductor" according to the present invention is a treatment liquid used for treating an organic matter before the end of each step or after the start of the next step, and is specifically a treatment liquid used as a developer, a rinsing liquid, a pre-wet liquid, or a peeling liquid.

The treatment liquid for manufacturing a semiconductor according to the present invention (for example, also referred to as "treatment liquid according to the present invention") includes: one compound (A) that satisfies the following requirement (a); at least one compound (B) that satisfies the following requirement (b); and at least one inorganic matter (C) having any element selected from the group consisting of Al, B, S, N, and K.

Requirement (a): a compound that is selected from the group consisting of an alcohol compound, a ketone compound, and an ester compound and of which a content in the treatment liquid according to the present invention is 90.0 to 99.9999999 mass %

Requirement (b): a compound that is selected from the group consisting of an alcohol compound having 6 or more carbon atoms, a ketone compound, an ester compound, an ether compound, and an aldehyde compound and of which a content in the treatment liquid according to the present invention is $10^{-11}$ to 0.1 mass %

The compound (A) is a major component of which the content in the treatment liquid according to the present invention is 90.0 to 99.9999999 mass %, and the content thereof is, for example, preferably 99.999 to 99.9999999 mass % and more preferably 99.9999 to 99.9999999 mass %.

In addition, the treatment liquid according to the present invention may be a combination of the compound (A) and another compound. In this case, the content of the other compound is, for example, preferably 0.01 to 5.00 mass % and more preferably 0.1 to 2.00 mass %.

In this case, examples of the other compound include dimethyl sulfoxide.

The compound (B) is included in the treatment liquid according to the present invention as an impurity, and the total content thereof is $10^{-10}$ to 0.1 mass % with respect to the total mass of the treatment liquid. Here, in a case where one compound (B) in which the content satisfies the requirement (b), that is, in a range of $10^{-11}$ to 0.1 mass % is present in the treatment liquid, the total content of the compound (B) refers to the content of the one compound (B). In addition, in a case where two or more compounds (B) in which the content satisfies the content requirement described in the requirement (b) are present in the treatment liquid, the total content of the compound (B) refers to the total content of the two or more compounds (B).

The content of the compound (B) described in the requirement (b) is preferably $10^{-10}$ to $10^{-4}$ mass % and more preferably $10^{-10}$ to $10^{-5}$ mass %.

In the treatment liquid according to the present invention, the inorganic matter (C) having any element selected from the group consisting of Al, B, S, N, and K is incorporated during the synthesis of the treatment liquid according to the present invention and is mainly derived from a catalyst.

In one aspect, the treatment liquid according to the present invention includes a compound having any element selected from the group consisting of Al, B, and S as the inorganic matter (C).

Most of the compound (B) and the inorganic matter (C) are removed in a purification step of the treatment liquid, but a slight amount of the compound (B) and the inorganic matter (C) remain in the purified treatment liquid.

The present invention has been developed based on the finding that a ratio of the inorganic matter (C) to the compound (B) in the treatment liquid for manufacturing a semiconductor has a significant impact on lithographic performance or defect performance, and has one characteristic in that a P value represented by the following Expression I that is the ratio of the inorganic matter (C) to the compound (B) is in a range of $10^3$ to $10^{-6}$.

P=[Total Mass of Inorganic Matter (C)]/[Total Mass of Compound (B)]  Expression I.

In a case where the ratio P of the inorganic matter (C) to the compound (B) is in a range of $10^3$ to $10^{-6}$, deterioration of lithographic performance or the occurrence of defects is suppressed such that a fine resist pattern or a fine semiconductor element can be manufactured. The mechanism of this phenomenon is not necessarily clear but is presumed to be as follows. In a case where a balance between the compound (B) and the inorganic matter (C) in the treatment liquid is lost, for example, during a treatment using each treatment liquid such as a developer, a rinsing liquid, a pre-wet liquid, or a peeling liquid, an unique phenomenon causing deterioration of lithographic performance or the occurrence of defects occurs.

The P value represented by Expression I that is the ratio of the inorganic matter (C) to the compound (B) is preferably $10^3$ to $10^{-5}$ and more preferably $10^2$ to $10^{-4}$.

The compound (B) is an impurity in which the total content is in a range of $10^{-10}$ to 0.1 mass % with respect to the total mass of the treatment liquid. However, from the viewpoint of improving lithographic performance and suppressing defects, it is preferable that a ratio Q of the compound (A) to the compound (B) represented by the following Expression II is $10^4$ to $10^{10}$.

Q=[Total Mass of Compound (A)]/[Total Mass of Compound (B)]  Expression II.

The mechanism of this phenomenon is not clear, but it is verified that in a case where the ratio Q of the compound (A) to the compound (B) is in the above-described range, the effects of the present invention are improved.

The Q value represented by Expression II that is the ratio of the compound (A) to the compound (B) is more preferably $10^5$ to $10^{10}$ and still more preferably $10^6$ to $10^{10}$.

In the treatment liquid according to the present invention, the content of the inorganic matter (C) is preferably 0.0001 to 100 mass ppb (parts per billion) and more preferably 0.001 to 100 mass ppb with respect to the total mass of the treatment liquid. In a case where the treatment liquid according to the present invention includes two or more inorganic matters (C), the content of each of the inorganic matters (C) is preferably 0.0001 to 100 mass ppb and more preferably 0.001 to 100 mass ppb.

In a case where the concentration of each of the inorganic matters (C) is 100 mass ppb or lower, the occurrence of defects caused by these compounds remaining on a substrate as nuclei of residual components during a treatment can be suppressed.

On the other hand, in general, it is considered that, the lower the concentration of the inorganic matter (C), the better. However, it is verified that, in a case where the concentration of the inorganic matter (C) is lower than 0.001 mass ppb, the amount of defects tends to increase again. The mechanism of this phenomenon is not necessarily clear but is presumed to be as follows. In a case where the inorganic matter (C) is removed from a substrate, the inorganic matter (C) is removed along with the compound (B) as an aggregate of ions or a compound. Therefore, in a case where the concentration of the inorganic matter (C) is excessively low, the removal rate of the inorganic matter (C) and the compound (B) deteriorates, and the compound (B) and the inorganic matter (C) remain on the substrate, which cause the occurrence of defects.

As described above, the compound (A) included in the treatment liquid according to the present invention is a compound selected from the group consisting of an alcohol compound, a ketone compound, and an ester compound. The treatment liquid according to the present invention includes one compound or two or more compounds.

Examples of the alcohol compound include: an alcohol (monohydric alcohol) such as methanol, ethanol, 1-propanol, isopropanol, 1-butanol, 2-butanol, 3-methyl-1-butanol, tert-butyl alcohol, 1-pentanol, 2-pentanol, 1-hexanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 4-methyl-2-pentanol, 4-methyl-3-pentanol, cyclohexanol, or 3-methoxy-1-butanol; a glycol solvent such as ethylene glycol, diethylene glycol, or triethylene glycol; and an glycol ether solvent having a hydroxyl group such as ethylene glycol monomethyl ether, propylene glycol monomethyl ether (PGME; synonym: 1-methoxy-2-propanol), diethylene glycol monomethyl ether, methoxy methyl butanol, ethylene glycol monoethyl ether, ethylene glycol monopropyl ether, or ethylene glycol monobutyl ether.

Examples of the ketone compound include acetone, 1-hexanone, 2-hexanone, cyclohexanone, methyl ethyl ketone, methyl isobutyl ketone, acetylacetone, acetonylacetone, acetyl carbinol, propylene carbonate, and γ-butyrolactone. The ketone compound as the compound (A) includes a diketone compound.

Examples of the ester compound include methyl acetate, ethyl acetate, butyl acetate, isobutyl acetate, propyl acetate, isopropyl acetate, ethyl methoxyacetate, ethyl ethoxyacetate, propylene glycol monomethyl ether acetate (PGMEA; synonym: 1-methoxy-2-acetoxy propnae), ethylene glycol monoethyl ether acetate, ethylene glycol monopropyl ether acetate, ethylene glycol monobutyl ether acetate, methyl formate, ethyl formate, butyl formate, propyl formate, ethyl lactate, propyl lactate, ethyl carbonate, propyl carbonate, butyl carbonate, methyl pyruvate, ethyl pyruvate, propyl pyruvate, methyl acetoacetate, ethyl acetoacetate, methyl propionate, ethyl propionate, propyl propionate, and isopropyl propionate.

In one aspect, the compound (A) may be a mixture of compounds having the same number of carbon atoms and different structures, for example, isomers. As the compounds having the same number of carbon atoms and different structures, only one kind may be included, and a plurality of kinds may be included.

In one aspect, the flash point of the compound (A) is preferably 80° C. or lower, more preferably 75° C. or lower, and still more preferably 65° C. or lower. In addition, the lower limit value of the flash point is not particularly limited and is, for example, preferably 23° C. or higher.

As described above, the compound (B) included in the treatment liquid according to the present invention is a compound selected from the group consisting of an alcohol compound having 6 or more carbon atoms, a ketone compound, an ester compound, an ether compound, and an aldehyde compound. The treatment liquid according to the present invention includes one compound or two or more compounds. The number of carbon atoms in the compound (B) is preferably 6 to 12 and more preferably 6 to 10.

In one aspect of the present invention, it is preferable that the compound (B) is at least one of compounds represented by the following Formulae I to V.

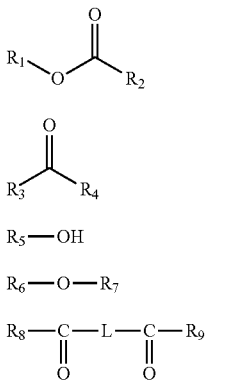

$$R_1\text{—O}\overset{\overset{O}{\|}}{\text{—C—}}R_2 \quad \text{I}$$

$$R_3\overset{\overset{O}{\|}}{\text{—C—}}R_4 \quad \text{II}$$

$$R_5\text{—OH} \quad \text{III}$$

$$R_6\text{—O—}R_7 \quad \text{IV}$$

$$R_8\overset{\overset{O}{\|}}{\text{—C—}}L\overset{\overset{O}{\|}}{\text{—C—}}R_9 \quad \text{V}$$

In Formula I, $R_1$ and $R_2$ each independently represent an alkyl group or a cycloalkyl group or may be bonded to each other to form a ring.

As the alkyl group and the cycloalkyl group represented by $R_1$ and $R_2$, an alkyl group having 1 to 12 carbon atoms or a cycloalkyl group having 6 to 12 carbon atoms, is preferable, and an alkyl group having 1 to 8 carbon atoms or a cycloalkyl group having 6 to 8 carbon atoms is more preferable.

The ring which is formed by $R_1$ and $R_2$ being bonded to each other is preferably a lactone ring, more preferably a 4-membered to 9-membered lactone ring, and still more preferably a 4-membered to 6-membered lactone ring.

$R_1$ and $R_2$ satisfy a relationship in which the number of carbon atoms in the compound represented by Formula I is 6 or more.

In Formula II, $R_3$ and $R_4$ each independently represent a hydrogen atom, an alkyl group, an alkenyl group, a cycloalkyl group, or a cycloalkenyl group or may be bonded to each other to form a ring. Both $R_3$ and $R_4$ do not represent a hydrogen atom.

As the alkyl group represented by $R_3$ and $R_4$, for example, an alkyl group having 1 to 12 carbon atoms is preferable, and an alkyl group having 1 to 8 carbon atoms is more preferable.

As the alkenyl group represented by $R_3$ and $R_4$, for example, an alkenyl group having 2 to 12 carbon atoms is preferable, and an alkenyl group having 2 to 8 carbon atoms is more preferable.

As the cycloalkyl group represented by $R_3$ and $R_4$, for example, a cycloalkyl group having 6 to 12 carbon atoms is preferable, and a cycloalkyl group having 6 to 8 carbon atoms is more preferable.

As the cycloalkenyl group represented by $R_3$ and $R_4$, for example, a cycloalkenyl group having 3 to 12 carbon atoms is preferable, and a cycloalkenyl group having 6 to 8 carbon atoms is more preferable.

The ring which is formed by $R_3$ and $R_4$ being bonded to each other is a cyclic ketone structure and may be saturated cyclic ketone or unsaturated cyclic ketone. This cyclic ketone is preferably a 6-membered to 10-membered ring and more preferably a 6-membered to 8-membered ring.

$R_3$ and $R_4$ satisfy a relationship in which the number of carbon atoms in the compound represented by Formula II is 6 or more.

In Formula III, $R_5$ represents an alkyl group or a cycloalkyl group,

The alkyl group represented by $R_5$ is an alkyl group having 6 or more carbon atoms, preferably an alkyl group having 6 to 12 carbon atoms, and more preferably an alkyl group having 6 to 10 carbon atoms.

This alkyl group may have an ether bond in a chain or may have a substituent such as a hydroxy group.

The cycloalkyl group represented by $R_5$ is a cycloalkyl group having 6 or more carbon atoms, preferably a cycloalkyl group having 6 to 12 carbon atoms, and more preferably a cycloalkyl group having 6 to 10 carbon atoms.

In Formula IV, $R_6$ and $R_7$ each independently represent an alkyl group or a cycloalkyl group or may be bonded to each other to form a ring.

As the alkyl group represented by $R_6$ and $R_7$, for example, an alkyl group having 1 to 12 carbon atoms is preferable. Further, an alkyl group having 1 to 8 carbon atoms is more preferable.

As the cycloalkyl group represented by $R_6$ and $R_7$, for example, a cycloalkyl group having 6 to 12 carbon atoms is preferable, and a cycloalkyl group having 6 to 8 carbon atoms is more preferable.

The ring which is formed by $R_6$ and $R_7$ being bonded to each other is a cyclic ether structure. This cyclic ether structure is preferably a 4-membered to 8-membered ring and more preferably a 5-membered to 7-membered ring.

$R_6$ and $R_7$ satisfy a relationship in which the number of carbon atoms in the compound represented by Formula W is 6 or more.

In Formula V, $R_8$ and $R_9$ each independently represent an alkyl group or a cycloalkyl group or may be bonded to each other to form a ring. L represents a single bond or an alkylene group.

As the alkyl group represented by $R_8$ and $R_9$, for example, an alkyl group having 6 to 12 carbon atoms is preferable, and an alkyl group having 6 to 10 carbon atoms is more preferable.

As the cycloalkyl group represented by $R_8$ and $R_9$, for example, a cycloalkyl group having 6 to 12 carbon atoms is preferable, and a cycloalkyl group having 6 to 10 carbon atoms is more preferable.

The ring which is formed by $R_8$ and $R_9$ being bonded to each other is a cyclic diketone structure. This cyclic diketone structure is preferably a 6-membered to 12-membered ring and more preferably a 6-membered to 10-membered ring.

As the alkylene group represented by L, for example, an alkylene group having 1 to 12 carbon atoms is preferable, and an alkylene group having 1 to 10 carbon atoms is more preferable.

$R_8$, $R_9$, and L satisfy a relationship in which the number of carbon atoms in the compound represented by Formula V is 6 or more.

Specific examples of the compound (B) include the following compounds.

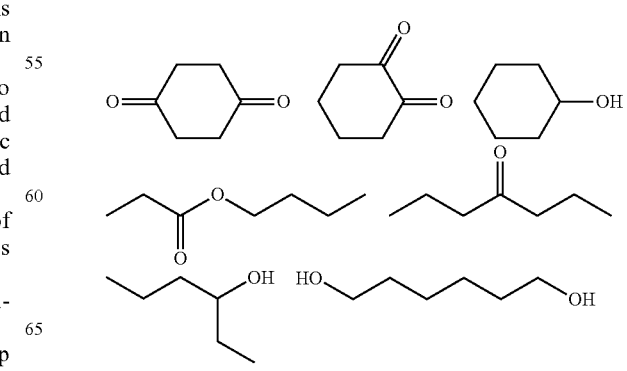

-continued

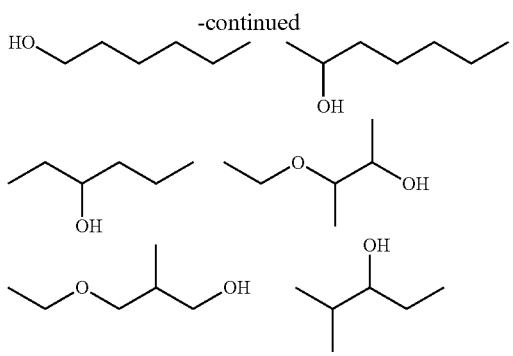

In one aspect, the treatment liquid according to the present invention includes Na, Ca, and Fe, and the content of each of Na, Ca, and Fe is preferably 0.01 mass ppt to 1000 mass ppb. Na, Ca, and Fe are metal atoms which are incorporated during various processes until the treatment liquid according to the present invention is synthesized. In a case where the concentration of each of the metal atoms is 1000 mass ppb or lower, the occurrence of defects caused by these metal atoms remaining on a substrate as nuclei of residual components during a treatment can be suppressed.

On the other hand, in general, it is considered that, the lower the concentration of each of the metal atoms, the better. However, it is verified that, in a case where the concentration of each of the metal atoms is lower than 0.01 mass ppt, the amount of defects tends to increase again. The mechanism of this phenomenon is not necessarily clear but is presumed to be as follows. In a case where Na, Ca, or Fe is removed from a substrate, Na, Ca, or Fe is removed along with the compound (B) and/or the compound (C) as an aggregate of atoms. Therefore, in a case where the concentration of Na, Ca, or Fe is excessively low, the removal rate of the compound (B) and/or the compound (C) and Na, Ca, or Fe deteriorates, and Na, Ca, or Fe remains on the substrate, which causes the occurrence of defects.

The content of each atom of Na, Ca, and Fe in the treatment liquid is more preferably 0.01 mass ppt to 500 mass ppb and still more preferably 0.05 mass ppt to 100 mass ppb.

In one aspect, the total content of the metal particles measured by a single-particle ICP-MS (SNP-ICP-MS method) in the treatment liquid according to the present invention is preferably 0.001 to 100 mass ppt and more preferably 1 to 100 mass ppt with respect to the total mass of the treatment liquid according to the present invention.

The metal atoms included in the treatment liquid for manufacturing a semiconductor as impurities are one of the factors that the occurrence of defects in a fine pattern or a fine semiconductor element. Therefore, it has been considered that, the less the amount of metal atoms included in the treatment liquid for manufacturing a semiconductor, the better. However, the present inventors found that the amount of metal atoms in the treatment liquid and the rate of occurrence of defects do not necessarily relate to each other and there is a variation in the rate of occurrence of defects.

However, according to the recently developed SNP-ICP-MS measurement, as the amount of metal atoms present in a solution, the amount of ionic metal and the amount of metal particles (nonionic metal) can be dividedly measured. Here, the metal particles (nonionic metal) refer to a metal component present in a solution as a solid without being dissolved.

In the related art, the amount of metal atoms included in a treatment liquid for manufacturing a semiconductor is typically analyzed using the ICP-MS method or the like. In the method of the related art such as the ICP-MS method, the ionic metal and the metal particles (nonionic metal) derived from the metal atoms cannot be distinguished from each other, and thus the quantity thereof is determined as the total mass of the metal atoms, that is, the total mass (hereinafter, also referred to as "total metal amount") of the ionic metal and the particulate metal (nonionic metal).

Now that the ionic metal and the metal particles can be distinguished from each other and the quantities thereof can be determined using the SNP-ICP-MS method, the present inventors conducted a thorough research on the effect of each of the ionic metal and the metal particles (nonionic metal) derived from the metal atoms in the treatment liquid on defects. As a result, it was found that the amount of the metal particles (nonionic metal) has an extremely large effect on the occurrence of defects and there is a correlation between the amount of the metal particles (nonionic metal) and the occurrence of defects.

In the treatment liquid according to the present invention, the total content of the metal particles measured by the SNP-ICP-MS method is more preferably 1 to 50 mass ppt.

Examples of a device that can be used for the measurement using the SNP-ICP-MS method include a device (NexION350S, manufactured by PerkinElmer Co., Ltd.) used in Examples described below, Agilent 8800 triple quadrupole ICP-MS (inductively coupled plasma mass spectrometry; manufactured by Agilent Technologies Inc.; for analyzing a semiconductor, option #200), and Agilent 8900 (manufactured by Agilent Technologies Inc.).

In the embodiment of the present invention, a mixture of two or more treatment liquids according to the present invention may be used as the treatment liquid according to the present invention for various applications.

<Manufacturing and the like of Treatment Liquid for manufacturing Semiconductor>

The treatment liquid according to the present invention can be manufactured using a well-known method. For example, a crude liquid including the compound (A) is obtained by causing raw materials to react with each other in the presence of a catalyst so as to synthesize the compound (A). Next, this crude liquid is purified, for example, by filtering and the like described below. As a result, the treatment liquid according to the present invention can be manufactured.

The catalyst can be appropriately selected according to the compound (A). Examples of the catalyst include sulfuric acid, $HgSO_4$, $NaNH_2$, $Al(C_2H_5)_3$, $Ipc_2BH$ (Diisopinocampheylborane), a solid catalyst including copper oxide and zinc oxide, a supported phosphoric acid catalyst, and a supported copper catalyst.

In one aspect of the method of manufacturing the treatment liquid according to the present invention, it is preferable that a compound having at least one selected from the group consisting of Al, B, S, N, and K is used as the catalyst. In another aspect of the method of manufacturing the treatment liquid according to the present invention, it is preferable that a compound having at least one selected from the group consisting of Al, B, and S is used as the catalyst.

As the raw materials used for manufacturing the treatment liquid according to the present invention, raw materials purified in advance by distillation, ion exchange, filtration, and the like are preferably used. For example, raw materials having a purity of 99 mass % or higher and preferably 99.9 mass % or higher are preferable. It is more preferable that high-purity raw materials are used, and it is still more preferable that high-purity raw materials are further purified. In order to obtain the significant effect of the present invention, it is important to use the high-purity raw materials.

In addition, as the catalyst used in the method of manufacturing the treatment liquid according to the present invention, a catalyst purified in advance by distillation, ion exchange, filtration, and the like is also preferably used. For example, a high-purity catalyst having a purity of 99 mass % or higher and preferably 99.9 mass % or higher is preferable.

Next, a manufacturing device that can be suitably used for manufacturing the treatment liquid according to the present invention will be described.

[Manufacturing Device]

FIG. 1 is a schematic diagram showing an aspect of a manufacturing device that can be used in the method of manufacturing the treatment liquid according to the embodiment of the present invention. The manufacturing device 100 includes a tank 101, and the tank 101 includes a supply port 102 for supplying a cleaning liquid and/or an organic solvent (crude liquid including the compound (A)). The manufacturing device 100 includes a filtration device 105, and the tank 101 and the filtration device 105 are connected to each other through a supply pipe 109 such that the fluid (for example, the cleaning liquid, the organic solvent, and the treatment liquid) can be transferred between the tank 101 and the filtration device 105. In the supply pipe 109, a valve 103 and a pump 104 are disposed. In FIG. 1, the manufacturing device 100 includes the tank 101 and the filtration device 105. However, the manufacturing device that can be used in the method of manufacturing the treatment liquid according to the embodiment of the present invention is not limited to this configuration.

In the manufacturing device 100, the fluid supplied from the supply port 102 flows to the filtration device 105 through the valve 103 and the pump 104. The fluid discharged from the filtration device 105 is stored in the tank 101 through a circulation pipe 110.

The manufacturing device 100 includes a discharge unit 111 that discharges the treatment liquid to the circulation pipe 110. The discharge unit 111 includes a valve 107 and a container 108. By switching between the valve 106 provided in the circulation pipe and the valve 107, the manufactured treatment liquid can be stored in the container 108. In addition, a switchable pipe 113 is connected to the valve 107 such that the cleaning liquid can be discharged to the outside of the manufacturing device 100 through the pipe 113 after circulation cleaning. After the circulation cleaning, the cleaning liquid may include particles and metal impurities and the like. According to the manufacturing device 100 including the pipe 113 from which the cleaning liquid is discharged to the outside of the manufacturing device 100, the treatment liquid having higher defect suppressing performance can be obtained without contamination in a filling portion and the like of the container 108.

Further, the manufacturing device 100 further includes a cleaning liquid monitoring unit 112 in the circulation pipe 110. FIG. 1 shows the manufacturing device 100 that includes the cleaning liquid monitoring unit 112 in the circulation pipe 110. However, the manufacturing device that can be used in the method of manufacturing the treatment liquid according to the embodiment of the present invention is not limited to this configuration. The cleaning liquid monitoring unit 112 may be provided in the supply pipe 109 or may be provided in the supply pipe 109 and the circulation pipe 110. In the manufacturing device 100, the cleaning liquid monitoring unit 112 may be directly provided in the circulation pipe 110. However, the manufacturing device that can be used in the method of manufacturing the treatment liquid according to the embodiment of the present invention is not limited to this configuration. The cleaning liquid monitoring unit may be provided in a fluid temporary storage tank (not shown; different from the tank 101) provided in the pipe.

Figure 2:
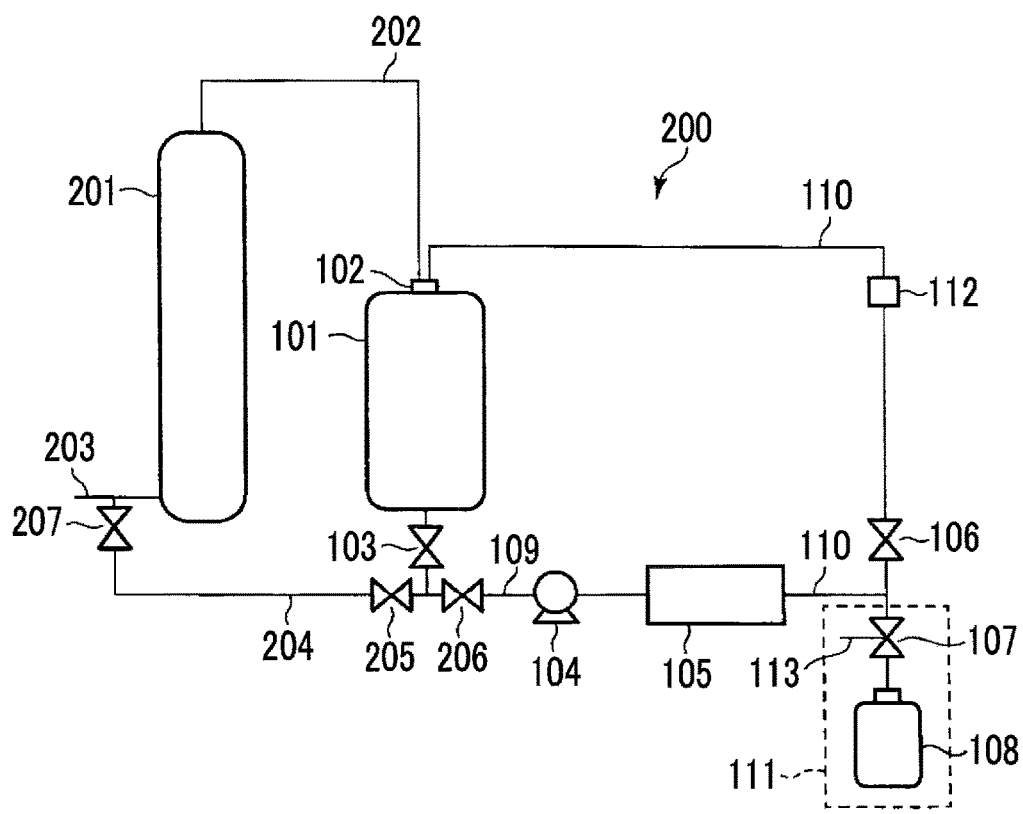
FIG. 2 is a schematic diagram showing another aspect of the manufacturing device that can be used in the method of manufacturing the treatment liquid according to the embodiment of the present invention.

FIG. 2 is a schematic diagram showing another aspect of the manufacturing device that can be used in the method of manufacturing the treatment liquid according to the embodiment of the present invention. A manufacturing device 200 includes the tank 101 and the filtration device 105 and further includes a distillation column 201 that is connected to the tank 101 through a pipe 202, a pipe 204, and a pipe 203 and is disposed such that fluid can be transferred between the tank 101 and the distillation column 201 through the pipes. In addition, the manufacturing device that can be used in the method of manufacturing the treatment liquid according to the embodiment of the present invention does not necessarily include the filtration device 105 and/or the distillation column 201, and may further include a reaction vessel connected to the distillation column 201 through the pipe 203.

In the manufacturing device 200, the fluid supplied to the distillation column 201 through the pipe 203 is distilled in the distillation column 201. The distilled fluid is stored in the tank 101 through the pipe 202. The supply pipe 109 includes the valve 103 and a valve 206. By switching between the valve 103, the valve 206, and a valve 205 provided in the pipe 204, the fluid discharged from the tank 101 can be caused to flow to the filtration device 105.

In addition, in the manufacturing device 200, the fluid discharged from the tank 101 can be caused to flow to the distillation column 201 again. In this case, by switching between the valve 103, the valve 206, and the valve 205, the fluid flows from the pipe 204 to the distillation column 201 through the valve 207 and the pipe 203.

A material of a liquid contact portion (the definition of the liquid contact portion will be described below) of the manufacturing device is not particularly limited. From the viewpoint of obtaining the treatment liquid having higher defect suppressing performance, it is preferable that the liquid contact portion is formed of at least one selected from the group consisting of a nonmetallic material and an electropolished metallic material. In this specification, "liquid contact portion" refers to a region (for example, a tank inner surface, a liquid feed pump, a damper, a packing, an O-ring, or a pipe inner surface) that is likely to come into contact with fluid and has a thickness of 100 nm from the surface.

The nonmetallic material is not particularly limited and is preferably a polyethylene resin, a polypropylene resin, a polyethylene-polypropylene resin, or a fluorine-containing resin material. From the viewpoint of reducing the elution of metal atoms, the nonmetallic material is preferably a fluorine-containing resin material.

As the fluorine-containing resin material, for example, a perfluororesin is used, and examples thereof include a polytetrafluoroethylene resin (PTFE), a polytetrafluoroethylene-perfluoroalkyl vinyl ether copolymer (PFA), a polytetrafluoroethylene-hexafluoropropylene copolymer resin (FEP), a polytetrafluoroethylene-ethylene copolymer resin (ETFE), a polychlorotrifluoroethylene-ethylene copolymer resin (ECTFE), a vinylidene fluoride resin (PVDF), a polychlorotrifluoroethylene copolymer resin (PCTFE), and a vinyl fluoride resin (PVF).

Preferable examples of the fluorine-containing resin material include a polytetrafluoroethylene resin, a polytetrafluoroethylene-perfluoroalkyl vinyl ether copolymer, and a polytetrafluoroethylene-hexafluoropropylene copolymer resin.

The metallic material is not particularly limited, and a well-known material can be used.

Examples of the metallic material include a metallic material in which the total content of chromium and nickel is higher than 25 mass % with respect to the total mass of the metallic material. In particular, a metallic material in which the total content of chromium and nickel is 30 mass % or higher with respect to the total mass of the metallic material is more preferable. The upper limit value of the total content of chromium and nickel in the metallic material is not particularly limited and, in general, is preferably 90 mass % or lower.

Examples of the metallic material include stainless steel, carbon steel, alloy steel, nickel-chromium-molybdenum steel, chromium steel, chromium-molybdenum steel, manganese steel, and a nickel-chromium alloy.

The stainless steel is not particularly limited, and a stainless steel can be used. An alloy including 8 mass % or higher of nickel is preferable, and an austenite stainless steel including 8 mass % or higher of nickel is more preferable. Examples of the austenite stainless steel include SUS (Steel use Stainless) 304 (Ni content: 8 mass %, Cr content: 18 mass %), SUS304L (Ni content: 9 mass %, Cr content: 18 mass %), SUS316 (Ni content: 10 mass %, Cr content: 16 mass %), and SUS316L (Ni content: 12 mass %, Cr content: 16 mass %).

The nickel-chromium alloy is not particularly limited, and a well-known nickel-chromium alloy can be used. In particular, a nickel-chromium alloy in which the nickel content is 40 to 75 mass % and the chromium content is 1 to 30 mass % is preferable.

Examples of the nickel-chromium alloy include HASTELLOY (trade name; hereinafter the same shall be applied), MONEL (trade name; hereinafter the same shall be applied), and INCONEL (trade name; hereinafter the same shall be applied). Specific examples include HASTELLOY C-276 (Ni content: 63 mass %, Cr content: 16 mass %), HASTELLOY-C (Ni content: 60 mass %, Cr content: 17 mass %), and HASTELLOY C-22 (Ni content: 61 mass %, Cr content: 22 mass %).

In addition, optionally, the nickel-chromium alloy may further include boron, silicon, tungsten, molybdenum, copper, and cobalt in addition to the above-described alloy.

A method of electropolishing the metallic material is not particularly limited, and a well-known method can be used. For example, methods described in paragraphs "0011" to "0014" of JP2015-227501A and paragraphs "0036" to "0042" of JP2008-264929A can be used.

It is presumed that, by electropolishing the metallic material, the chromium content in a passive layer of the surface is higher than that in the parent phase. Therefore, it is presumed that since metal impurities including metal atoms in the organic solvent are not likely to flow out from the distillation column in which the liquid contact portion is formed of the electropolished metallic material, the distilled organic solvent in which the impurity content is reduced can be obtained.

The metallic material may be buffed. A buffing method is not particularly limited, and a well-known method can be used. The size of abrasive grains used for buffing is not particularly limited and is preferably #400 or less from the viewpoint of further reducing the roughness of the surface of the metallic material. It is preferable that buffing is performed before electropolishing.

From the viewpoint of obtaining the treatment liquid having higher defect suppressing performance, it is preferable that the liquid contact portion is formed of electropolished stainless steel. In particular, in a case where the manufacturing device includes a tank, it is more preferable that the liquid contact portion of the tank is formed of electropolished stainless steel. A content mass ratio (hereinafter, also referred to as "Cr/Fe") of the Cr content to the Fe content in the liquid contact portion is not particularly limited and, in general, is preferably 0.5 to 4. In particular, from the viewpoint of further suppressing the elution of metal impurities and/or organic impurities in the treatment liquid, the content mass ratio is more preferably higher than 0.5 and lower than 3.5 and more preferably 0.7 to 3.0. In a case where Cr/Fe is higher than 0.5, the metal elution from the tank can be suppressed. In a case where Cr/Fe is lower than 3.5, the peeling of the liquid contact portion or the like which causes the formation of particles is not likely to occur.

A method of adjusting Cr/Fe in the metallic material is not particularly limited, and examples thereof include a method of adjusting the content of Cr atoms in the metallic material and a method of electropolishing the metallic material such that the chromium content in a passive layer of the surface is higher than that in the parent phase.

The metallic material may be a metallic material applied to the coating techniques.

The coating techniques are roughly classified into three kinds: metal coating (various kinds of plating); inorganic coating (for example, various kinds of chemical conversion coating, glass coating, concrete coating, or ceramic coating); and organic coating (rust-preventing oil coating, paint coating, rubber coating, or plastic coating), and any one of the coating techniques may be adopted.

Preferable examples of the coating technique include a surface treatment using rust-preventing oil, a rust-preventing agent, a corrosion inhibitor, a chelate compound, a strippable plastic, or a lining agent.

In particular, as the coating technique, a surface treatment using a corrosion inhibitor, a chelate compound, or a lining agent is preferable. Here, examples of the corrosion inhibitor include various chromates, a nitrite, a silicate, a phosphate, a carboxylic acid (for example, oleic acid, dimer acid, or naphthenic acid), a metal soap of a carboxylic acid, a sulfonate, an amine salt, and an ester (a glycerin ester or a phosphoric acid ester of higher fatty acid). Examples of the chelate compound include ethylenediaminetetraacetic acid, gluconic acid, nitrilotriacetic acid, hydroxyethyl ethylenediaminetriacetic acid, and diethylenediaminepentaacetic acid. Examples of the lining agent include a fluororesin lining agent. A treatment using a phosphate or fluororesin lining agent is more preferable.

By the manufacturing device including the filtration device 105, the treatment liquid having higher defect suppressing performance can be easily obtained. A filtration member included in the filtration device 105 is not particularly limited and is preferably at least one selected from the group consisting of a filter having a critical particle diameter of 20 nm or less and a metal ion adsorption filter and more preferably a metal ion adsorption filter having a critical particle diameter of 20 nm or less.

Filter having Critical Particle Diameter of 20 nm or Less

The filter having a critical particle diameter of 20 nm or less has a function of efficiently removing particles having a particle size of 20 nm or more from the organic solvent and the like which are the raw materials of the treatment liquid.

The critical particle diameter of the filter is preferably 1 to 15 nm and more preferably 1 to 12 nm. In a case where the critical particle diameter is 15 nm or less, finer particles can be removed. In a case where the critical particle diameter is 1 nm or more, the filtration efficiency is improved.

Here, the critical particle diameter refers to the minimum size of particles that can be removed by a filter. For example, in a case where the critical particle diameter of the filter is 20 nm, particles having a diameter of 20 nm or more can be removed.

Examples of a material of the filter include a nylon such as 6-nylon or 6,6-nylon, polyethylene, polypropylene, polystyrene, polyimide, polyamide imide, and a fluororesin. Polyimide and/or polyamide imide may have at least one selected from the group consisting of a carboxy group, a salt type carboxy group, and an —NH— bond. From the viewpoint of solvent resistance, a fluororesin or polyimide and/or polyamide imide is preferable. In addition, from the viewpoint of adsorbing metal ions, a nylon such as 6-nylon or 6,6-nylon is more preferable.

The filtration device 105 may include a plurality of filters. In a case where the filtration device 105 includes a plurality of filters, another filter is not particularly limited and is preferably a filter having a critical particle diameter of 50 nm or more (for example, a microfilter membrane for removing fine particles having a pore size of 50 nm or more). In a case where fine particles are present in a material to be purified in addition to the colloidal impurities, in particular, including metal atoms such as iron or aluminum, the material to be purified is filtered using a filter having a critical particle diameter of 50 nm or more (for example, a microfilter membrane for removing fine particles having a pore size of 50 nm or more) before being filtered using a filter having a critical particle diameter of 20 nm or less (for example, a microfilter membrane for removing fine particles having a pore size of 20 nm or less). As a result, the filtration efficiency of the filter having a critical particle diameter of 20 nm or less (for example, a microfilter membrane for removing fine particles having a pore size of 20 nm or less) is improved, and the performance of removing particles is further improved.

Metal Ion Adsorption Filter

It is preferable that the filtration device 105 includes the metal ion adsorption filter.

The metal ion adsorption filter is not particularly limited and, for example, a well-known metal ion adsorption filter can be used.

In particular, an ion exchangeable filter is preferable as the metal ion adsorption filter. Here, metal ions as an adsorption target are not particularly limited. From the viewpoint of causing defects of a semiconductor device to occur, metal ions including one selected from Fe, Cr, Ni, and Pb are preferable, and ions of metals including each of Fe, Cr, Ni, and Pb are more preferable.

From the viewpoint of improving the adsorption performance of the metal ions, it is preferable that the metal ion adsorption filter has an acid group on the surface. Examples of the acid group include a sulfo group and a carboxy group.

Examples of a substrate (material) forming the metal ion adsorption filter include cellulose, diatom earth, nylon, polyethylene, polypropylene, polystyrene, and a fluororesin. From the viewpoint of improving the adsorption efficiency of the metal ions, nylon is more preferable.

In addition, the metal ion adsorption filter may be formed of a material including polyimide and/or polyamide imide. Examples of the metal ion adsorption filter include polyimide and/or polyamide imide porous membrane described in JP2016-155121A.

The polyimide and/or polyamide imide porous membrane may have at least one selected from the group consisting of a carboxy group, a salt type carboxy group, and an —NH— bond. In a case where the metal ion adsorption filter is formed of a fluororesin, polyimide, and/or polyamide imide, higher solvent resistance can be obtained.

Organic Impurity Adsorption Filter

The filtration device 105 may further include an organic impurity adsorption filter.

The organic impurity adsorption filter is not particularly limited and, for example, a well-known organic impurity adsorption filter can be used.

In particular, from the viewpoint of improving the adsorption performance organic impurities, it is preferable that the organic impurity adsorption filter has an organic skeleton that is interactive with organic impurities on the surface (in other words, the surface is modified with an organic skeleton that is interactive with organic impurities). Examples of the organic skeleton that is interactive with organic impurities include a chemical structure that reacts with organic impurities such that the organic impurities can be trapped in the organic impurity adsorption filter. More specifically, in a case where an n-long chain alkyl alcohol (for example, a structural isomer in a case where 1-long chain alkyl alcohol is used as the organic solvent) is included as an organic impurity, examples of the organic skeleton include an alkyl group. In addition, in a case where a dibutyl hydroxy toluene (BHT) is included as an organic impurity, examples of the organic skeleton include a phenyl group.

Examples of a substrate (material) forming the organic impurity adsorption filter include cellulose on which activated carbon is supported, diatom earth, nylon, polyethylene, polypropylene, polystyrene, and a fluororesin.

In addition, as the organic impurity adsorption filter, a filter in which activated carbon adheres to non-woven fabric described in JP2002-273123A and JP2013-150979A can also be used.

The organic impurity adsorption filter is also applicable to a physical adsorption method as well as the above-described chemical adsorption (adsorption using the organic impurity adsorption filter having an organic skeleton that is interactive with organic impurities on the surface).

For example, in a case where BHT is included in as an organic impurity, the structure of BHT is larger than 10 ongstrom (=1 nm). Therefore, by using an organic impurity adsorption filter having a pore size of 1 nm, BHT cannot pass through the pore of the filter. That is, BHT is physically trapped in the filter, and thus is removed from the material to be purified. This way, the organic impurities can also be removed by using the physical removal method as well as the chemical interaction. However, in this case, a filter having a pore size of 3 nm or more is used as the "particle removal filter", and a filter having a pore size of less than 3 nm is used as the organic impurity adsorption filter.

As described above, a combination of different filters may be used. At this time, the filtering using a first filter may be performed once, or twice or more. In a case where filtering is performed two or more times using different filters in combination, the filters may be the same as or different from each other but are preferably different from each other.

Typically, it is preferable that a first filter and a second filter are different from each other in at least one of a pore size or a forming material.

It is preferable that the pore size of the filter used for the second or subsequent filtering is equal to or less than that of the filter used for the first filtering. In addition, a combination of first filters having different pore sizes in the above-described range may be used. Here, the pore size of the filter can refer to a nominal value of a manufacturer of the filter. A commercially available filter can be selected from various filters manufactured by Pall Corporation, Toyo Roshi Kaisha, Ltd., Entegris Japan Co., Ltd. (former Mykrolis Corporation), or Kits Microfilter Corporation. In addition, "P-Nylon Filter (formed of polyamide, pore size: 0.02 μm, critical surface tension: 77 mN/m)" (manufactured by Pall Corporation), "PE Clean Filter (formed of high-density polyethylene, pore size: 0.02 μm)"(manufactured by Pall Corporation), or "PE Clean Filter (formed of high-density polyethylene, pore size: 0.01 μm)"(manufactured by Pall Corporation) can also be used.

The method of manufacturing the treatment liquid according to the embodiment of the present invention may include a step of cleaning the manufacturing device using the cleaning liquid. In this method, the cleaning liquid is supplied from the supply port 102 of the tank 101. The supply amount of the cleaning liquid is not particularly limited and is preferably adjusted such that the liquid contact portion of the tank 101 can be sufficiently cleaned. The volume of the cleaning liquid supplied is preferably 30 vol % or higher with respect to the volume of the tank 101. In a case where the cleaning liquid is supplied from the supply port 102, the valve 103 may be closed or opened. However, from the viewpoint of more easily cleaning the tank 101, in a case where the cleaning liquid is supplied from the supply port 102, it is preferable that the valve 103 is closed.

The cleaning liquid supplied to the tank 101 may be transferred immediately into the manufacturing device, or may be transferred into the manufacturing device (for example, through the supply pipe 109) after cleaning the inside of the tank 101. A method of cleaning the inside of the tank 101 using the cleaning liquid is not particularly limited, and examples thereof include a method of cleaning the inside of the tank 101 by rotating stirring blades (not shown) included in the tank 101. The time during which the tank is cleaned using the cleaning liquid is not particularly limited and may be appropriately selected according to the material of the liquid contact portion of the tank 101, the kind of the treatment liquid to be manufactured, the possibility of contamination, and the like. In general, the time is preferably about 0.1 seconds to 48 hours. In a case where only the tank 101 is cleaned, the cleaning liquid after cleaning may be discharged from, for example, a discharge port (not shown) provided in the tank bottom portion.

A method of cleaning the supply pipe 109 and the like of the manufacturing device 100 using the cleaning liquid is not particularly limited, and a method (hereinafter, also referred to as "circulation cleaning") of circulating the cleaning liquid in the manufacturing device through the supply pipe 109 and the circulation pipe 110 by operating the pump 104 in a state where the valve 103 and the valve 106 are opened and the valve 107 is closed is preferable. With the above-described method, while transferring the cleaning liquid, foreign matters and the like attached to the liquid contact portions of the tank 101, the filtration device 105, the supply pipe 109, and the like can be efficiently dispersed and/or can be efficiently dissolved using the cleaning liquid.

In particular, in a case where the manufacturing device includes the filtration device, the circulation cleaning is more preferable as the cleaning method. An example of the circulation cleaning will be described using FIG. 1. First, the cleaning liquid supplied from the tank 101 into the manufacturing device through the valve 103 returns (circulates) to the tank 101 again through the supply pipe 109 (through the filtration device 105, the circulation pipe 110, and the valve 106). At this time, the cleaning liquid is filtered through the filtration device 105 such that particles and the like dissolved and dispersed in the cleaning liquid are removed and the cleaning effect can be further improved.

In another aspect of the cleaning method, for example, another method may be used, the method including: causing the cleaning liquid supplied from the supply port 102 of the tank 101 into the manufacturing device to flow into the filtration device 105 through the valve 103 and the pump 104 by operating the pump 104 in a state where the valve 103 and the valve 107 are opened and the valve 106 is closed; and discharging the cleaning liquid to the outside of the manufacturing device through the valve 107 without being circulated (in this specification, hereinafter, this method will also be referred to as "batch cleaning"). In this case, as described above, the cleaning liquid may be supplied intermittently into the manufacturing device in a predetermined amount, or may be supplied continuously into the manufacturing device.

(Cleaning Liquid)

The cleaning liquid used for performing cleaning in advance as described above is not particularly limited, and a well-known cleaning liquid can be used.

Examples of the cleaning liquid include water, alkylene glycol monoalkyl ether carboxylate, alkylene glycol monoalkyl ether, alkyl lactate, alkyl alkoxy propionate, a cyclic lactone (preferably having 4 to 10 carbon atoms), a monoketone compound (preferably having 4 to 10 carbon atoms) which may include a ring, alkylene carbonate, alkyl alkoxy acetate, and alkyl pyruvate.

In addition, as the cleaning liquid, for example, cleaning liquids described in JP2016-57614A, JP2014-219664A, JP2016-138219A, and JP2015-135379A may be used.

It is preferable that the cleaning liquid includes at least one selected from the group consisting of propylene glycol monomethyl ether (PGME), cyclopentanone (CyPe), butyl acetate (nBA), propylene glycol monomethyl ether acetate (PGMEA), cyclohexanone (CyHx), ethyl lactate (EL), methyl 2-hydroxyisobutyrate (HBM), cyclopentanone dimethylacetal (DBCPN), γ-butyrolactone (GBL), dimethyl sulfoxide (DMSO), ethylene carbonate (EC), propylene carbonate (PC), 1-methyl-2-pyrrolidone (NMP), isoamyl acetate (iAA), isopropanol (IPA), methyl ethyl ketone (MEK), and 4-methyl-2-pentanol (MIBC) is preferable, it is more preferable the cleaning liquid includes at least one selected from the group consisting of PGMEA, NMP, PGME, nBA, PC, CyHx, GBL, MIBC, EL, DMSO, iAA, MEK, PC, and CyPe, and it is still more preferable the cleaning liquid is formed of at least one selected from the group consisting of PGMEA, NMP, PGME, nBA, PC, CyHx, GBL, MIBC, EL, DMSO, iAA, MEK, PC, and CyPe.

As the cleaning liquid, one kind may be used alone, or two or more kinds may be used in combination. In addition, the treatment liquid according to the present invention may be used as the cleaning liquid.

[Method of Adjusting Metal Content]

In the treatment liquid according to the present invention, the ion concentration of each of Cr, Co, Cu, Pb, Li, Mg, Mn, Ni, K, Ag, Zn, and the like is preferably 1 ppm (parts per million) or lower and more preferably 1 ppb or lower. In particular, it is more preferable that the ion concentration is in the order of ppt (all the concentrations are based on mass), and it is still more preferable that the treatment liquid does not substantially include Cr, Co, Cu, Pb, Li, Mg, Mn, Ni, K, Ag, Zn, and the like.

The metal content of the treatment liquid according to the present invention may be adjusted by repeating distillation, filter filtration, filtration using an ion exchange resin, adsorption purification, or the like to sufficiently purify the treatment liquid, for example, at least one of a step of preparing the respective raw materials used for manufacturing the treatment liquid or a step after the preparation of the treatment liquid.

Here, the method of adjusting the metal content (hereinafter, also referred to as "method of reducing the metal concentration") is not particularly limited, and examples thereof include adsorption purification using silicon carbide described in WO2012/043496A. Further, an example of using the adsorption purification in combination with distillation, filter filtration, or filtration using an ion exchange resin to sufficiently purify the treatment liquid is also preferable.

From the viewpoint of obtaining the effects of the present invention, it is more preferable that the method of adjusting the metal content is performed in the step of preparing the respective raw materials used for manufacturing the treatment liquid. In addition, in the raw materials, it is preferable that the content of the specific metal atoms according to the present invention or the content of an inorganic ion such as a sulfate ion, a chloride ion, or a nitrate ion and a metal ion described below are reduced.

In another method relating to the method of reducing the metal concentration, for example, as "container" that stores the raw materials used for manufacturing the treatment liquid, a container in which the elution of impurities is reduced as described below regarding a storage container that stores the treatment liquid according to the present invention. In addition, for example, a method of lining an inner wall of the pipe with a fluororesin to prevent the specific metal atoms from being eluted from "the pipe" or the like used for the preparation of the treatment liquid can also be used.

[Impurities and Coarse Particles]

In addition, it is preferable that the treatment liquid according to the present invention does not substantially include coarse particles.

Here, the coarse particles included in the treatment liquid refer to particles of dirt, dust, an organic solid matter, an inorganic solid matter, or the like included in raw materials as impurities or particles of dirt, dust, an organic solid matter, an inorganic solid matter, or the like introduced as contaminant during the preparation of the treatment liquid. The coarse particles correspond to particles that finally remain in the treatment liquid without being dissolved. The amount of the coarse particles present in the treatment liquid can be measured in a liquid phase using a commercially available measuring device according to a light scattering particle measurement method in liquid in which a laser is used as a light source.

[Kit and Concentrated Liquid]

The treatment liquid according to the present invention may be used as a kit by separately adding other raw materials thereto. In this case, as the other raw materials that are separately added, not only a solvent such as water or an organic solvent but also other compounds may be mixed with each other for use according to the intended use. From the viewpoint of significantly obtaining the effects of the present invention, in a case where the content of Na, Ca, or Fe in the solvent that can be used at this time is in the above-described specific value range of the present invention, the desired effects of the present invention can be significantly obtained.

<Container>

The treatment liquid according to the present invention can be filled into any container (irrespective of whether or not it is the above-described kit) to be stored, transported, and used unless it has a problem such as corrosiveness. As the container, a container for a semiconductor in which the cleanliness is high and the elution of impurities is reduced is preferable. Examples of the container to be used include "Green Bottle" series (manufactured by Alcello Chemical Co., Ltd.) and "Pure Bottle" (manufactured by Kodama Plastics Co., Ltd.). However, the present invention is not limited to the examples.

It is preferable that a liquid contact portion of the container is formed of a nonmetallic material or stainless steel.

Examples of the nonmetallic material include the materials described above as the examples of the nonmetallic material used for the liquid contact portion of the distillation column. In particular, in a case where the container having a liquid contact portion formed of a fluororesin is used, the occurrence of problems such as the elution of ethylene, propylene, or an oligomer can be suppressed as compared to a case where a container having a liquid contact portion formed of a polyethylene resin, a polypropylene resin, or a polyethylene-polypropylene resin is used.

Specific examples of the container having a liquid contact portion formed of a fluororesin include a Fluoro Pure PFA composite drum (manufactured by Entegris, Inc.). In addition, for example, containers described in page 4 and the like of JP1991-502677A (JP-H3-502677A), page 3 and the like of WO2004/016526A, and pages 9 and 16 and the like of WO1999/46309A can be used. In a case where the liquid contact portion is formed of the nonmetallic material, it is preferable that the elution into the nonmetallic material is suppressed.

The liquid contact portion of the container in contact with the treatment liquid is formed of preferably stainless steel and more preferably electropolished stainless steel.

In a case where the treatment liquid is stored in the container, the elution of impurity metal and/or organic impurities in the treatment liquid stored in the container is further suppressed.

The form of the stainless steel is as described above regarding the material of the liquid contact portion of the distillation column. In addition, the same shall be applied to the electropolished stainless steel.

The Cr/Fe ratio in the stainless steel forming the liquid contact portion of the container is as described above regarding the Cr/Fe ratio in the liquid contact portion of the tank.

It is preferable that the inside of these containers is cleaned before filling. In addition, the liquid used for cleaning is not particularly limited, and the metal content in the liquid is preferably lower than 0.001 mass ppt (parts per trillion). In addition, in a case where the liquid used for cleaning is water described below or another organic solvent that is purified such that the metal content in the above-described range, the treatment liquid according to the present invention, a diluted solution of the treatment liquid according to the present invention, or a liquid including at least one compound added to the treatment liquid according to the present invention, the desired effects of the present invention can be significantly obtained.

The treatment liquid may be bottled in a container such as a gallon bottle or a coated bottle to be transported or stored. The gallon bottle may be formed of a glass material or other materials.

In order to prevent a change in the component of the solution during storage, the inside of the container may be replaced with inert gas (for example, nitrogen or argon) having a purity of 99.99995 vol %. In particular, gas having a low moisture content is preferable. In addition, the temperature during transport or storage may be normal temperature or may be controlled to be in a range of −20° C. to 30° C. in order to prevent deterioration.

In addition, it is preferable that foreign matter attached to a lid of one of various containers is removed by cleaning the lid with an acid or an organic solvent before cleaning the container because infiltration of foreign matters from the lid can be prevented.

[Water]

As the water used regarding the present invention, for example, water that can be used in a manufacturing step of the treatment liquid according to the present invention, water that can be used in a pattern forming step according to the present invention, water that can be used for cleaning the storage container of the treatment liquid according to the present invention, or water that can be used in measurement of the components of the treatment liquid according to the present invention or in measurement for evaluating defect suppressing performance and lithographic performance relating to the effects of the present invention, ultrapure water for manufacturing a semiconductor is preferably used. In addition, it is more preferable that water obtained by further purifying the ultrapure water such that inorganic anions, metal ions, and the like are reduced is used. The purification method is not particularly limited, and purification using a filtration film or an ion-exchange membrane or purification using distillation is preferable. In addition, for example, it is preferable that the purification is performed using a method described in JP2007-254168A.

In addition, in one aspect, the metal content in the water is preferably lower than 0.001 mass ppt (parts per trillion).

[Clean Room]

It is preferable that all the handling operations including the adjustment of the treatment liquid according to the present invention, the unsealing and/or cleaning of the storage container, and the filling of the treatment liquid, the treatment analysis, and the measurement are performed in a clean room. It is preferable that the clean room satisfies the clean room standards 14644-1. It is preferable that the clean room satisfies any one of ISO Class 1, ISO Class 2, ISO Class 3, and ISO Class 4, it is more preferable that the clean room satisfies ISO Class 1 or ISO Class 2, and it is still more preferable that the clean room satisfies ISO Class 1.

[Use of Treatment Liquid]

The treatment liquid according to the present invention is preferably used for manufacturing a semiconductor. Specifically, in manufacturing steps of a semiconductor device including a lithography step, an etching step, an ion implantation step, and a peeling step, the treatment liquid is used for treating an organic matter after the end of each step or before the start of the next step, and specifically is suitably used as a pre-wet liquid, a developer, a rinsing liquid, a peeling liquid, or the like. For example, the treatment liquid can also be used for rinsing an edge line of a semiconductor substrate before and after resist application.

In addition, the treatment liquid can also be used as a cleaning liquid of a device for manufacturing various treatment liquids that are used for manufacturing a semiconductor.

In addition, the treatment liquid can also be used as a dilute solution of a resin included in a resist solution (described below). That is, the treatment liquid can also be used as the solvent included in the actinic ray-sensitive or radiation-sensitive composition.

In addition, the treatment liquid can also be suitably used for other applications other than the manufacturing of a semiconductor, and can be used, for example, as a developer such as polyimide, a resist for a sensor, or a resist for a lens, or a rinsing liquid.

In addition, the treatment liquid can also be used for medical applications or as a solvent for cleaning. In particular, the treatment liquid can be suitably used for cleaning a container, a pipe, a substrate (for example, a wafer or glass), or the like.

<Pattern Forming Method>

Basically, in a method of manufacturing a semiconductor device, the treatment liquid according to the present invention is a treatment liquid used as a developer, a rinsing liquid, a pre-wet liquid, peeling liquid, or the like. In one aspect, in a pattern forming method included in the method of manufacturing a semiconductor device, it is preferable that the treatment liquid is used as a developer, a rinsing liquid, or a pre-wet liquid.

The pattern forming method according to the present invention includes: a resist film forming step of applying an actinic ray-sensitive or radiation-sensitive composition (hereinafter, also referred to as "resist composition") to a substrate to form an actinic ray-sensitive or radiation-sensitive film (hereinafter, also referred to as "resist film"); an exposure step of exposing the resist film; and a treatment step of treating the substrate to which the resist composition is applied or the exposed resist film using the above-described treatment liquid.

In the pattern forming method according to the present invention, the treatment liquid according to the present invention may be used as any one of a developer, a rinsing liquid, and a pre-wet liquid, is preferably used as two of a developer, a rinsing liquid, and a pre-wet liquid and is more preferably used as a developer, a rinsing liquid, and a pre-wet liquid.

Hereinafter, each of the steps included in the pattern forming method according to the present invention will be described. In addition, as an example of the treatment step using the treatment liquid according to the present invention, each of a pre-wet step, a development step, and a rinsing step will be described.

<Pre-Wet Step>

In order to improve coating properties, the pattern forming method according to the present invention may include a pre-wet step of applying a pre-wet liquid to the substrate in advance before the step of forming the resist film using the actinic ray-sensitive or radiation-sensitive composition. For example, the pre-wet step is described in JP2014-220301A, the content of which is incorporated herein by reference.

<Resist Film Forming Step>

The resist film forming step is a step of forming a resist film using an actinic ray-sensitive or radiation-sensitive composition and, for example, can be performed using the following method.

In order to form the resist film (actinic ray-sensitive or radiation-sensitive composition film) on the substrate using the actinic ray-sensitive or radiation-sensitive composition, respective components described below are dissolved in a solvent to prepare an actinic ray-sensitive or radiation-sensitive composition, the actinic ray-sensitive or radiation-sensitive composition is optionally filtered through a filter and applied to the substrate. As the filter, a filter formed of polytetrafluoroethylene, polyethylene, or nylon and having a pore size of preferably 0.1 µm or less, more preferably 0.05 µm or less, and still more preferably 0.03 µm or less is preferable.

The actinic ray-sensitive or radiation--sensitive composition is applied to the substrate (for example, silicon or a silicon dioxide coating), which is used for manufacturing an integrated circuit element, using an appropriate coating method such as a method using a spinner. Next, the actinic ray-sensitive or radiation-sensitive composition is dried to form a resist film. Optionally, various underlayer films (an inorganic film, an organic film, or an antireflection film) may be formed below the resist film.

As the drying method, a method of drying heating the composition is generally used. Heating may be performed using means provided in a typical exposure or developing device, and may be performed using a hot plate or the like.

The heating temperature is preferably 80° C. to 180° C., more preferably 80° C. to 150° C., still more preferably 80° C. to 140° C., and even still more preferably 80° C. to 130° C. The heating time is preferably 30 to 1000 seconds, more preferably 60 to 800 seconds, and still more preferably 60 to 600 seconds.

The thickness of the resist film is generally 200 nm or less and preferably 100 nm or less.

For example, in order to resolve a 1:1 line-and-space pattern having a size of 30 nm or less, the thickness of a resist film to be formed is preferably 50 nm or less. In a case where a resist film having a thickness of 50 nm or less is applied to a development step described below, pattern collapse is not likely to occur, and higher resolution performance can be obtained.

The thickness is more preferably in a range of 15 nm to 45 nm. In a case where the thickness is 15 nm or more, sufficient etching resistance can be obtained. The thickness is still more preferably is in a range of 15 nm to 40 nm. In a case where the thickness is in the above-described range, etching resistance and higher resolution performance can be simultaneously satisfied.

In the pattern forming method according to the present invention, an upper layer film (top coat film) may be formed over the resist film. The upper layer film can be formed using, for example, an upper layer film-forming composition including a hydrophobic resin, an acid generator, and a basic compound The upper layer film and the upper layer film-forming composition will be described below.

<Exposure Step>

The exposure step is a step of exposing the resist film and, for example, can be performed using the following method.

The resist film formed as described above is irradiated with an actinic ray or radiation through a predetermined mask. For irradiation of an electron beam, drawing (direct drawing) not using a mask is generally used.

The actinic ray or radiation is not particularly limited, and examples thereof include KrF excimer laser light, ArF excimer laser light, extreme ultraviolet (EUV) light, and an electron beam (EB). The exposure may be immersion exposure.

<Baking>

In the pattern forming method according to the present invention, it is preferable that baking (heating) is performed before development after exposure. Due to the baking, a reaction of an exposed portion is promoted, and sensitivity and a pattern shape are further improved.

The heating temperature is preferably 80° C. to 150° C., more preferably 80° C. to 140° C., and still more preferably 80° C. to 130° C.

The heating time is preferably 30 to 1000 seconds, more preferably 60 to 800 seconds, and still more preferably 60 to 600 seconds.

Heating may be performed using means provided in a typical exposure or developing device, and may be performed using a hot plate or the like.

<Development Step>

The development step is a step of developing the exposed resist film with the developer.

Examples of the developing method include: a method (dipping method) of dipping the substrate in a container filled with the developer for a given period of time; a method (puddle method) of causing the developer to accumulate on a surface of the substrate with a surface tension and maintaining this state for a given period of time for development; a method (spraying method) of spraying the developer to a surface of the substrate; and a method (dynamic dispense method) of continuously jetting the developer to the substrate, which is rotating at a given speed, while scanning a developer jetting nozzle on the substrate at a given speed.

In addition, a step of stopping development while replacing the solvent with another solvent may be performed after the development step.

The developing time is not particularly limited as long as it is a period of time where a non-exposed portion of a resin is sufficiently dissolved. The development time is typically 10 to 300 seconds and preferably 20 to 120 seconds.

The temperature of the developer is preferably 0° C. to 50° C. and more preferably 15° C. to 35° C.

As the developer used in the development step, the above-described treatment liquid is preferably used. The developer is as described above. In addition to the development using the treatment liquid, development using an alkali developer may be further performed (so-called double development).

<Rinsing Step>

The rinsing step is a step of performing rinsing with the rinsing liquid after the development step.

In the rinsing step, a developed wafer is rinsed with the above-described rinsing liquid.

A rinsing method is not particularly limited, and examples thereof include: a method (rotation jetting method) of continuously jetting the rinsing liquid to the substrate which is rotating at a given speed; a method (dipping method) of dipping the substrate in a container filled with the rinsing liquid for a given period of time; and a method (spraying method) of spraying the rinsing liquid to a surface of the substrate. In particular, it is preferable that the rinsing step is performed using the rotation jetting method such that the rinsed substrate is rotated at a rotation speed of 2000 rpm to 4000 rpm to remove the rinsing liquid from the substrate.

The rinsing time is not particularly limited and is typically 10 seconds to 300 seconds. The rising time is preferably 10 seconds to 180 seconds and most preferably 20 seconds to 120 seconds.

The temperature of the rinsing liquid is preferably 0° C. to 50° C. and more preferably 15° C. to 35° C.

In addition, after the development or the rising, a treatment of removing the developer or the rinsing liquid, which is attached to the pattern, with supercritical fluid may be performed.

Further, after the development, the rinsing, or the treatment using the supercritical fluid, heating may be performed to remove the solvent remaining in the pattern. The heating temperature is not particularly limited as long as an excellent resist pattern can be obtained, and is typically 40° C. to 160° C. The heating temperature is preferably 50° C. to 150° C. and most preferably 50° C. to 110° C. The heating time is not particularly limited as long as an excellent resist pattern can be obtained, and is typically 15 to 300 seconds and preferably 15 to 180 seconds.

As the rinsing liquid, the above-described treatment liquid is preferably used. The description of the rinsing liquid is as described above.

As described above, in the pattern forming method according to the present invention, any one of a developer, a rinsing liquid, and a pre-wet liquid may be the above-described treatment liquid according to the present invention, any two of a developer, a rinsing liquid, and a pre-wet liquid may be the above-described treatment liquid according to the present invention, and all the three of a developer, a rinsing liquid, and a pre-wet liquid may be the above-described treatment liquid according to the present invention.

In one aspect, it is preferable that the treatment liquid and the actinic ray-sensitive or radiation-sensitive resin composition used in the pattern forming method according to the present invention satisfy the following relationship.

That is, it is preferable that the actinic ray-sensitive or radiation-sensitive resin composition and the treatment liquid according to the present invention are used so as to satisfy a relationship in which a dissolution rate of the actinic ray-sensitive or radiation-sensitive film, which is formed using the actinic ray-sensitive or radiation-sensitive resin composition, in the treatment liquid according to the present invention is 0.0016 to 0.33 nm/sec.

Here, the dissolution rate of the actinic ray-sensitive or radiation-sensitive film in the treatment liquid according to the present invention is a rate at which the film thickness is reduced when the actinic ray-sensitive or radiation-sensitive film is formed and then is dipped in the treatment liquid according to the present invention. In the present invention, the dissolution rate refers to a dissolution rate at 23° C. This dissolution rate is more preferably 0.0016 to 0.16 nm/sec and still more preferably 0.0016 to 0.08 nm/sec.

<Actinic Ray-Sensitive or Radiation-Sensitive Composition (Resist Composition)>

Next, the actinic ray-sensitive or radiation-sensitive composition which is preferably used in combination with the treatment liquid according to the present invention will be described in detail.

(A) Resin

It is preferable that a resin (A) is included as the actinic ray-sensitive or radiation-sensitive composition which is preferably used in combination with the treatment liquid according to the present invention. The resin (A) includes at least (i) a repeating unit having a group which is decomposed by the action of an acid to produce a carboxyl group (may further include a repeating unit having a phenolic hydroxyl group), or includes may at least (ii) a repeating unit having a phenolic hydroxyl group.

In a case where the resin (A) includes the repeating unit having a group which is decomposed by the action of an acid to produce a carboxyl group, the solubility in an alkali developer increases and the solubility in the organic solvent increases due to the action of an acid.

Examples of the repeating unit having a phenolic hydroxyl group included in the resin (A) include a repeating unit represented by the following Formula (I).

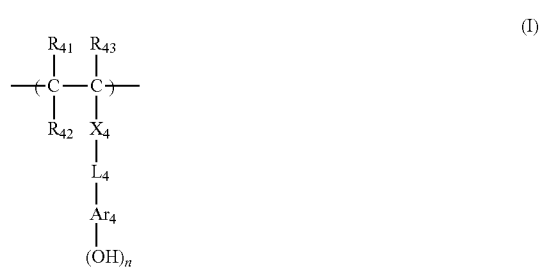

In the formula, $R_{41}$, $R_{42}$, and $R_{43}$ each independently represent a hydrogen atom, an alkyl group, a halogen atom, a cyano group, or an alkoxycarbonyl group. $R_{42}$ may be bonded to $Ar_4$ to form a ring. In this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents a (n+1)-valent aromatic ring group, and in a case where $Ar_4$ is bonded to $R_{42}$ to form a ring, $Ar_4$ represents a (n+2)-valent aromatic ring group.

n represents an integer of 1 to 5.

As the alkyl group represented by $R_{41}$, $R_{42}$, and $R_{43}$ in Formula (I), an alkyl group having 20 or less carbon atoms which may have a substituent such as a methyl group, an ethyl group, a propyl group, an isopropyl group, a n-butyl group, a sec-butyl group, a hexyl group, a 2-ethylhexyl group, an octyl group, or a dodecyl group is preferable, an alkyl group having 8 or less carbon atoms is more preferable, and an alkyl group having 3 or less carbon atoms is still more preferable.

In Formula (I), the cycloalkyl group represented by $R_{41}$, $R_{42}$, and $R_{43}$ may be monocyclic or polycyclic. In particular, a monocycloalkyl group having 3 to 8 carbon atoms which may have a substituent such as a cyclopropyl group, a cyclopentyl group, or a cyclohexyl group is preferable.

Examples of the halogen atom represented by $R_{41}$, $R_{42}$, and $R_{43}$ in Formula (I) include a fluorine atom, a chlorine atom, a bromine atom, and an iodine atom. In particular, a fluorine atom is preferable.

As the alkyl group included in the alkoxycarbonyl group represented by $R_{41}$, $R_{42}$, and $R_{43}$ in Formula (I), the same alkyl groups as described above regarding $R_{41}$, $R_{42}$, and $R_{43}$ are preferable.

Preferable examples of a substituent of each of the groups include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms in the substituent is preferably 8 or less.

$Ar_4$ represents an (n+1)-valent aromatic ring group. In a case where n represents 1, a divalent aromatic ring group may have a substituent, and preferable examples thereof include an arylene group having 6 to 18 carbon atoms such as a phenylene group, a tolylene group, a naphthylene group, or an anthracenylene group; and an aromatic ring group having a heterocycle such as thiophene, furan, pyrrole, benzothiophene, benzofuran, benzopyrrole, triazine, imidazole, benzoimidazole, triazole, thiadiazole, or thiazole.

In a case where n represents an integer of 2 or more, preferable specific examples of the (n+1)-valent aromatic ring group include groups obtained by removing arbitrary (n−1) hydrogen atoms from the specific examples of the above-described divalent aromatic ring groups.

The (n+1)-valent aromatic ring group may further have a substituent.

Examples of a substituent which may be included in the alkyl group, the cycloalkyl group, the alkoxycarbonyl group, the alkylene group, and the (n+1)-valent aromatic ring group include: the alkoxy groups represented by $R_{41}$, $R_{42}$, and $R_{43}$ in Formula (I), such as an alkyl group, a methoxy group, an ethoxy group, a hydroxyethoxy group, a propoxy group, a hydroxypropoxy group, or a butoxy group; and an aryl group such as a phenyl group.

As an alkyl group represented by $R_{64}$ in —$CONR_{64}$— ($R_{64}$ represents a hydrogen atom or an alkyl group) represented by $X_4$, an alkyl group having 20 or less carbon atoms which may have a substituent such as a methyl group, an ethyl group, a propyl group, an isopropyl group, a n-butyl group, a sec-butyl group, a hexyl group, a 2-ethylhexyl group, an octyl group, or a dodecyl group is preferable, and an alkyl group having 8 or less carbon atoms is more preferable.

As $X_4$, a single bond, —COO—, or —CONH— is preferable, and a single bond or —COO— is more preferable.

Preferable examples of the alkylene group represented by $L_4$ include an alkylene group having 1 to 8 carbon atoms which may have a substituent such as a methylene group, an ethylene group, a propylene group, a butylene group, a hexylene group, or an octylene group.

As $Ar_4$, an aromatic ring group having 6 to 18 carbon atoms which may have a substituent is more preferable, and a benzene ring group, a naphthalene ring group, or a biphenylene ring group is still more preferable.

It is preferable that the repeating unit represented by Formula (I) includes a hydroxystyrene structure. That is, it is preferable that $Ar_4$ represents a benzene ring group.

Preferable examples of the repeating unit having a phenolic hydroxyl group included in the resin (A) include a repeating unit represented by the following Formula (p1).

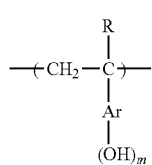

(p1)

In Formula (p1), R represents a hydrogen atom or a linear or branched alkyl group having a halogen atom or 1 to 4 carbon atoms. A plurality of R's may be the same as or different from each other. As R in Formula (p1), a hydrogen atom is preferable.

Ar in Formula (p1) represents an aromatic ring, and examples thereof include: an aromatic hydrocarbon ring having 6 to 18 carbon atoms which may have a substituent such as a benzene ring, a naphthalene ring, an anthracene ring, a fluorene ring, or a phenanthrene ring; and an aromatic heterocycle having a heterocycle such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, or a thiazole ring. Among these, a benzene ring is most preferable.

In Formula (p1), m represents an integer of 1 to 5 and preferably 1.

Hereinafter, specific examples of the repeating unit having a phenolic hydroxyl group included in the resin (A) will be shown, but the present invention is not limited thereto. In the formulae, a represents 1 or 2.

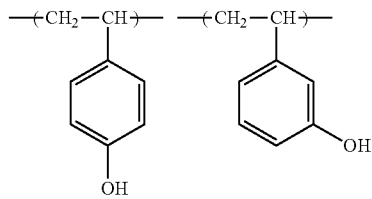

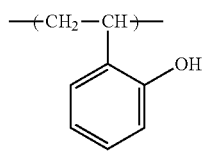

(B-1)

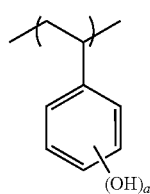

(B-2)

(B-3)

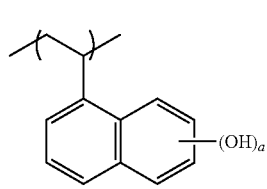

(B-4)

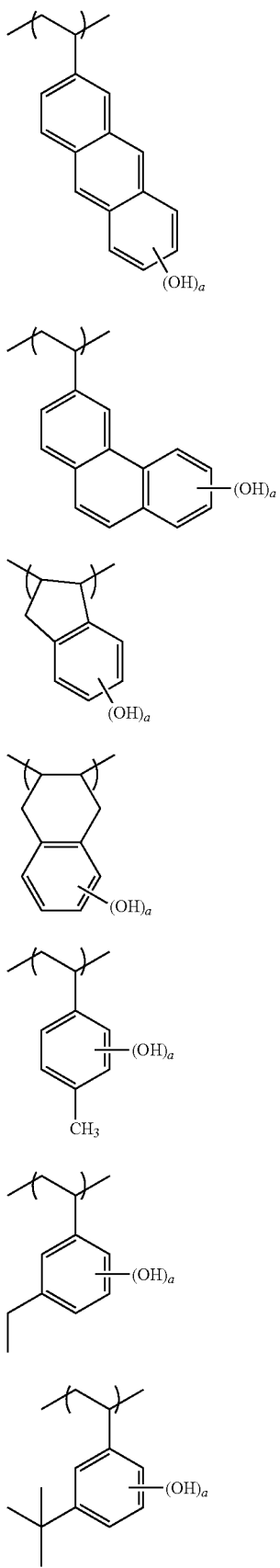
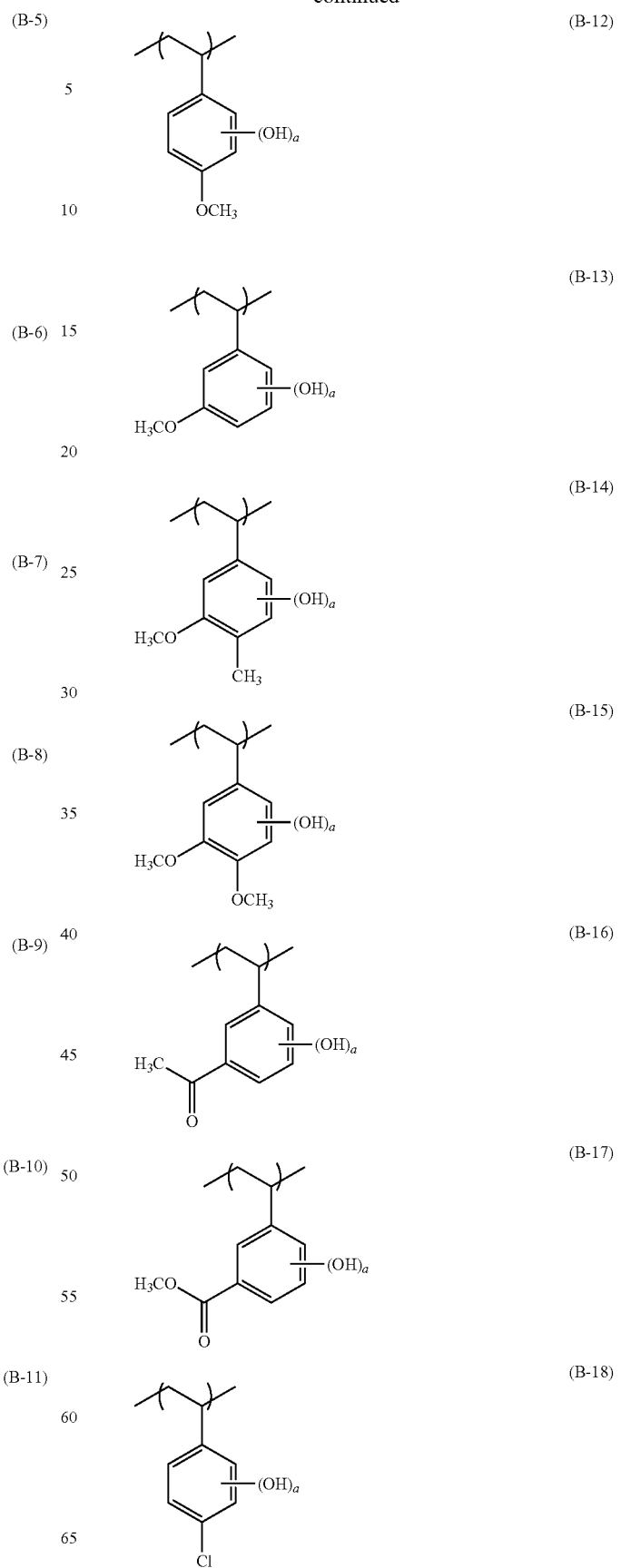

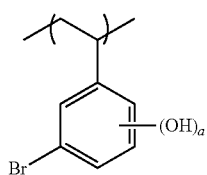
(B-19)
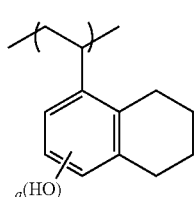
(B-20)
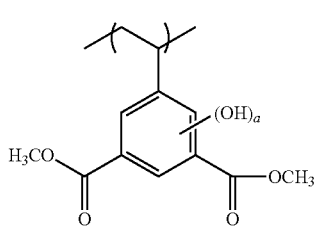
(B-21)
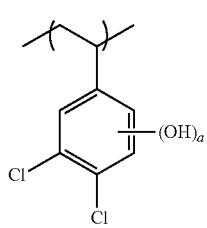
(B-22)
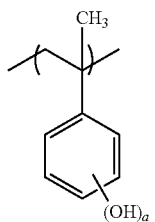
(B-23)
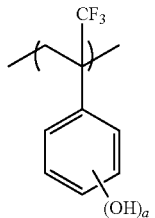
(B-24)
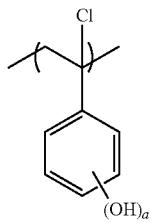
(B-25)
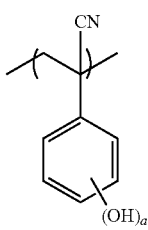
(B-26)
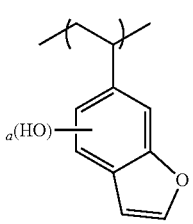
(B-27)
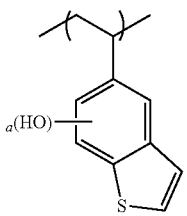
(B-28)
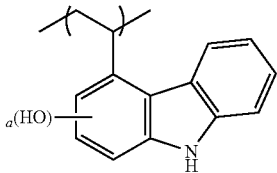
(B-29)
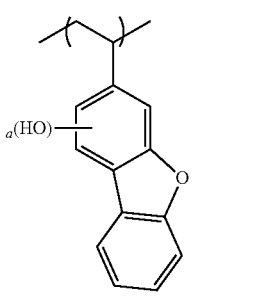
(B-30)
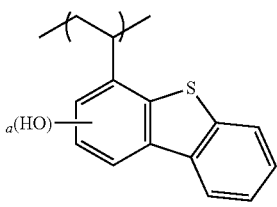
(B-31)
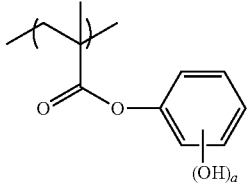
(B-32)

(B-33)
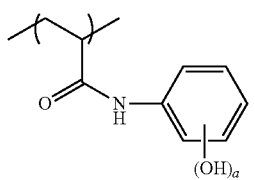

(B-34)
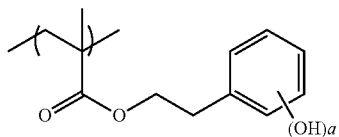

(B-35)
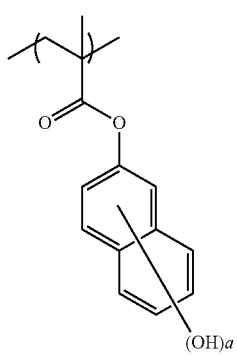

(B-36)
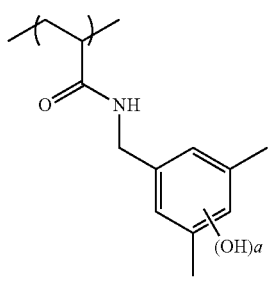

(B-37)
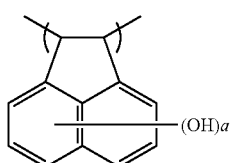

(B-38)
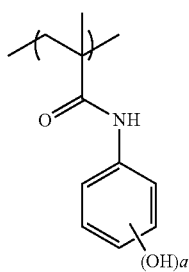

The content of the repeating unit having a phenolic hydroxyl group is preferably 0 to 50 mol %, more preferably 0 to 45 mol %, and still more preferably 0 to 40 mol % with respect to all the repeating units of the resin (A).

The repeating unit having a group which is decomposed by the action of an acid to produce a carboxyl group included in the resin (A) is a repeating unit having a group which is substituted with a group obtained by a hydrogen atom being removed from a carboxyl group due to decomposition caused by the action of an acid.

Examples of the group which is removed by an acid include —C($R_{36}$)($R_{37}$)($R_{38}$), —C($R_{36}$)($R_{37}$)($OR_{39}$), and —C($R_{01}$)($R_{02}$)($OR_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ to $R_{02}$ each independently represent a hydrogen atom, an alkyl group, a cycloalkyl group, an aryl group, an aralkyl group, or an alkenyl group.

As the repeating unit having a group which is decomposed by the action of an acid to produce a carboxyl group included in the resin (A), a repeating unit represented by the following Formula (AI) is preferable.

(AI)
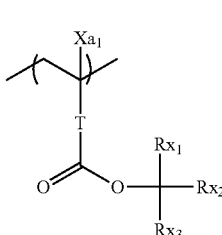

In Formula (AI), $Xa_1$ represents a hydrogen atom or an alkyl group which may have a substituent.

T represents a single bond or a divalent linking group.

$Rx_1$ to $Rx_3$ each independently represent an alkyl group (linear or branched) or a cycloalkyl group (monocyclic or polycyclic). In a case where all of $Rx_1$ to $Rx_3$ represent an alkyl group (linear or branched), it is preferable that at least two of $Rx_1$, $Rx_2$, and $Rx_3$ represent a methyl group.

Two of $Rx_1$ to $Rx_3$ may be bonded to each other to form a cycloalkyl group (monocyclic or polycyclic).

Examples of the alkyl group which may have a substituent represented by $Xa_1$ include a methyl group or a group represented by —$CH_2$-$R_{11}$. $R_{11}$ represents a halogen atom (for example, a fluorine atom), a hydroxyl group, or a monovalent organic group, and examples thereof include an alkyl group having 5 or less carbon atoms and an acyl group having 5 or less carbon atoms. In particular, an alkyl group having 3 or less carbon atoms is preferable, and a methyl group is more preferable. In one aspect, $Xa_1$ represents preferably a hydrogen atom, a methyl group, a trifluoromethyl group, or a hydroxymethyl group.

Examples of the divalent linking group represented by T include an alkylene group, a —COO-Rt-group, and a —O-Rt-group. In the formula, Rt represents an alkylene group or a cycloalkylene group.

T represents preferably a single bond or a —COO-Rt-group. Rt represents preferably an alkylene group having 1 to 5 carbon atoms and more preferably a —$CH_2$-group, a —$(CH_2)_2$-group, or a —$(CH_2)_3$-group.

As the alkyl group represented by $Rx_1$ to $Rx_3$, an alkyl group having 1 to 4 carbon atoms such as a methyl group, an ethyl group, a n-propyl group, an isopropyl group, a n-butyl group, an isobutyl group, or a t-butyl group is preferable.

As the cycloalkyl group represented by $Rx_1$ to $Rx_3$, a monocycloalkyl group such as a cyclopentyl group or a cyclohexyl group, or a polycycloalkyl group such as a norbornyl group, a tetracyclodecanyl group, a tetracyclododecanyl group, or an adamantyl group is preferable.

As the cycloalkyl group which is formed by two of $Rx_1$ to $Rx_3$ being bonded to each other, a monocycloalkyl group such as a cyclopentyl group or a cyclohexyl group, or a polycycloalkyl group such as a norbornyl group, a tetracyclodecanyl group, a tetracyclododecanyl group, or an adamantyl group is preferable. In particular, a monocycloalkyl group having 5 or 6 carbon atoms is preferable.

In the cycloalkyl group which is formed by two of $Rx_1$ to $Rx_3$ being bonded to each other, for example, one methylene group constituting the ring may be substituted with a heteroatom such as an oxygen atom or a group having a heteroatom such as a carbonyl group.

In the repeating unit represented by Formula (AI), for example, it is preferable that $Rx_1$ represents a methyl group or an ethyl group and that $Rx_2$ and $Rx_3$ are bonded to each other to form the cycloalkyl group.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), in which the number of carbon atoms is preferably 8 or less.

As the repeating unit represented by Formula (AI), an acid-decomposable tertiary alkyl (meth)acrylate repeating unit (a repeating unit in which $Xa_1$ represents a hydrogen atom or a methyl group, and T represents a single bond) is preferable. A repeating unit in which $Rx_1$ to $Rx_3$ each independently represent a linear or branched alkyl group is more preferable, and a repeating unit in which $Rx_1$ to $Rx_3$ each independently represent a linear alkyl group is still more preferable.

Hereinafter, specific examples of the repeating unit having a group which is decomposed by the action of an acid to produce a carboxyl group included in the resin (A) will be shown, but the present invention is not limited thereto.

In the specific examples, Rx and $Xa_1$ represent a hydrogen atom, $CH_3$, $CF_3$, or $CH_2OH$. Rxa and Rxb each independently represent an alkyl group having 1 to 4 carbon atoms. Z represents a substituent having a polar group. In a case where a plurality of Z's are present, Z's each independently represent a substituent having a polar group. p represents 0 or a positive integer. Examples of the substituent having a polar group represented by Z include a linear or branched alkyl group having a hydroxyl group, a cyano group, an amino group, an alkylamido group, or a sulfonamide group, or a cycloalkyl group. In particular, an alkyl group having a hydroxyl group is preferable. As the branched alkyl group, an isopropyl group is preferable.

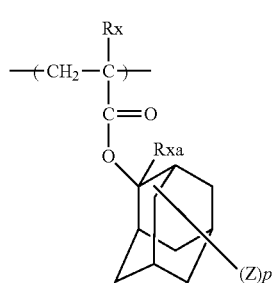

1

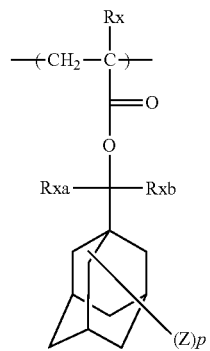

2

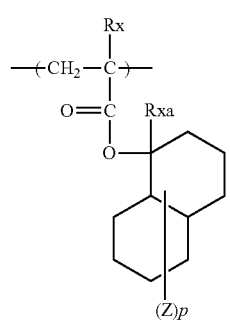

3

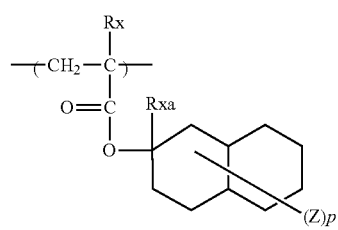

4

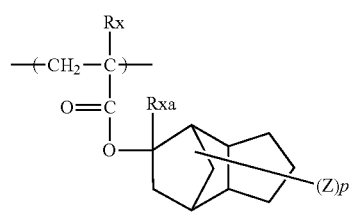

5

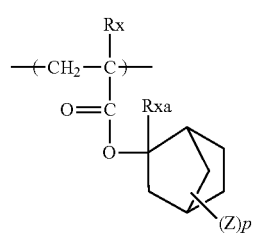

6

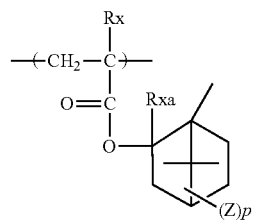

7

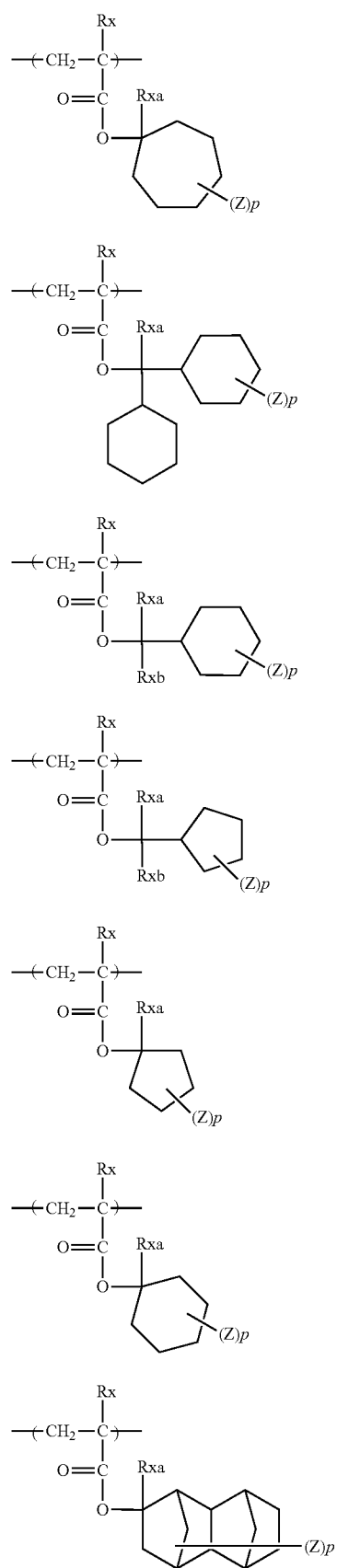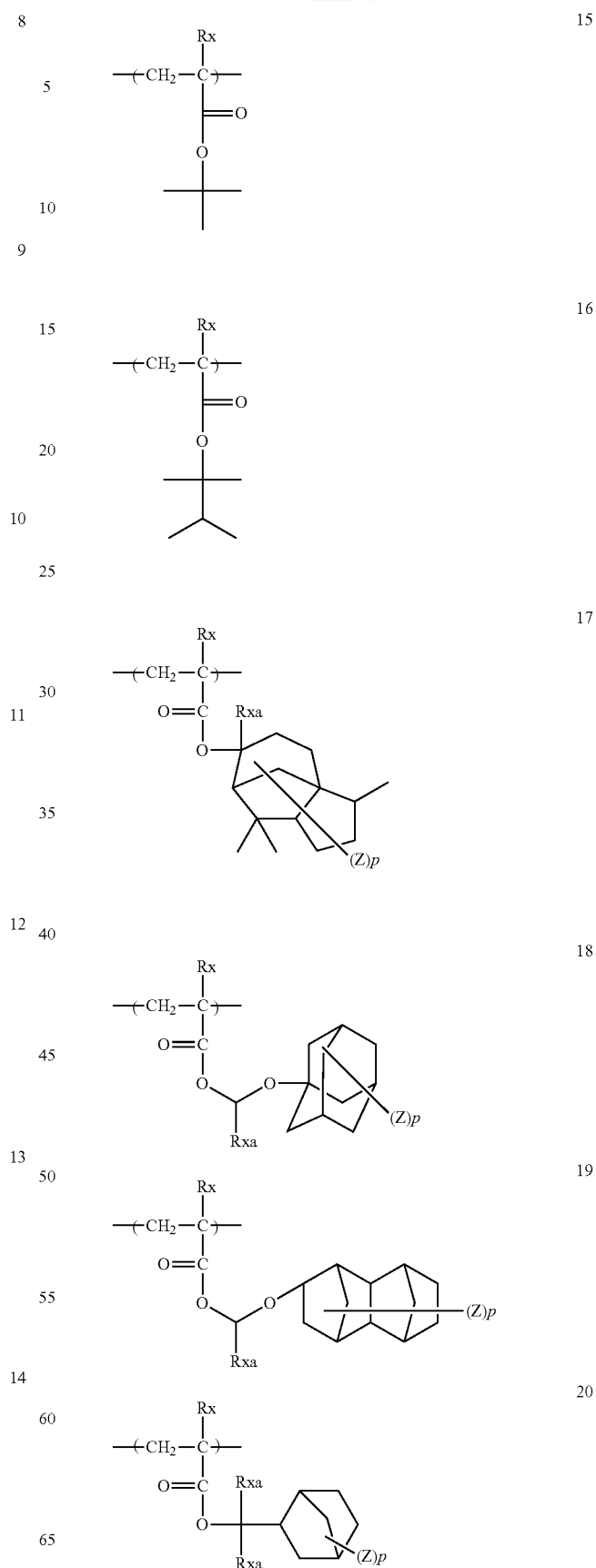

-continued

21
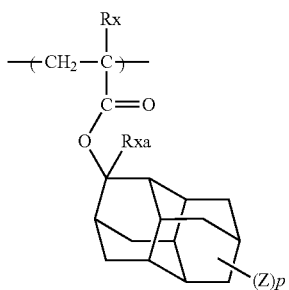

22
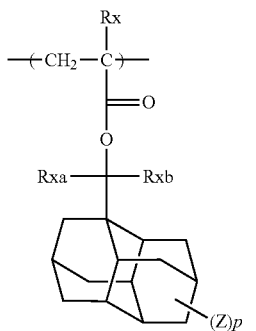

23
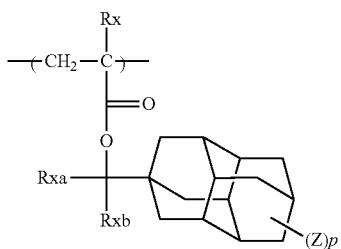

24
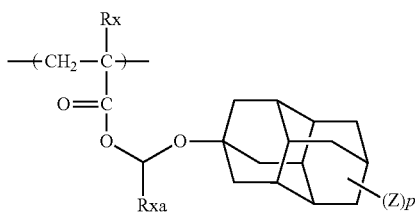

25
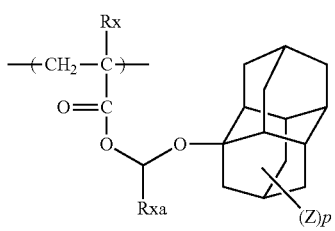

The content of the repeating unit having a group which is decomposed by the action of an acid to produce a carboxyl group is preferably 15 to 90 mol %, more preferably 20 to 90 mol %, still more preferably 25 to 80 mol %, and even still more preferably 30 to 70 mol % with respect to all the repeating units of the resin (A).

It is preferable that the resin (A) further includes a repeating unit having a lactone group.

As the lactone group, any group having a lactone structure can be used. In particular, a group having a 5- to 7-membered lactone structure is preferable. In this case, it is preferable that another ring structure may be fused to group having a 5- to 7-membered lactone structure to form a bicyclo structure or a spiro structure.

It is preferable that the resin (A) further includes a repeating unit which has a group having with a lactone structure represented by any one of the following Formulae (LC1-1) to (LC1-16). In addition, the group having a lactone structure may be directly bonded to a main chain. As the lactone structure, a group represented by Formula (LC1-1), (LC1-4), (LC1-5), (LC1-6), (LC1-13), or (LC1-14) is preferable.

LC1-1
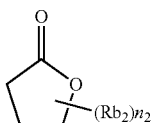

LC1-2
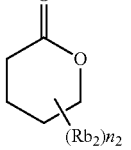

LC1-3
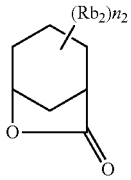

LC1-4
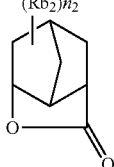

LC1-5
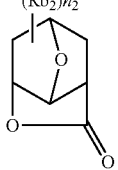

LC1-6
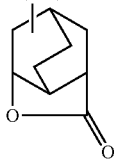

LC1-7
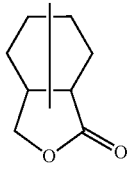

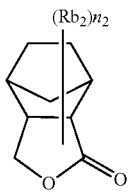

LC1-8

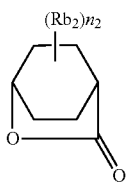

LC1-9

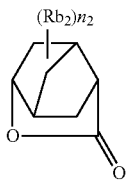

LC1-10

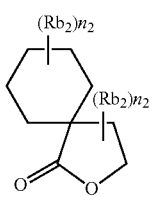

LC1-11

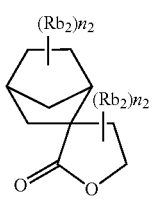

LC1-12

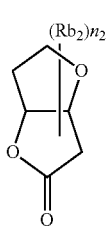

LC1-13

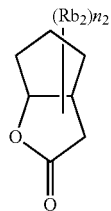

LC1-14

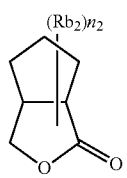

LC1-15

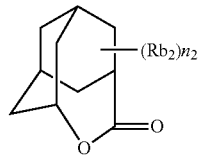

LC1-16

The lactone structure portion may or may not have a substituent ($Rb_2$). Preferable examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. In a case where $n_2$ represents 2 or more, a plurality of $Rb_2$'s may be the same as or different from each other or may be bonded to each other to form a ring.

Examples of the repeating unit which has a group having a lactone structure represented by any one of Formulae (LC1-1) to (LC1-16) include a repeating unit represented by the following Formula (AII).

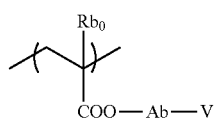

(AII)

In Formula (AII), $Rb_0$ represents a hydrogen atom, a halogen atom, or an alkyl group having 1 to 4 carbon atoms.

Preferable examples of a substituent which may be included in the alkyl group represented by $Rb_0$ include a hydroxyl group and a halogen atom.

Examples of the halogen atom represented by $Rb_0$ include a fluorine atom, a chlorine atom, a bromine atom, and an iodine atom. $Rb_0$ represents preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group including a combination thereof. In particular, a single bond or a linking group represented by -$Ab_1$-$CO_2$— is preferable. $Ab_1$ represents a linear or branched alkylene group or a monocyclic or polycyclic cycloalkylene group and preferably a methylene group, an ethylene group, a cyclohexylene group, an adamantylene group, or a norbornylene group.

V represents a group represented by any one of Formulae (LC1-1) to (LC1-16).

In the repeating unit which has a group having a lactone structure, an optical isomer is present, and any optical isomer may be used. In addition, one optical isomer may be used alone, or a mixture of a plurality of optical isomers may be used. In a case where one optical isomer is mainly used, the optical purity (ee) thereof is preferably 90 or higher and more preferably 95 or higher.

Hereinafter, specific examples of the repeating unit which has a group having a lactone structure will be shown, but the present invention is not limited thereto.

(In the formulae, Rx represents H, $CH_3$, $CH_2OH$, or $CF_3$)

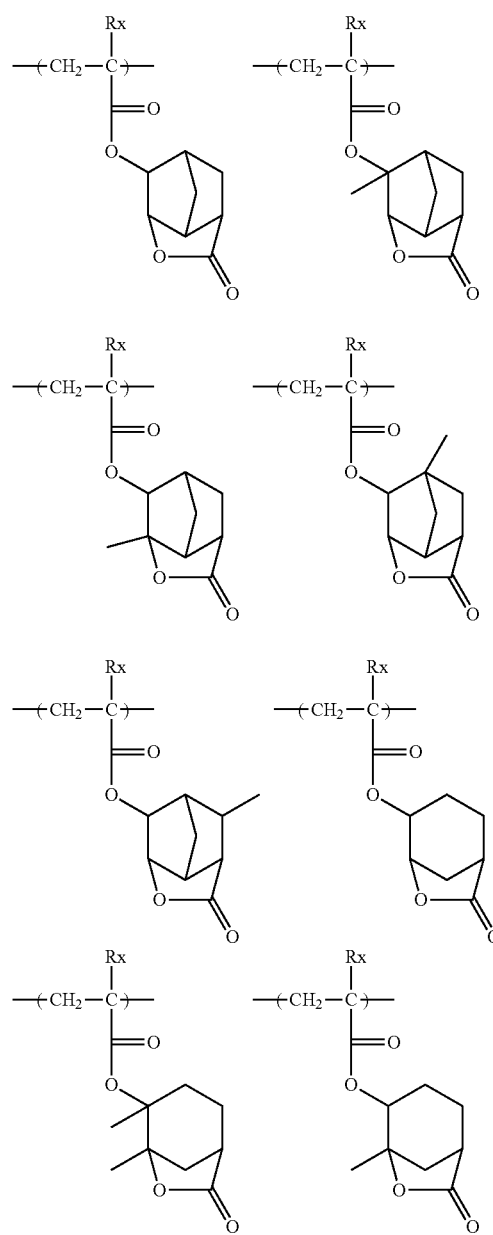
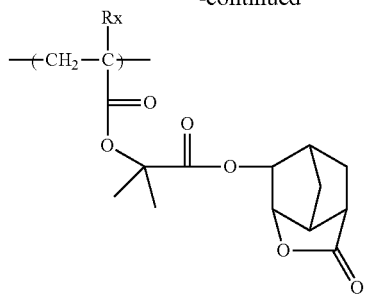
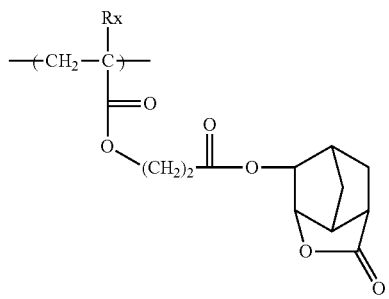
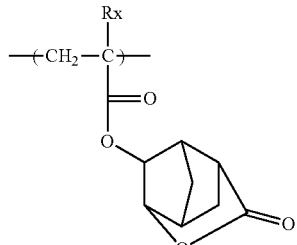
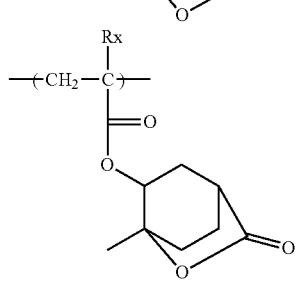
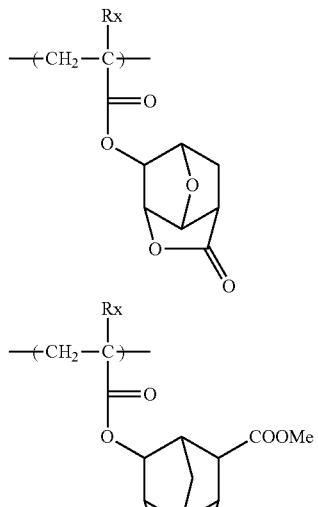

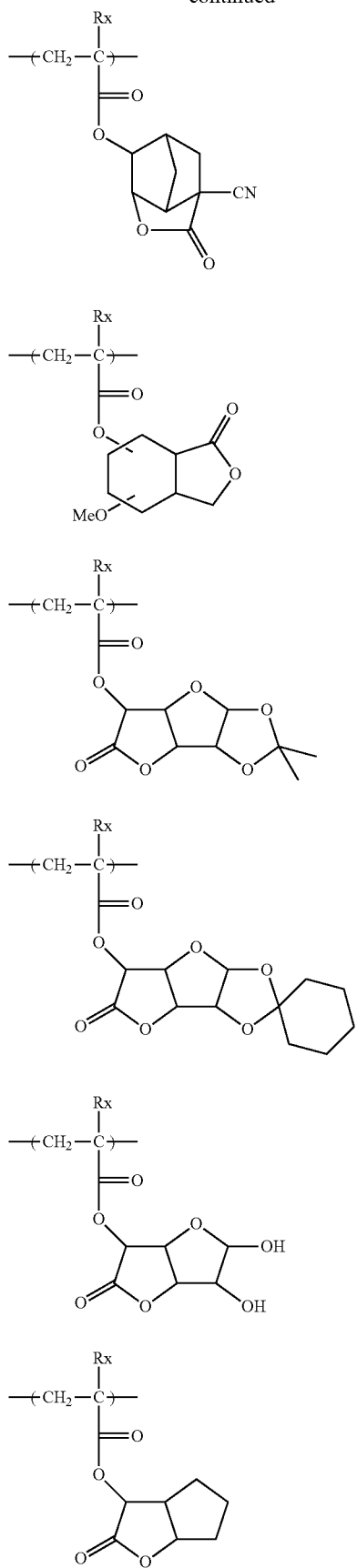
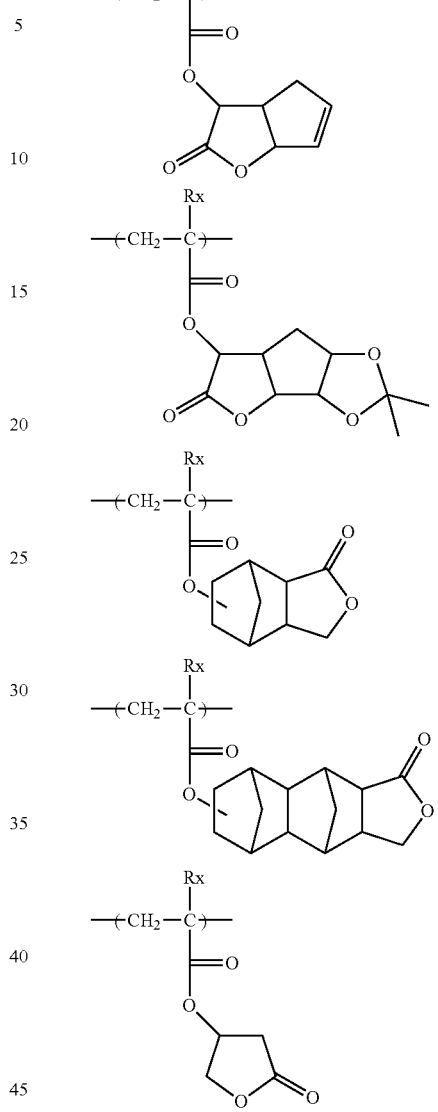

The content of the repeating unit having a lactone group is preferably 1 to 65 mol %, more preferably 1 to 30 mol %, more preferably 5 to 25 mol %, and still more preferably 5 to 20 mol %, with respect to all the repeating units of the resin (A).

The resin (A) may further include a repeating unit which has an organic group having a polar group, in particular, a repeating unit which has an alicyclic hydrocarbon structure substituted with a polar group.

As a result, substrate adhesiveness or developer affinity are improved. As the alicyclic hydrocarbon structure of the alicyclic hydrocarbon structure substituted with a polar group, an adamantyl group, a diamantyl group, or a norbornane group is preferable. As the polar group, a hydroxyl group or a cyano group is preferable.

Hereinafter, specific examples of the repeating unit having a polar group will be shown, but the present invention is not limited thereto.

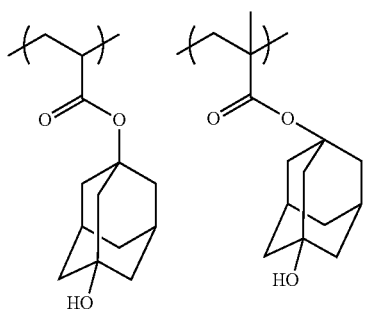
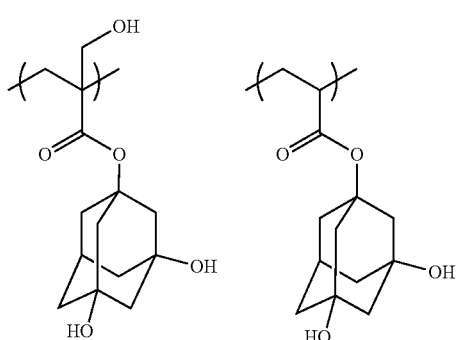
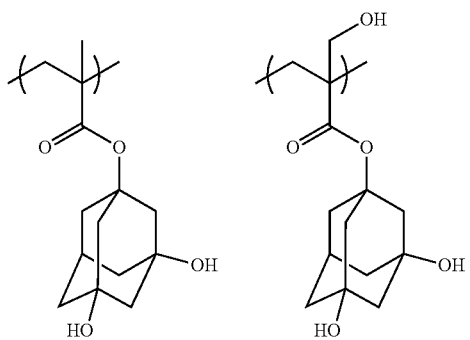
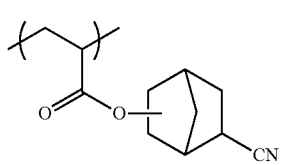
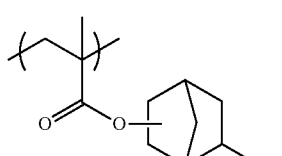
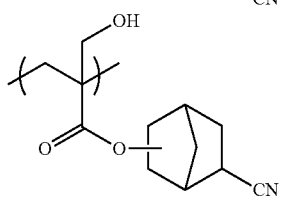
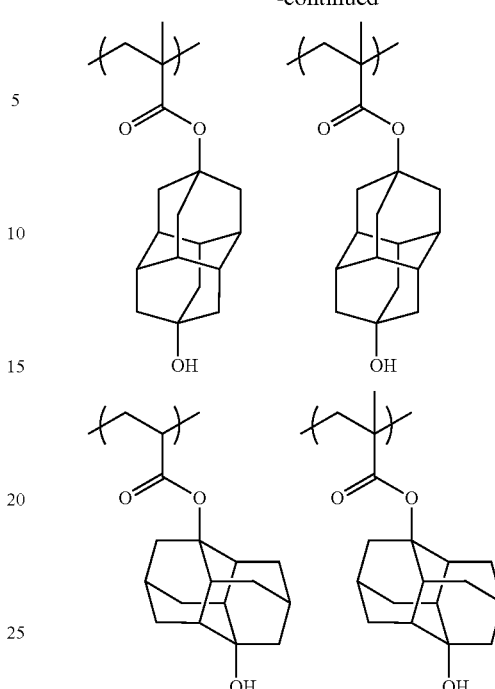

In a case where the resin (A) includes the repeating unit which has an organic group having a polar group, the content thereof is preferably 1 to 50 mol %, more preferably 1 to 30 mol %, still more preferably 5 to 25 mol %, and even still more preferably 5 to 20 mol % with respect to all the repeating units of the resin (A).

Further, as a repeating unit other than the above-described repeating units, the resin (A) may include a repeating unit having a group (photoacid generating group) which generates an acid when irradiated with an actinic ray or radiation. In this case, it can be considered that the repeating unit having a photoacid generating group corresponds to a compound (B) described below that generates an acid when irradiated with an actinic ray or radiation.

Examples of the repeating unit include a repeating unit represented by the following Formula (4).

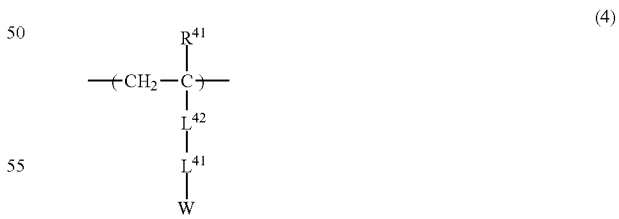

(4)

$R^{41}$ represents a hydrogen atom or a methyl group. $L^{41}$ represents a single bond or a divalent linking group. $L^{42}$ represents a divalent linking group. W represents a structural unit which is decomposed to generate an acid at a side chain when irradiated with an actinic ray or radiation.

Hereinafter, specific examples of the repeating unit represented by Formula (4) will be shown, but the present invention is not limited thereto.

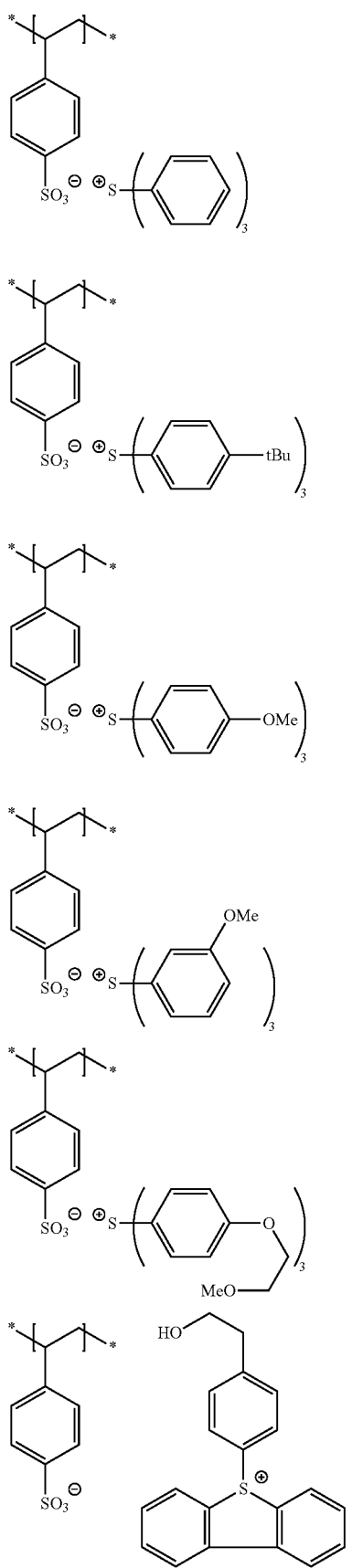
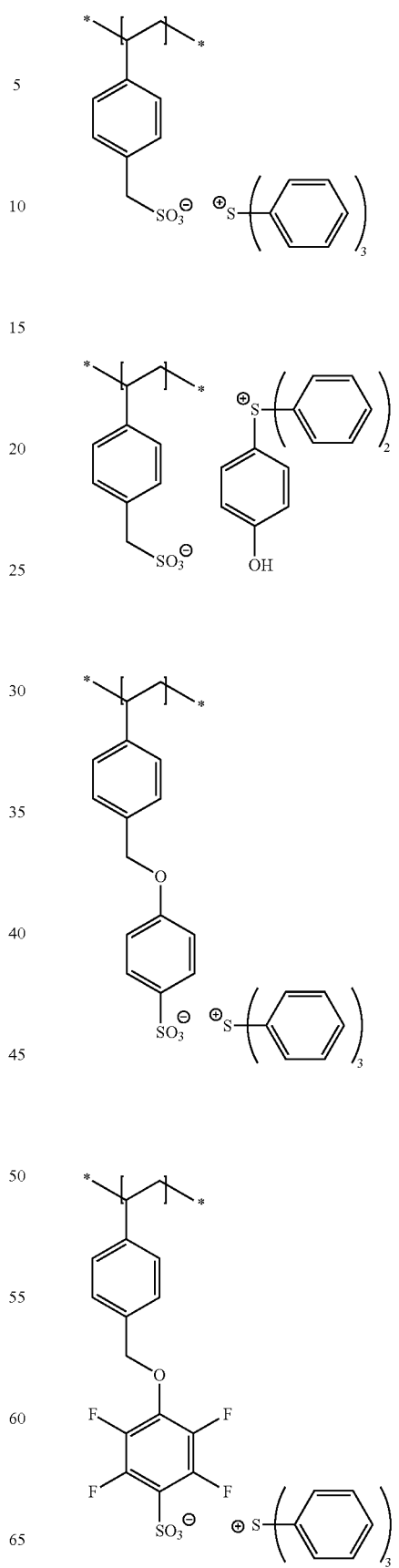

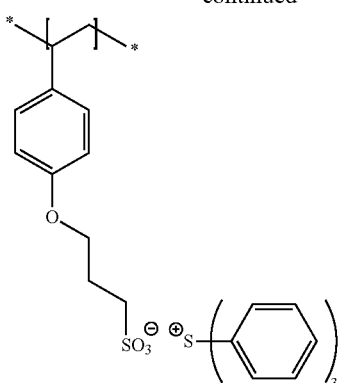

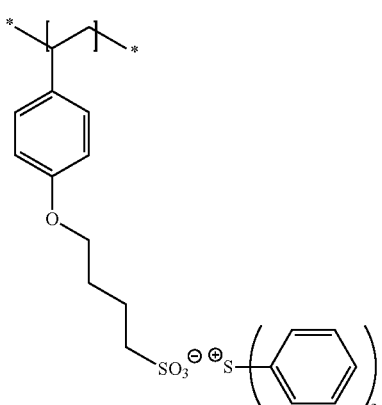

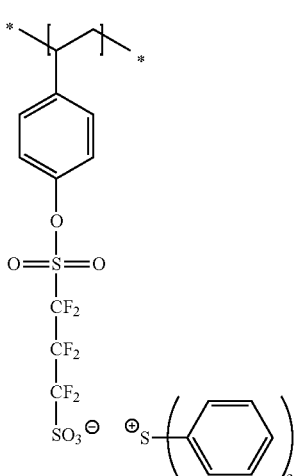

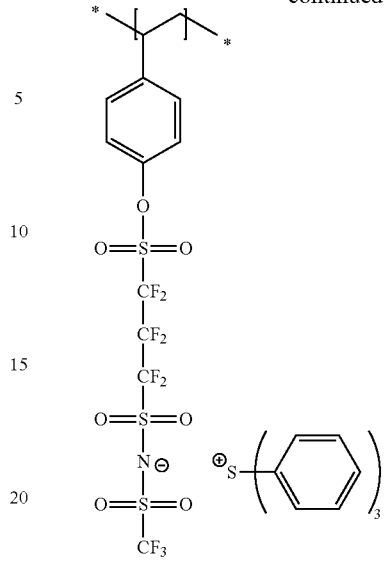

Other examples of the repeating unit represented by Formula (4) include repeating units described in paragraphs "0094" to "0105" of JP2014-041327A.

In a case where the resin (A) includes the repeating unit having a photoacid generating group, the content of the repeating unit having a photoacid generating group is preferably 1 to 40 mol %, more preferably 5 to 35 mol %, and still more preferably 5 to 30 mol % with respect to all the repeating units of the resin (A).

The resin (A) can be synthesized using an ordinary method (for example, radical polymerization). Examples of the general synthesis method include: a batch polymerization method of dissolving a monomer species and an initiator in a solvent and heating the solution for polymerization; and a dropping polymerization method of dropping a solution of a monomer species and an initiator dropwise to a heated solvent for 1 to 10 hours. Among these, a dropping polymerization method is preferable.

Examples of the reaction solvent include: an ether such as tetrahydrofuran, 1,4-dioxane, or diisopropyl ether; a ketone such as methyl ethyl ketone or methyl isobutyl ketone; an ester solvent such as ethyl acetate; an amide solvent such as dimethyl formamide or dimethylacetamide; and a solvent for dissolving an actinic ray-sensitive or radiation-sensitive composition described below such as propylene glycol monomethyl ether acetate, propylene glycol monomethyl ether, or cyclohexanone. It is preferable that the same solvent as that used in the actinic ray-sensitive or radiation-sensitive composition is used for polymerization. As a result, particle generation during storage can be suppressed.

It is preferable that the polymerization reaction is performed in an inert gas atmosphere such as nitrogen or argon. In order to initiate the polymerization, a commercially available radical initiator (for example, an azo initiator or peroxide) is used as the polymerization initiator. As the radical initiator, an azo initiator is preferable, and examples thereof include an azo initiator having an ester group, a cyano group, or a carboxyl group. Preferable examples of the initiator include azobisisobutyronitrile, azobisdimethylvaleronitrile, and dimethyl 2,2'-azobis(2-methylpropionate). If desired, the initiator is added additionally or dividedly. After completion of the reaction, the reaction product is put into a solvent, and a desired polymer is collected using a powder or solid collecting method or the like. The reaction concentration is 5 to 50 mass % and preferably 10 to 30 mass %.

The reaction temperature is typically 10° C. to 150° C., preferably 30° C. to 120° C., and still more preferably 60° C. to 100° C.

Examples of a method which can be used for purification include a typical method such as: a liquid-liquid extraction method in which a residual monomer or an oligomer component is removed using a combination of water cleaning and an appropriate solvent; a purification method in a solution state such as ultrafiltration in which substances having a specific molecular weight or lower are extracted and removed; a redispersion method in which a residual monomer is removed by dropping a resin solution over a poor solvent to solidify the resin in the poor solvent; and a purification method in a solid state in which a resin slurry separated by filtration is cleaned with a poor solvent.

The weight-average molecular weight of the resin (A) is preferably 1000 to 200000, more preferably 3000 to 20000, and most preferably 5000 to 15000 in terms of polystyrene by GPC. By adjusting the weight-average molecular weight to be 1000 to 200000, deterioration in heat resistance and dry etching resistance can be prevented. In addition, deterioration in developability and deterioration in film forming properties caused by an increase in viscosity can be prevented.

It is still more preferable that the weight-average molecular weight of the resin (A) is 3000 to 9500 in terms of polystyrene by GPC. By adjusting the weight-average molecular weight to be 3000 to 9500, in particular, a resist residue (hereinafter also referred to as "scum") is suppressed, and a more satisfactory pattern can be formed.

The dispersity (molecular weight distribution) is typically 1 to 5, preferably 1 to 3, more preferably 1.2 to 3.0, and still more preferably 1.2 to 2.0. As the dispersity decreases, the resolution and a resist shape are improved. In addition, a side wall of a resist pattern is smooth, and roughness properties are excellent.

In the actinic ray-sensitive or radiation-sensitive composition, the content of the resin (A) is preferably 50 to 99.9 mass % and more preferably 60 to 99.0 mass % with respect to the total solid content of the actinic ray-sensitive or radiation-sensitive composition.

In addition, in the actinic ray-sensitive or radiation-sensitive composition, one resin (A) may be used alone, or a plurality of resins (A) may be used in combination.

In addition, the resin (A) may include a repeating unit represented by the following Formula (VI).

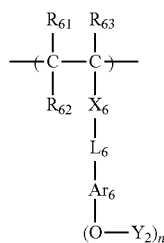

(VI)

In Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. $R_{62}$ may be bonded to $Ar_6$ to form a ring. In this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents a (n+1)-valent aromatic ring group, and in a case where $Ar_6$ is bonded to $R_{62}$ to form a ring, $Ar_6$ represents a (n+2)-valent aromatic ring group.

In a case where n represents 2 or more, $Y_2$'s each independently represent a hydrogen atom or a group which is removed by the action of an acid. At least one of $Y_2$'s represents a group which is removed by the action of an acid.

n represents an integer of 1 to 4.

As the group which is removed by the action of an acid represented by $Y_2$, a structure represented by Formula (VI-A) is more preferable.

(VI-A)

Here, $L_1$ and $L_2$ each independently represent a hydrogen atom, an alkyl group, a cycloalkyl group, an aryl group, or a group including a combination of an alkylene group and an aryl group.

M represents a single bond or a divalent linking group.

Q represents an alkyl group, a cycloalkyl group which may have a heteroatom, an aryl group which may have a heteroatom, an amino group, an ammonium group, a mercapto group, a cyano group, or an aldehyde group.

At least two of Q, M, and $L_1$ may be bonded to each other to form a ring (preferably a 5- or 6-membered ring).

It is preferable that the repeating unit represented by the formula (VI) is a repeating unit represented by the following Formula (3).

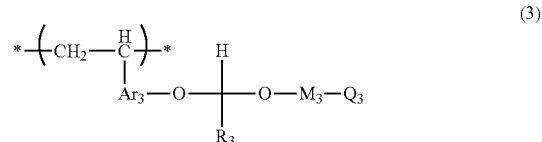

(3)

In Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two of $Q_3$, $M_3$, and $R_3$ are bonded to each other to form a ring.

The aromatic ring group represented by Ara is the same as $Ar_6$ in Formula (VI) in a case where n in Formula (VI) represents 1. In this case, a phenylene group or a naphthylene group is more preferable, and a phenylene group is still more preferable.

Hereinafter, specific examples of the repeating unit represented by Formula (VI) will be shown, but the present invention is not limited thereto.

(VI-1)
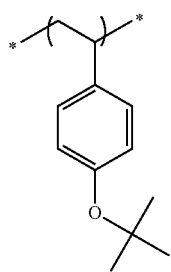
(VI-2)
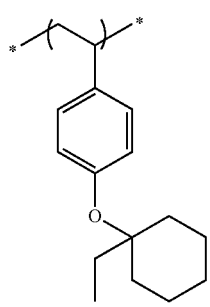
(VI-3)
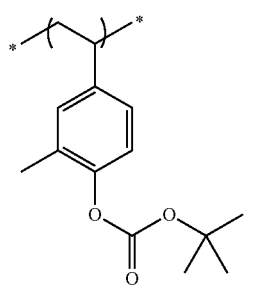
(VI-4)
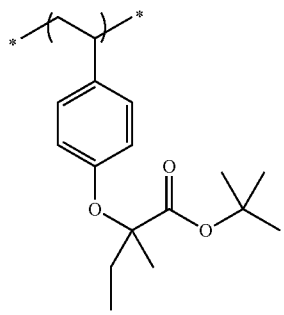
(VI-5)
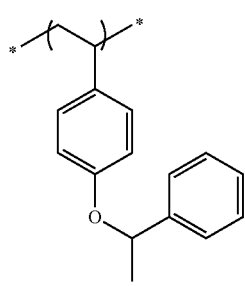
-continued
(VI-6)
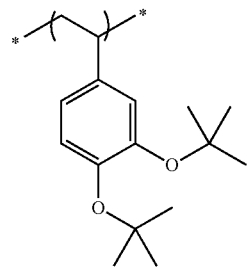
(VI-7)
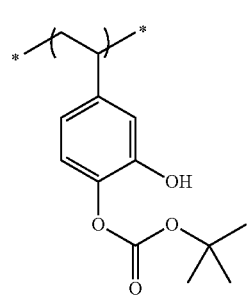
(VI-8)
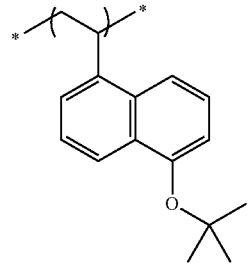
(VI-9)
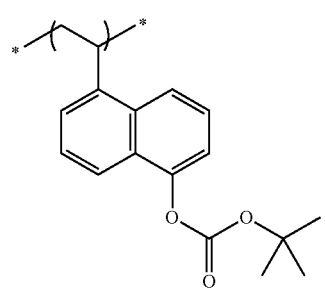
(VI-10)
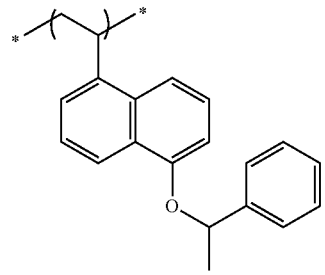

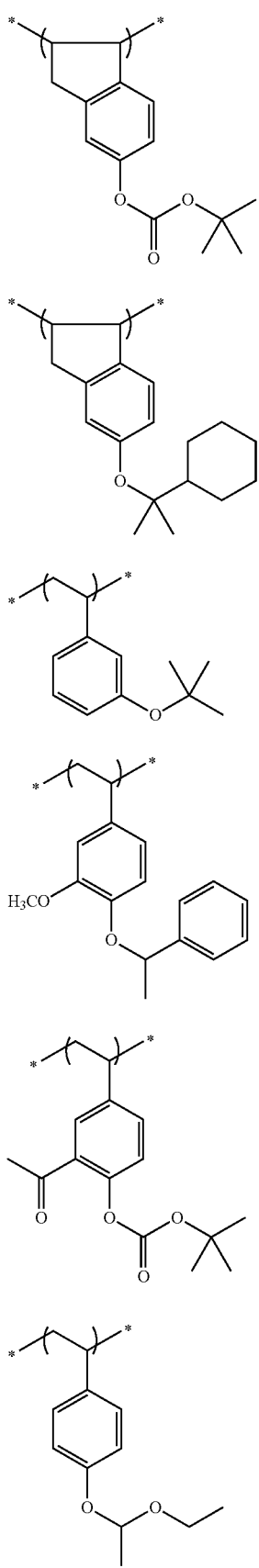
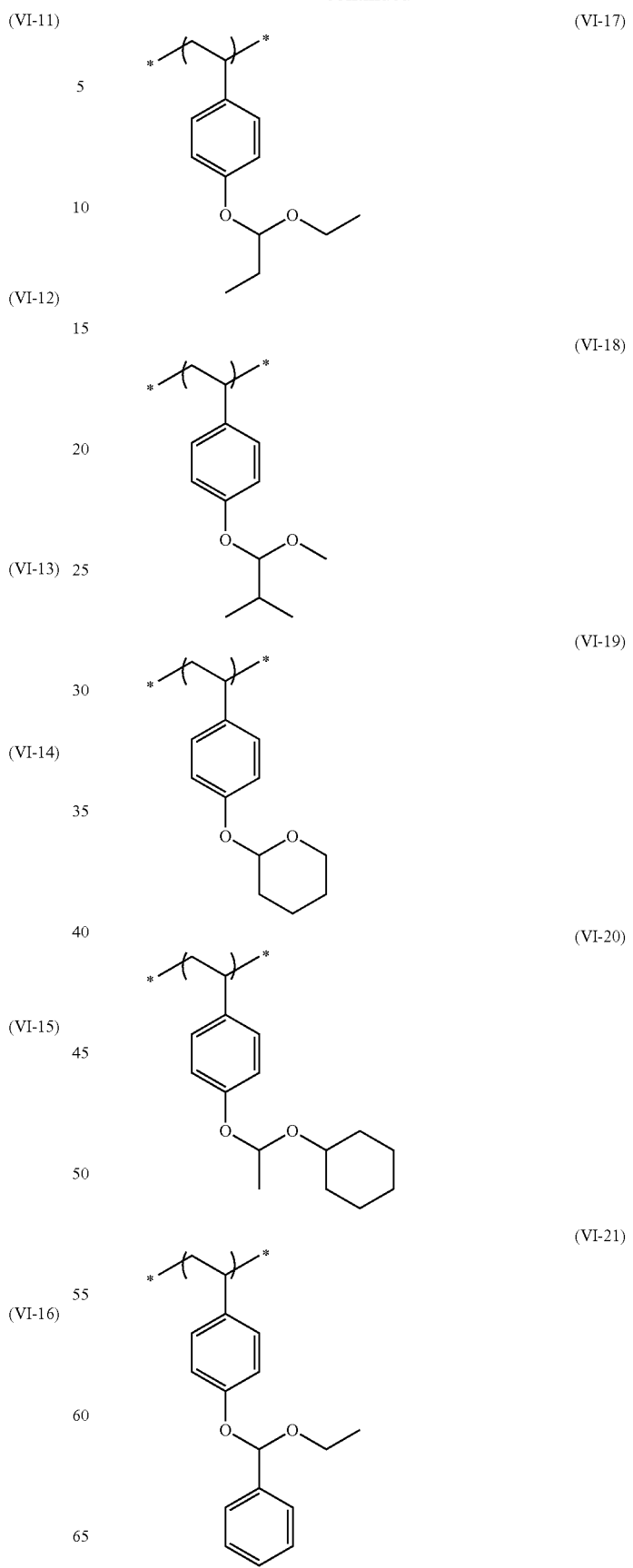

(VI-22) 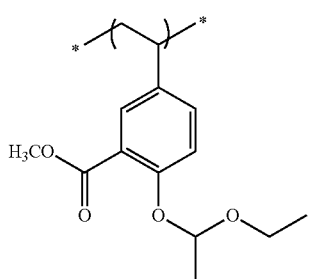
(VI-23) 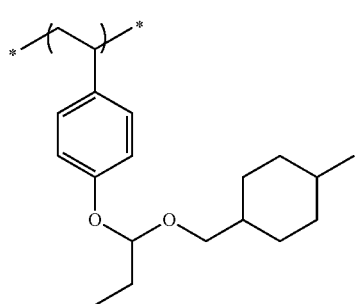
(VI-24) 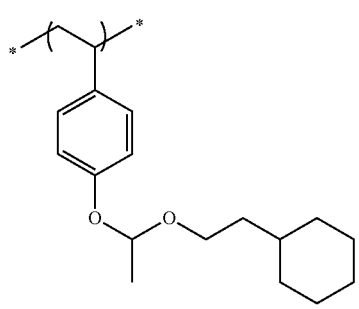
(VI-25) 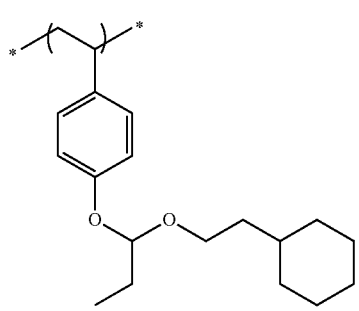
(VI-26) 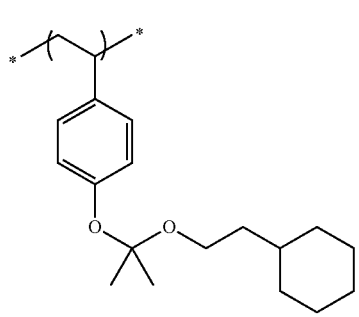
(VI-27) 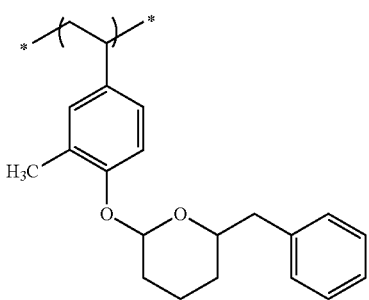
(VI-28) 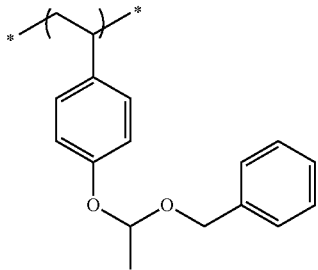
(VI-29) 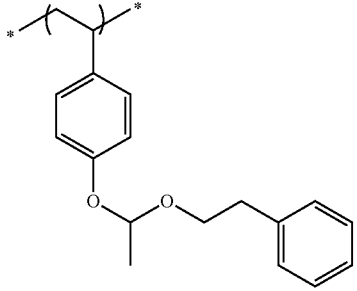
(VI-30) 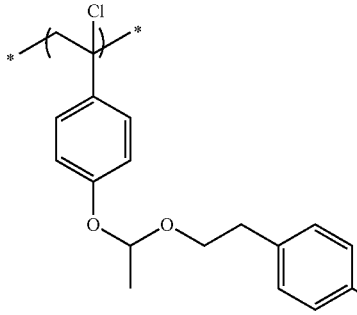
(VI-31) 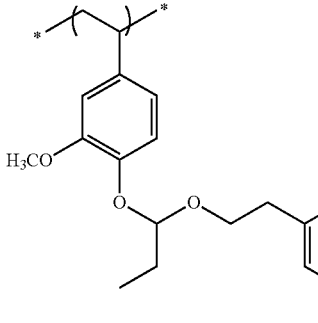

(VI-32) 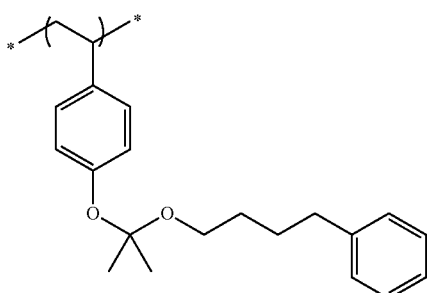

(VI-33) 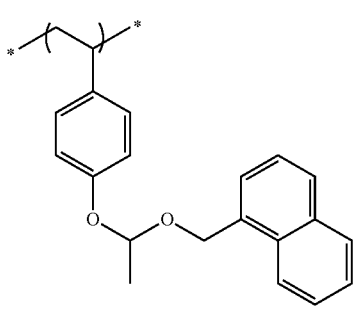

(VI-34) 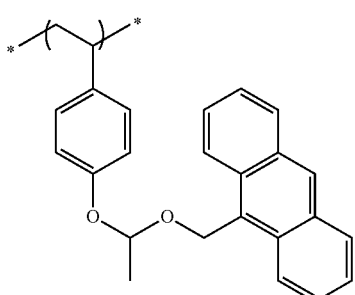

(VI-35) 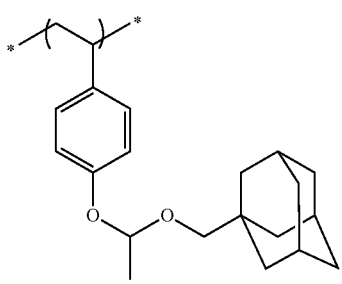

(VI-36) 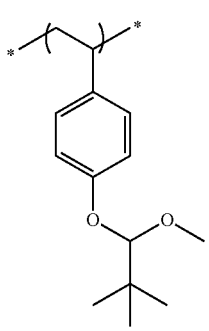

It is also preferable that the resin (A) includes a repeating unit represented by the following Formula (4).

(4) 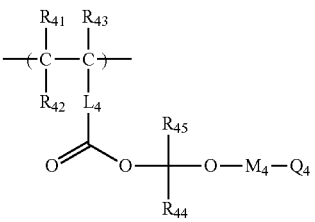

In Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring. In this case, $R_{42}$ represents an alkylene group.

$L_4$ represents a single bond or a divalent linking group. In a case where $L_4$ and $R_{42}$ form a ring, $L_4$ represents a trivalent linking group.

$R_{44}$ and $R_{45}$ represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an awl group, or a heterocyclic group.

At least two of $Q_4$, $M_4$, and $R_{44}$ are bonded to each other to form a ring.

$R_{41}$, $R_{42}$, and $R_{43}$ have the same definitions and the same preferable ranges as $R_{51}$, $R_{52}$, and $R_{53}$ in Formula (V).

$L_4$ has the same definition and the same preferable range as $L_5$ in Formula (V).

$R_{44}$ and $R_{45}$ have the same definition and the same preferable range as $R_3$ in Formula (3).

$M_4$ has the same definition and the same preferable range as $M_3$ in Formula (3).

$Q_4$ has the same definition and the same preferable range as $Q_3$ in Formula (3).

Examples of a ring which is formed by at least two of $Q_4$, $M_4$, and $R_{44}$ being bonded to each other include the ring which is formed by at least two of $Q_3$, $M_3$, and $R_3$ being bonded to each other, and preferable ranges thereof are also the same.

Hereinafter, specific examples of the repeating unit represented by Formula (4) will be shown, but the present invention is not limited thereto.

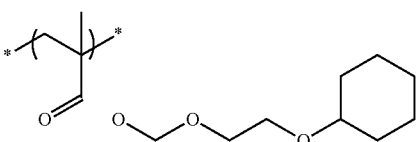

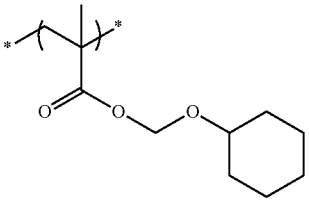

-continued
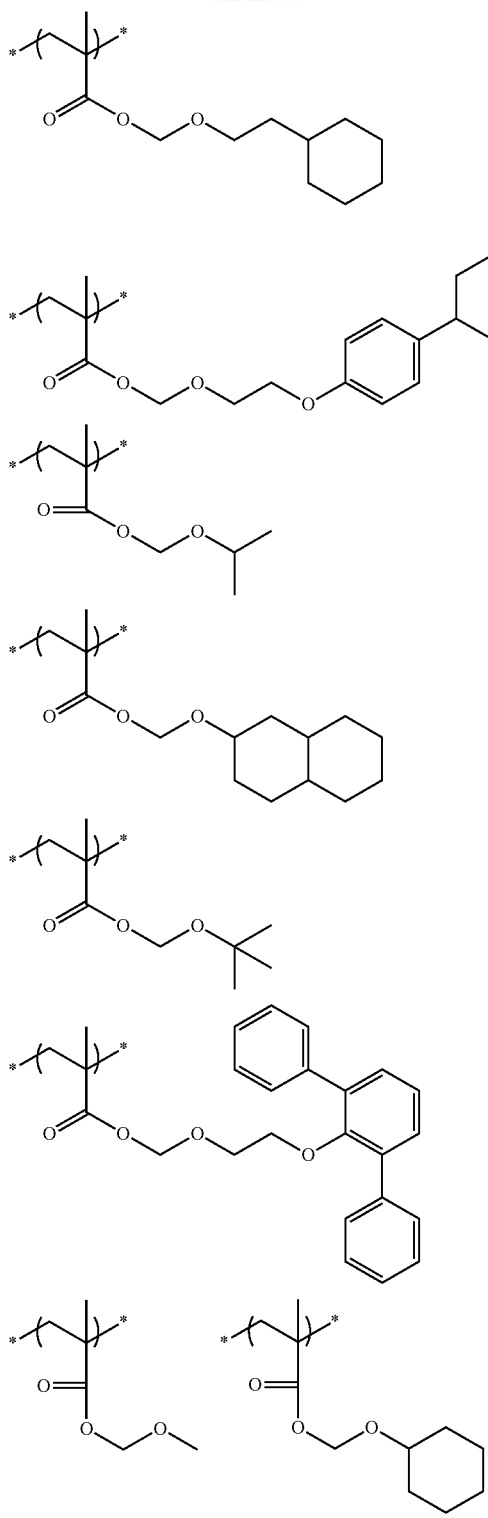
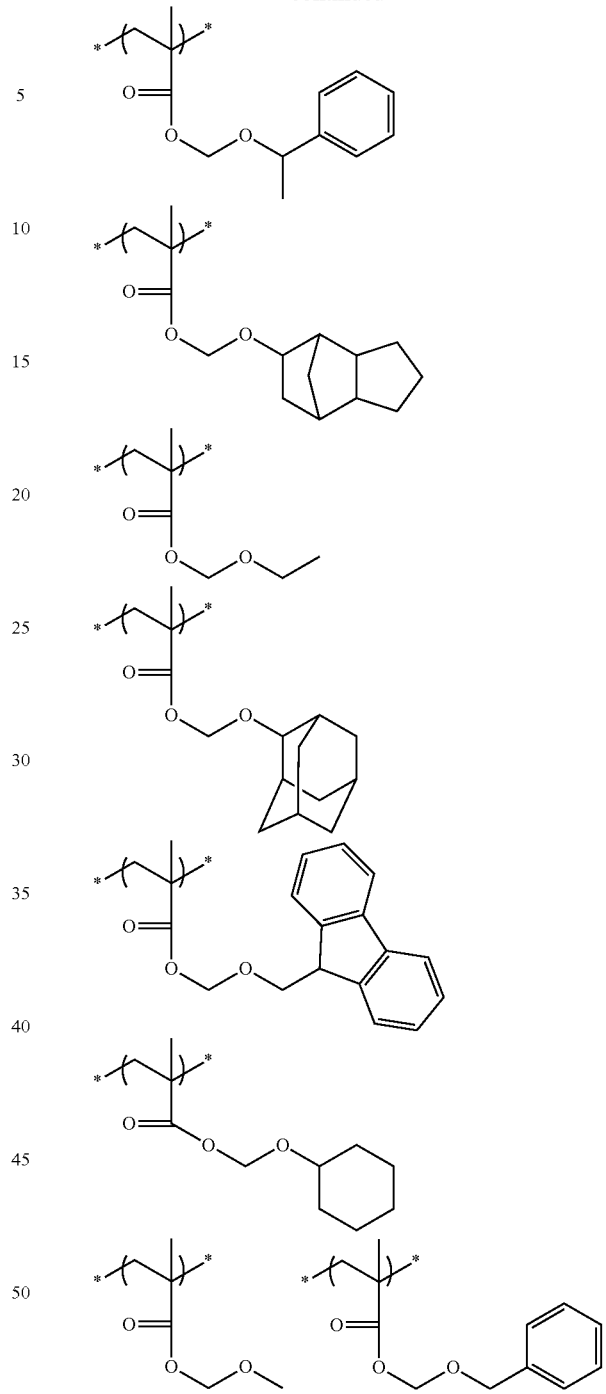
In addition, the resin (A) may include a repeating unit represented by the following Formula (BZ).
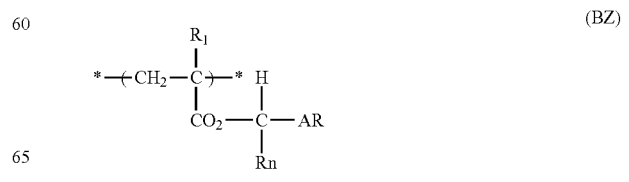

In Formula (BZ), AR represents an aryl group. Rn represents an alkyl group, a cycloalkyl group, or an aryl group. Rn and AR may be bonded to each other to form a nonaromatic ring.

$R_1$ represents a hydrogen atom, an alkyl group, a cycloalkyl group, a halogen atom, a cyano group, or an alkyloxycarbonyl group.

Hereinafter, specific examples of the repeating unit represented by the formula (BZ) will be shown, but the present invention is not limited thereto.

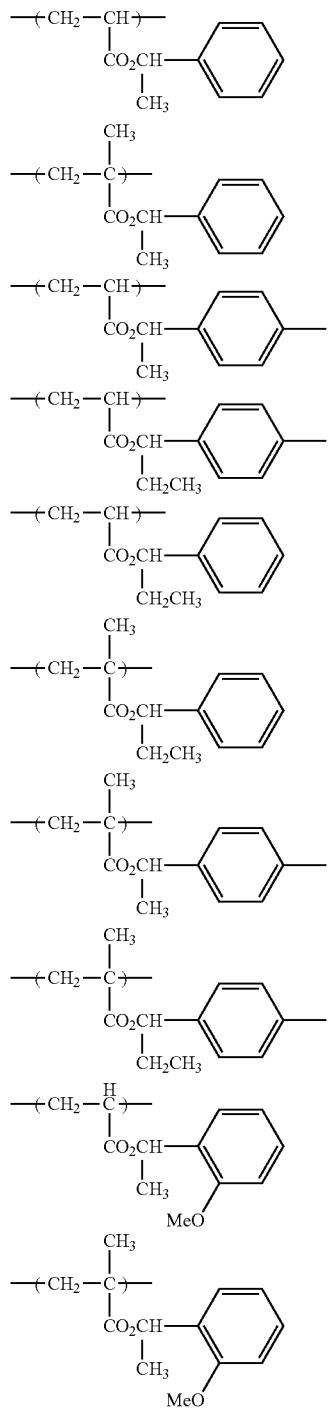

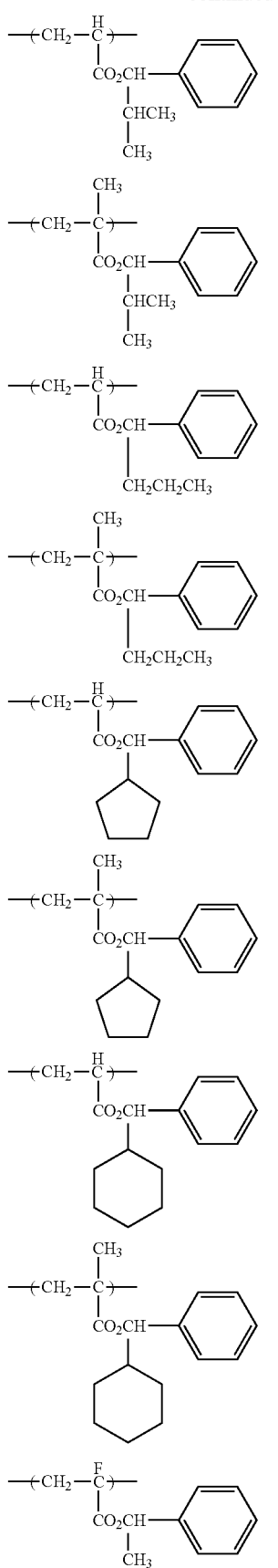

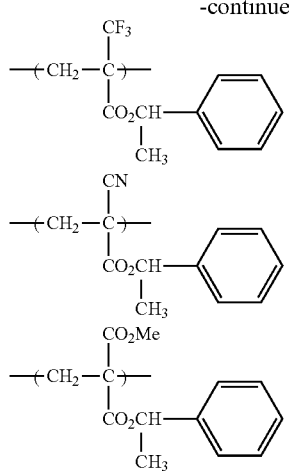

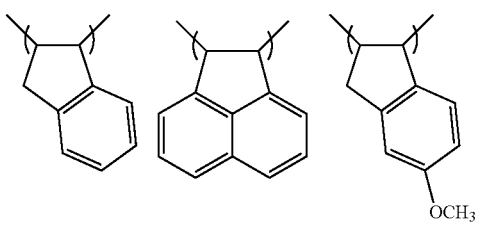

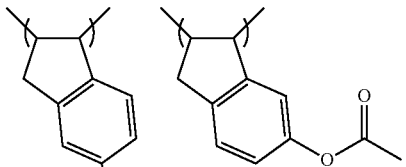

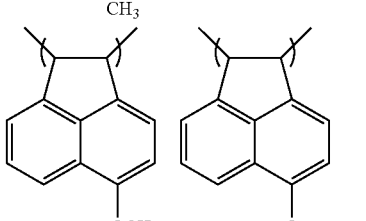

As the repeating unit having an acid-decomposable group, one kind may be used alone, or two or more kinds may be used in combination.

The content of the repeating unit having an acid-decomposable group in the resin (A) (in a case where the resin (A) includes a plurality of repeating units having an acid-decomposable group, the total content thereof) is preferably 5 mol % or higher and 80 mol % or lower, more preferably 5 mol % or higher and 75 mol % or lower, and still more preferably 10 mol % or higher and 65 mol % or lower with respect to all the repeating units of the resin (A).

The resin (A) may include a repeating unit represented by the following Formula (V) or the following Formula (VI).

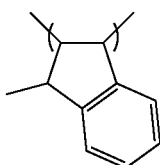

(V)

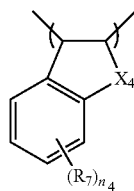

(VI)

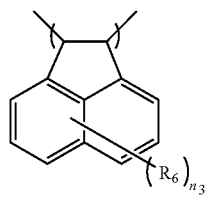

In the formulae, $R_6$ and $R_7$ each independently represent a hydrogen atom, a hydroxy group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X_4$ represents a methylene group, an oxygen atom, or a sulfur atom.

Hereinafter, specific examples of the repeating unit represented by Formula (V) or Formula (VI) will be shown, but the present invention is not limited thereto.

The resin (A) may further include a repeating unit having a silicon atom at a side chain. Examples of the repeating unit having a silicon atom at a side chain include a (meth)acrylate repeating unit having a silicon atom and a vinyl repeating unit having a silicon atom. The repeating unit having a silicon atom at a side chain is typically a repeating unit which has a group having a silicon atom at a side chain, and examples of the group having a silicon atom include a trimethylsilyl group, a triethylsilyl group, a triphenylsilyl group, a tricyclohexylsilyl group, a tristrimethylsilylsiloxysilyl group, a tristrimethylsilylsilyl group, a methylbistrimethylsilylsilyl group, a methylbistrimethylsilloxysilyl group, a dimethyltrimethylsilylsilyl group, a dimethyltrimethylsilloxysilyl group, a cyclic or linear polysiloxane described below, and a basket-type, ladder-type, or random-type silsesquioxane structure described below. In the formulae, R and R1 each independently represent a monovalent substituent. *represents a direct bond.

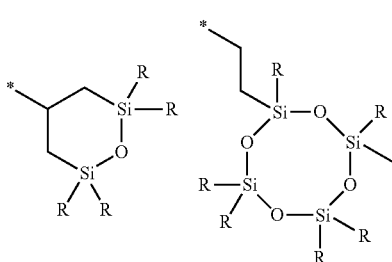

-continued

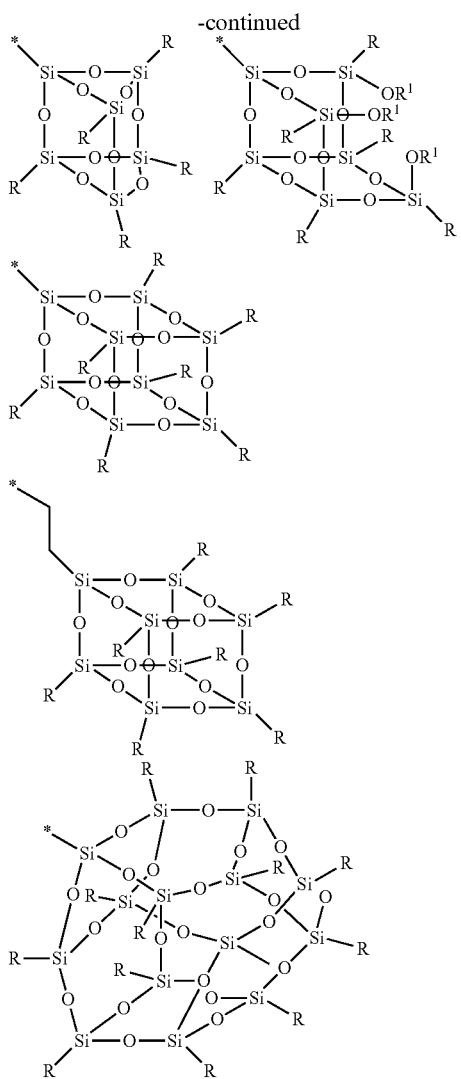

Preferable examples of the repeating unit having the above-described group include a repeating unit derived from an acrylate or methacrylate compound having the above-described group, and a repeating unit derived from a compound having the above-described group and a vinyl group.

It is preferable that the repeating unit having a silicon atom is a repeating unit having a silsesquioxane structure. As a result, excellent collapse performance can be exhibited during the formation of an ultrafine pattern (for example, line width: 50 nm or less) in which a cross-sectional shape has a high aspect ratio (for example, a thickness/line width is 3 or more).

Examples of the silsesquioxane structure include a basket-type silsesquioxane structure, a ladder-type silsesquioxane structure, and a random-type silsesquioxane structure. Among these, a basket-type silsesquioxane structure is preferable.

Here, the basket-type silsesquioxane structure refers to a silsesquioxane structure having a basket-shaped skeleton. The basket-type silsesquioxane structure may be a complete basket-type silsesquioxane structure or an incomplete basket-type silsesquioxane structure and is preferably a complete basket-type silsesquioxane structure.

In addition, the ladder-type silsesquioxane structure refers to a silsesquioxane structure having a ladder-shaped skeleton.

In addition, the random-type silsesquioxane structure refers to a silsesquioxane structure having a random skeleton.

It is preferable that the basket-type silsesquioxane structure is a siloxane structure represented by the following Formula (S).

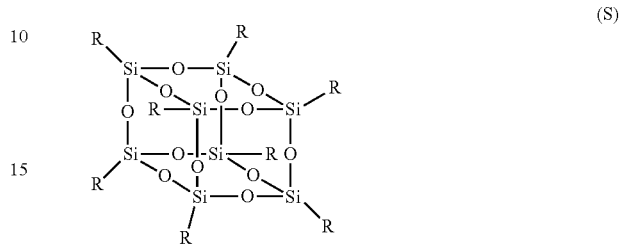

In Formula (S), R represents a monovalent organic group. A plurality of R's may be the same as or different from each other.

The organic group is not particularly limited, and specific examples thereof include a hydroxy group, a nitro group, a carboxy group, an alkoxy group, an amino group, a mercapto group, a blocked mercapto group (for example, a mercapto group blocked (protected) with an acyl group), an acyl group, an imido group, a phosphino group, a phosphinyl group, a silyl group, a vinyl group, a hydrocarbon group which may have a heteroatom, a (meth)acryl group-containing group, and an epoxy group-containing group.

Examples of the heteroatom of the hydrocarbon group which may have a heteroatom include an oxygen atom, a nitrogen atom, a sulfur atom, and a phosphorus atom.

Examples of the hydrocarbon group of the hydrocarbon group which may have a heteroatom include an aliphatic hydrocarbon group, an aromatic hydrocarbon group, and a group including a combination thereof.

The aliphatic hydrocarbon group may be linear, branched, or cyclic. Specific examples of the aliphatic hydrocarbon group include a linear or branched alkyl group (particularly having 1 to 30 carbon atoms), a linear or branched alkenyl group (particularly having 2 to 30 carbon atoms), and a linear or branched alkynyl group (particularly, having 2 to 30 carbon atoms).

Examples of the aromatic hydrocarbon group include an aromatic hydrocarbon group having 6 to 18 carbon atoms such as a phenyl group, a tolyl group, a xylyl group, or a naphthyl group.

In a case where the resin (A) includes the repeating unit which has silicon atom at a side chain, the content thereof is preferably 1 to 30 mol %, more preferably 5 to 25 mol %, and still more preferably 5 to 20 mol % with respect to all the repeating units of the resin (A).

(B) Compound (Photoacid Generator) which generates Acid by Actinic Ray or Radiation It is preferable that the actinic ray-sensitive or radiation-sensitive resin composition includes a compound (hereinafter, also referred to as "photoacid generator (PAG)") which generates an acid by an actinic ray or radiation.

The photoacid generator may be a low molecular weight compound or may be incorporated into a part of a polymer. In addition, the photoacid generator may be a low molecular weight compound which is incorporated into a part of polymer.

In a case where the photoacid generator is a low molecular weight compound, the molecular weight is preferably 3000 or lower, more preferably 2000 or lower, and still more preferably 1000 or lower.

In a case where the photoacid generator is incorporated into a part of a polymer, the photoacid generator may be incorporated into a part of the resin (A) or another resin different from the resin (A).

In the present invention, it is preferable that the photoacid generator is a low molecular weight compound.

The photoacid generator is not particularly limited as long as it is well-known. As the photoacid generator, a compound, which generates an organic acid, for example, at least one of sulfonic acid, bis(alkylsulfonyl)imide, or tris(alkylsulfonyl) methide when irradiated with an actinic ray or radiation and preferably an electron beam or an extreme ultraviolet ray, is preferable.

A compound represented by the following Formula (ZI), (ZII) or (ZIII) is more preferable.

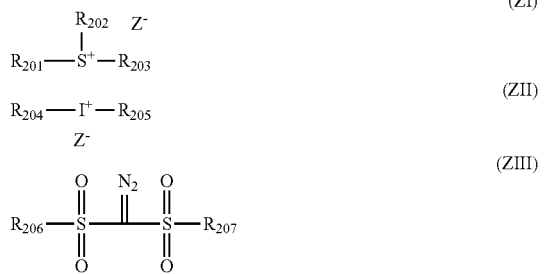

In Formula (ZI), $R_{201}$, $R_{202}$, and $R_{203}$ each independently represent an organic group.

The number of carbon atoms in the organic group represented by $R_{201}$, $R_{202}$, and $R_{203}$ is generally 1 to 30 and preferably 1 to 20.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group which is formed by two of $R_{201}$ to $R_{203}$ being bonded to each other include an alkylene group (for example, a butylene group or a pentylene group).

$Z^-$ represents a non-nucleophilic anion (an anion having a significantly low ability to cause a nucleophilic reaction to occur).

Examples of the non-nucleophilic anion include a sulfonate anion (for example, an aliphatic sulfonate anion, an aromatic sulfonate anion, or a camphor sulfonate anion), a carboxylate anion (for example, an aliphatic carboxylate anion, an aromatic carboxylate anion, or an aralkyl carboxylate anion), a sulfonyl imide anion, a bis(alkylsulfonyl)imide anion, and a tris(alkylsulfonyl)methide anion.

An aliphatic site in the aliphatic sulfonate anion and the aliphatic carboxylate anion may be an alkyl group or a cycloalkyl group and is preferably a linear or branched alkyl group having 1 to 30 carbon atoms or a cycloalkyl group having 3 to 30 carbon atoms.

As the aromatic group in the aromatic sulfonate anion and the aromatic carboxylate anion, an aryl group having 6 to 14 carbon atoms is preferable, and examples thereof include a phenyl group, a tolyl group, and naphthyl group.

The alkyl group, the cycloalkyl group, and the aryl group described above may have a substituent. Specific examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

Examples of an aryl group and a ring structure included in each of the groups include an alkyl group (preferably having 1 to 15 carbon atoms) as a substituent.

As the aralkyl group in the aralkyl carboxylate anion, an aralkyl group having 7 to 12 carbon atoms is preferable, and examples thereof include a benzyl group, a phenethyl group, a naphthylmethyl group, a naphthylethyl group, and a naphthylbutyl group.

Examples of the sulfonyl imide anion include a saccharin anion.

As the alkyl group in the bis(alkylsulfonyl)imide anion and the tris(alkylsulfonyl)methide anion, an alkyl group having 1 to 5 carbon atoms is preferable. Examples of a substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group. Among these, a fluorine atom or an alkyl group substituted with a fluorine atom is preferable.

In addition, the alkyl groups in the bis(alkylsulfonyl) imide anions may be bonded to each other to form a ring structure. As a result, the acid strength increases.

Other examples of the non-nucleophilic anion include phosphorus fluoride (for example, $PF_6^-$), boron fluoride (for example, $BF_4^-$), and antimony fluoride (for example, $SbF_6^-$).

As the non-nucleophilic anion, an aliphatic sulfonate anion in which at least the α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom is preferable. As the non-nucleophilic anion, a perfluoroaliphatic sulfonate anion (still more preferably having 4 to 8 carbon atoms) or a benzenesulfonate anion having a fluorine atom is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

From the viewpoint of the acid strength, it is preferable that the pKa of the acid generated is −1 or lower to improve sensitivity.

In addition, as the non-nucleophilic anion, for example, an anion represented by the following Formula (AN1) is preferable.

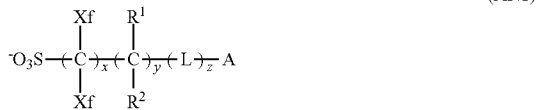

In the formula,

Xf's each independently represent a fluorine atom or an alkyl group substituted with at least one fluorine atom.

$R^1$ and $R^2$ each independently represent a hydrogen atom, a fluorine atom, or an alkyl group. In a case where a plurality of $R^1$'s and a plurality of $R^2$'s are present, $R^1$'s and $R^2$'s may be the same as or different from each other.

L represents a divalent linking group. In a case where a plurality of L's are present, L's may be the same as or different from each other.

A represents a cyclic organic group.

x represents an integer of 1 to 20, y represent an integer of 0 to 10, and z represents an integer of 0 to 10.

Formula (AN1) will be described in more detail.

As the alkyl group in the alkyl group substituted with a fluorine atom represented by Xf, an alkyl group having 1 to 10 carbon atoms is preferable, and an alkyl group having 1 to 4 carbon atoms is more preferable. In addition, as the alkyl group in the alkyl group substituted with a fluorine atom represented by Xf, a perfluoroalkyl group is preferable.

Xf represents preferably a fluorine atom or a perfluoroalkyl group having or 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom or $CF_3$ is preferable.

In particular, it is preferable that both Xf's represent a fluorine atom.

The alkyl group represented by $R^1$ and $R^2$ may have a substituent (preferably a fluorine atom), and an alkyl group having 1 to 4 carbon atoms is preferable. A perfluoroalkyl group having 1 to 4 carbon atoms is more preferable. Specific examples of the alkyl group having a substituent represented by $R^1$ and $R^2$ include $CF_3$, $C_2F_5$, $C_3F_7$, $C_4F_9$, $C_5F_{11}$, $C_6F_{13}$, $C_7F_{13}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

$R^1$ and $R^2$ represent preferably a fluorine atom or $CF_3$.

x represents preferably 1 to 10 and more preferably 1 to 5.

y represents preferably 0 to 4 and more preferably 0.

z represents preferably 0 to 5 and more preferably 0 to 3.

The divalent linking group represented by L is not particularly limited, and examples thereof include —COO—, —OCO—, —CO—, —O—, —S—, —SO—, —SO$_2$—, an alkylene group, a cycloalkylene group, an alkenylene group, a linking group obtained by linking two or more kinds among the above-described groups linking to each other. A linking group having 12 or less carbon atoms in total is preferable. Among these, —COO—, —OCO—, —CO—, or —O— is preferable, and —COO— or —OCO— is more preferable.

In Formula (AN1), as a combination of partial structures other than A, for example, $SO^{3-}$—$CF_2$—$CH_2$—OCO—, $SO^{3-}$—$CF_2$—$CH_2$—CHF—OCO—, $SO^{3-}$—$CF_2$—COO—, $SO^{3-}$—$CF_2$—$CF_2$—$CH_2$—, or $SO^{3-}$—$CF_2$—CH($CF_3$)—OCO— is preferable.

The cyclic organic group represented by A is not particularly limited as long as it has a cyclic structure, and examples thereof include an alicyclic group, an aryl group, a heterocyclic group (including not only an aromatic heterocyclic group but also a nonaromatic heterocyclic group).

The alicyclic group may be monocyclic or polycyclic, and a monocycloalkyl group such as a cyclopentyl group, a cyclohexyl group, or an cyclooctyl group, or a polycycloalkyl group such as a norbornyl group, a tricyclodecanyl group, a tetracyclodecanyl group, a tetracyclododecanyl group, or an adamantyl group is preferable. Among these, an alicyclic group having a bulky structure which has 7 or more carbon atoms such as a norbornyl group, a tricyclodecanyl group, a tetracyclodecanyl group, a tetracyclododecanyl group, or an adamantyl group is preferable from the viewpoints of suppressing in-film diffusion in a heating step after exposure and improving a mask error enhancement factor (MEEF).

Examples of the aryl group include a benzene ring, a naphthalene ring, a phenanthrene ring, and an anthracene ring.

Examples of the heterocyclic group include a furan ring, a thiophene ring, a benzofuran ring, a benzothiophene ring, a dibenzofuran ring, a dibenzothiophene ring, and a group derived from a pyridine ring. Among these, a furan ring, a thiophene ring, or a group derived from a pyridine ring is preferable.

In addition, as the cyclic organic group, a lactone structure can be used, and specific examples thereof include lactone structures represented by the following Formulae (LC1-1) to (LC1-17).

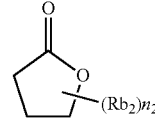

LC1-1

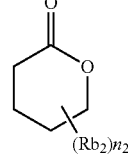

LC1-2

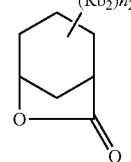

LC1-3

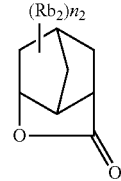

LC1-4

LC1-5 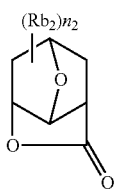

LC1-6 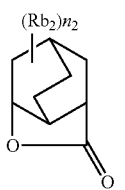

LC1-7 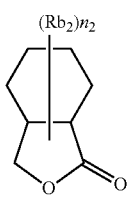

LC1-8 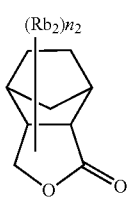

LC1-9 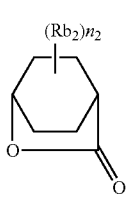

LC1-10 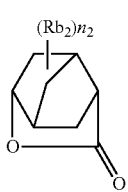

LC1-11 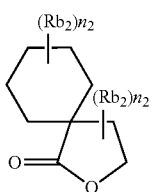

LC1-12 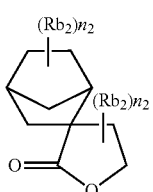

LC1-13 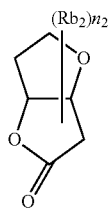

LC1-14 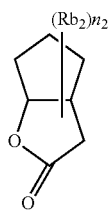

LC1-15 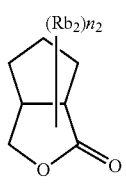

LC1-16 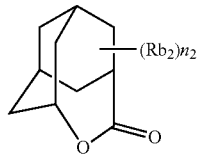

LC1-17 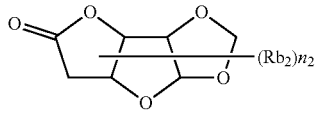

The cyclic organic group may have a substituent, and examples of the substituent include an alkyl group (a linear, branched, or cyclic alkyl group; preferably having 1 to 12 carbon atoms), a cycloalkyl group (a monocycle, a polycycle, or a Spiro ring; preferably having 3 to 20 carbon atoms), an aryl group (preferably having 6 to 14 carbon atoms), a hydroxy group, an alkoxy group, an ester group, an amido group, a urethane group, an ureido group, a thioether group, a sulfonamide group, and a sulfonate group. Carbon (carbon contributing to ring formation) constituting the cyclic organic group may be carbonyl carbon.

The substituent corresponds to Rb2 in (LC1-1) to (LC1-17). In addition, in (LC1-1) to (LC1-17), n2 represents an integer of 0 to 4. In a case where n2 represents 2 or more, a plurality of $Rb_2$'s may be the same as or different from each other or may be bonded to each other to form a ring.

Examples of the organic group represented by $R_{201}$, $R_{202}$, and $R_{203}$ in Formula (ZI) include an aryl group, an alkyl group, and a cycloalkyl group.

It is preferable that at least one of $R_{201}$, $R_{202}$, or $R_{203}$ represents an aryl group, and it is more preferable that all of $R_{201}$, $R_{202}$, or $R_{203}$ represent an aryl group. As the aryl group, not only a phenyl group or a naphthyl group but also a heteroaryl group such as an indole residue or a pyrrole residue may be used. As the alkyl group and the cycloalkyl group represented by $R_{201}$ to $R_{203}$, a linear or branched alkyl group having 1 to 10 carbon atoms or a cycloalkyl group having 3 to 10 carbon atoms is preferable. As the alkyl group, a methyl group, an ethyl group, a n-propyl group, an i-propyl group, or a n-butyl group is more preferable. As the cycloalkyl group, a cyclopropyl group, a cyclobutyl group, a cyclopentyl group, a cyclohexyl group, or a cycloheptyl group is more preferable. Each of the groups may further have a substituent. Examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms), but the present invention is not limited thereto.

Next, Formulae (ZII) and (ZIII) will be described.

In Formulae (ZII) and (ZIII), $R_{204}$ to $R_{207}$ each independently represent an aryl group, an alkyl group, or a cycloalkyl group.

As the aryl group represented by $R_{204}$ to $R_{207}$, a phenyl group or a naphthyl group is preferable, and a phenyl group is more preferable. The aryl group represented by $R_{204}$ to $R_{207}$, may be an aryl group which has a heterocyclic structure having an oxygen atom, a nitrogen atom, or a sulfur atom. Examples of a skeleton of the aryl group having a heterocyclic structure include pyrrole, furan, thiophene, indole, benzofuran, and benzothiophene.

Preferable examples of the alkyl group and the cycloalkyl group represented by $R_{204}$ to $R_{207}$ include a linear or branched alkyl group having 1 to 10 carbon atoms (for example, a methyl group, an ethyl group, a propyl group, a butyl group or a pentyl group), and a cycloalkyl group having 3 to 10 carbon atoms (a cyclopentyl group, a cyclohexyl group, or a norbornyl group).

The aryl group, the alkyl group, and the cycloalkyl group represented by $R_{204}$ to $R_{207}$ may have a substituent. Examples of the substituent which may be included in the aryl group, the alkyl group, and the cycloalkyl group represented by $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

In addition, $Z^-$ in Formula (ZII) represents a non-nucleophilic anion. Specifically, $Z^-$ in Formula (ZII) has the same definition and the same preferable aspect as $Z^-$ in Formula (ZI).

Hereinafter, specific examples of Formulae (ZI) to (ZIII) will be shown below, but the present invention is not limited thereto.

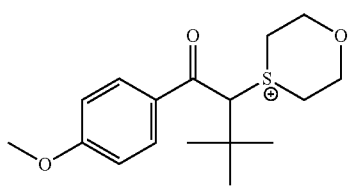

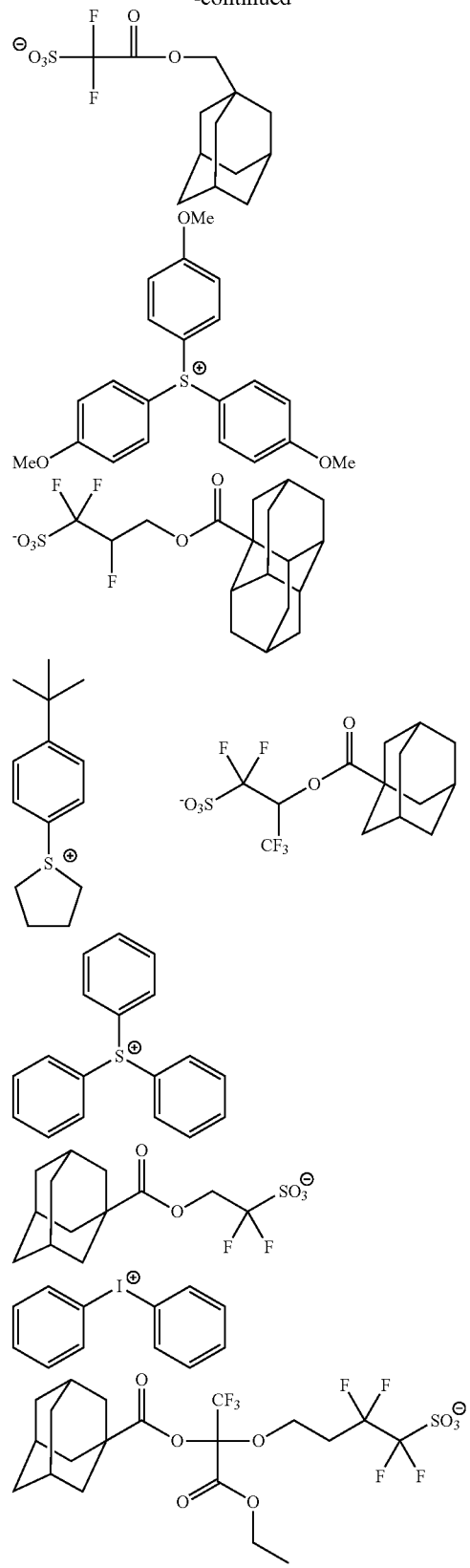

In the present invention, from the viewpoint of suppressing diffusion of an acid generated by exposure to a non-exposed portion and improving resolution, the photoacid generator is preferably a compound which generates an acid (more preferably sulfonic acid) having a volume of 130 Å³ or higher when irradiated with an electron beam or an extreme ultraviolet ray, more preferably a compound which generates an acid (more preferably sulfonic acid) having a volume of 190 Å³ or higher, still more preferably a compound which generates an acid (more preferably sulfonic acid) having a volume of 270 Å³ or higher, and even still more preferably a compound which generates an acid (more preferably sulfonic acid) having a volume of 400 Å³ or higher. From the viewpoints of sensitivity and coating solvent solubility, the volume is preferably 2000 Å³ or lower and more preferably 1500 Å³ or lower. A value of the volume is obtained using "WinMOPAC" (manufactured by FUJITSU). That is, a chemical structure of an acid according to each example is input. Next, the most stable conformation of each acid is determined through a molecular field calculation using a MM3 method with the input chemical structure as an initial structure. Next, a molecular orbital calculation is performed on the most stable conformation using a PM3 method. As a result, "accessible volume" of each acid can be calculated.

In the present invention, the following examples of the photoacid generators which generate an acid when irradiated with an actinic ray or radiation are preferable. In some of the examples, a calculated value of the volume is added (unit: Å³). The calculated value herein denotes a value of an acid in which a proton is bonded to the anion portion.

585Å³

525Å³

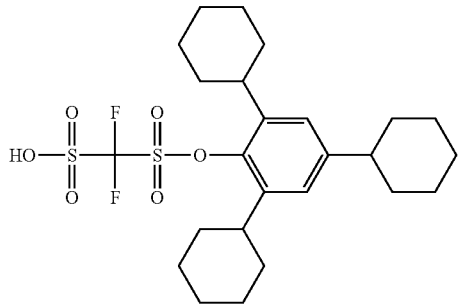

554Å³

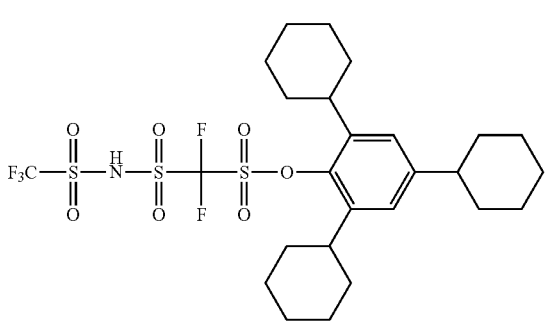

303Å³

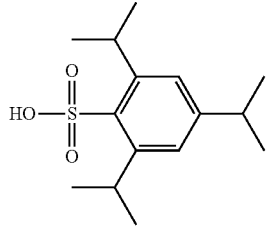

437Å³

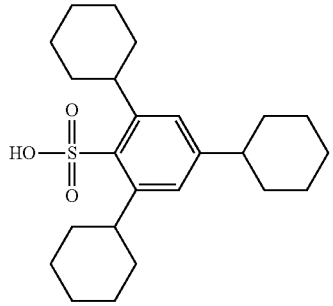

244Å³

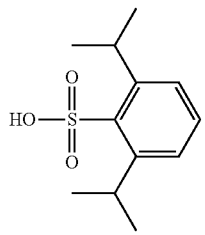

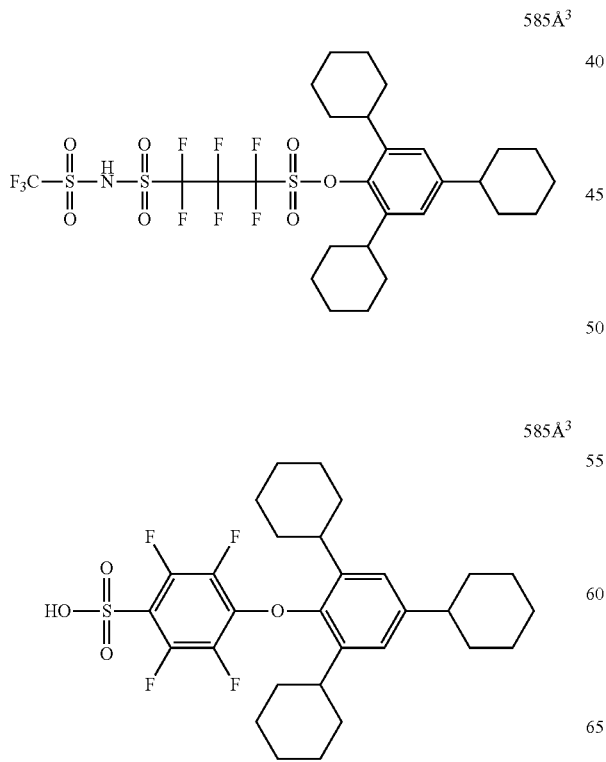

585Å³

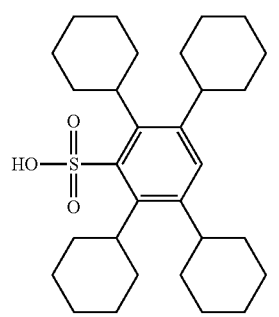
529Å³
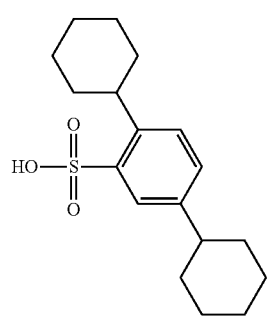
336Å³
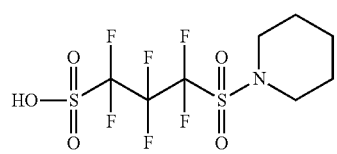
244Å³
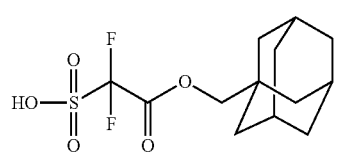
271Å3
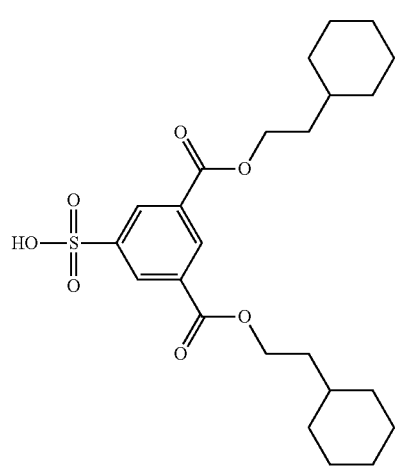
457Å³
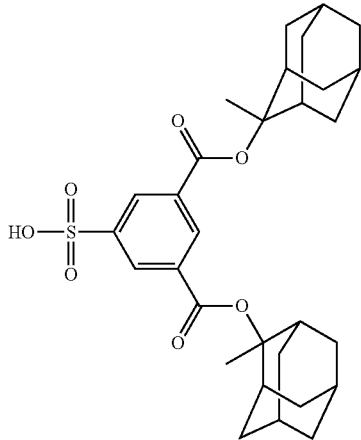
511Å³
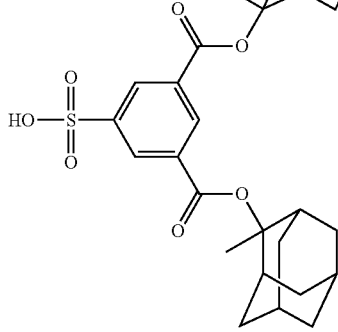
311Å³
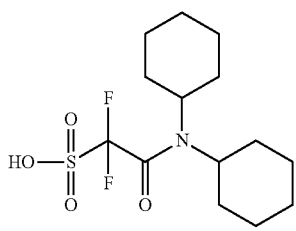
280Å³
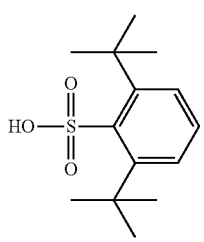
266Å³
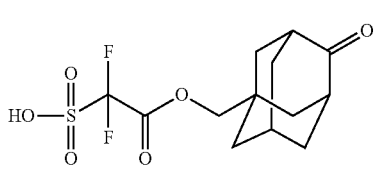
339Å³
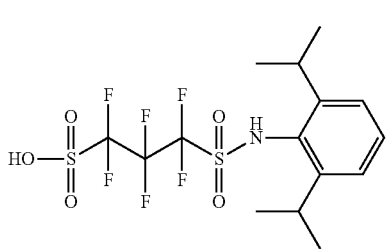

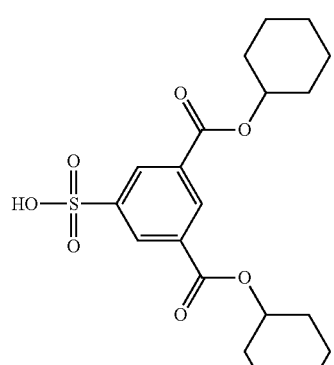
380Å³
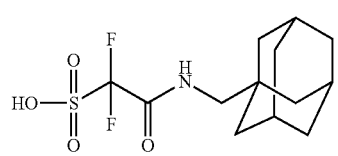
277Å³
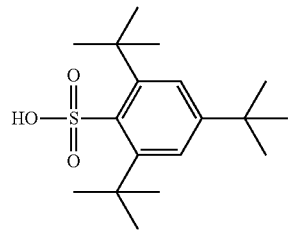
357Å³
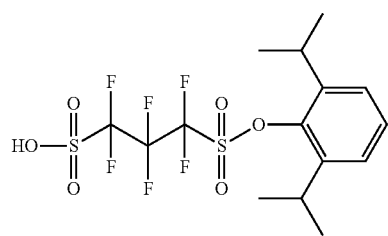
347Å³
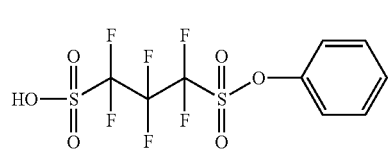
380Å³
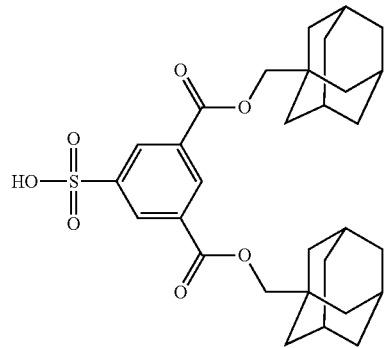
519Å³
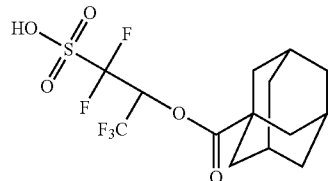
291Å³
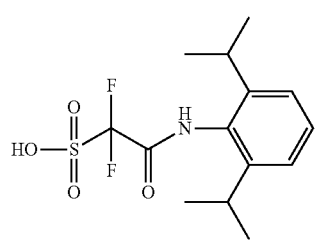
297Å³
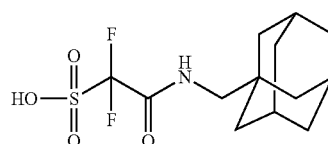
277Å³
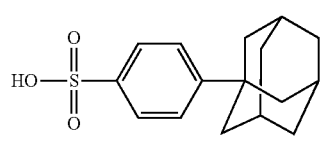
281Å³
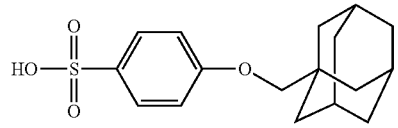
310Å³
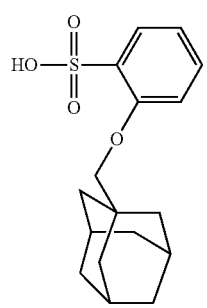
309Å³
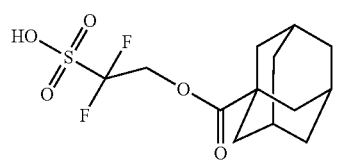
270Å³
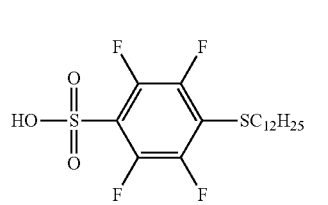
393Å³

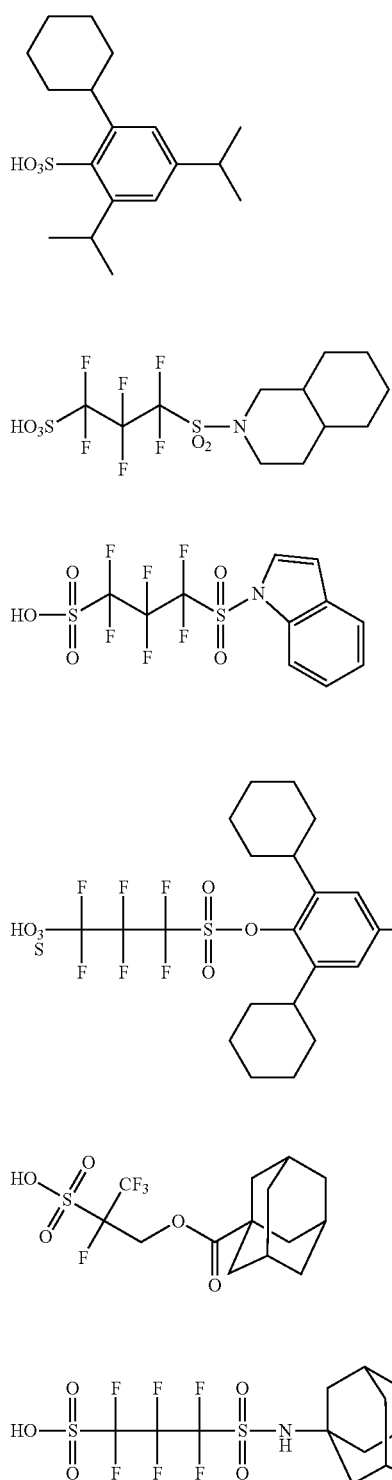
The details of the photoacid generator can be found in paragraphs "0368" to "0377" of JP2014-41328A and paragraphs "0240" to "0262" of JP2013-228681A (corresponding to paragraph "0339" of US2015/004533A), the content of which is incorporated herein by reference. In addition, specific preferable examples include the following compounds, but the present invention is not limited thereto.

-continued
(z4)
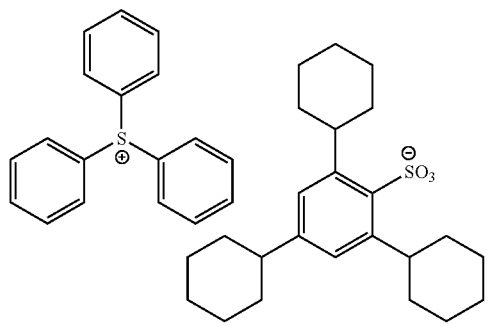
(z5)
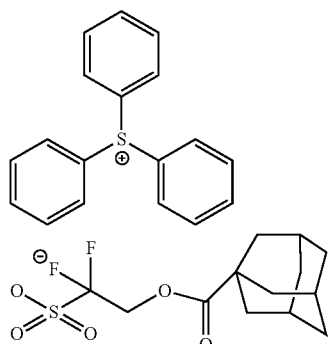
(z6)
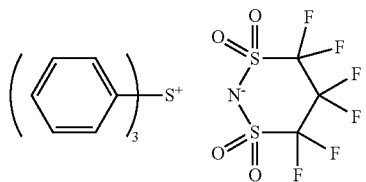
(z7)
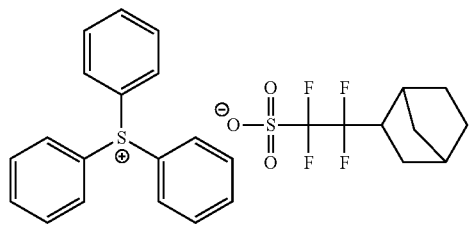
(z8)
(z9)
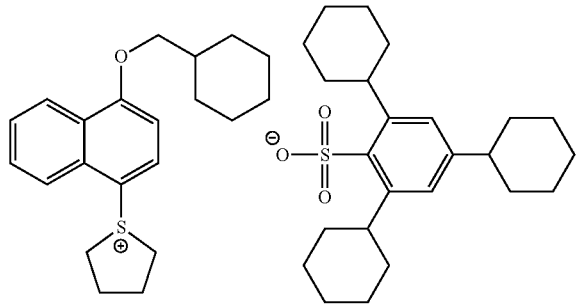
-continued
(z10)
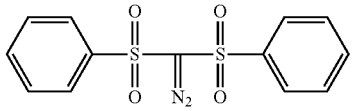
(z11)
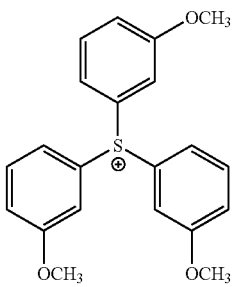
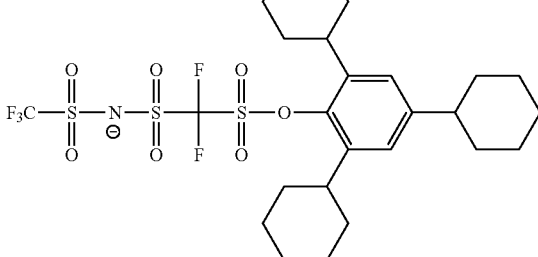
(z12)
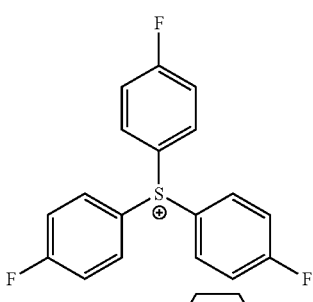
(z13)
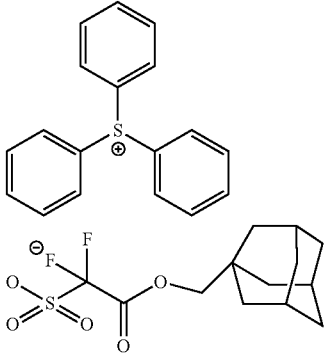

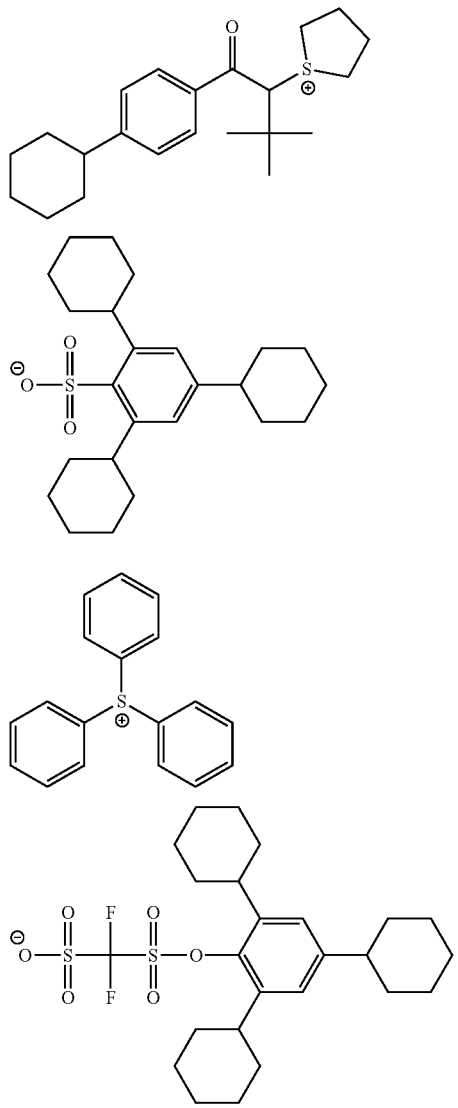
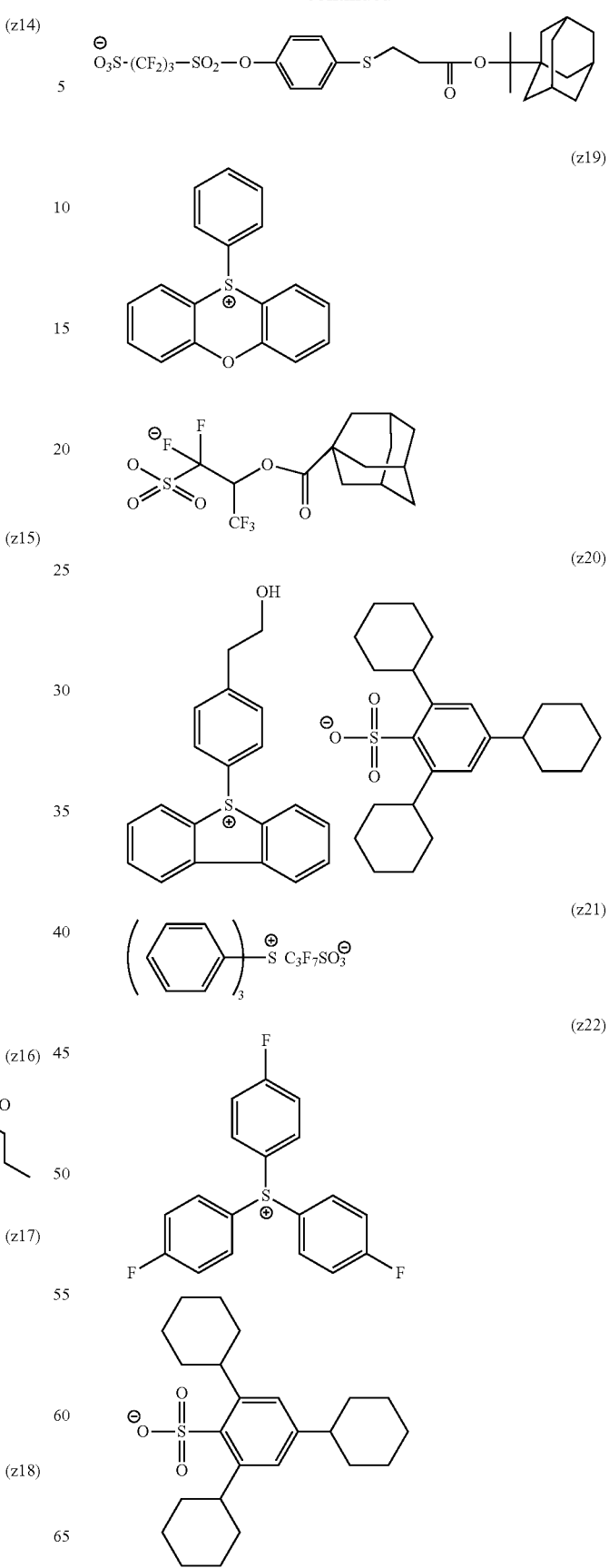

(z23)
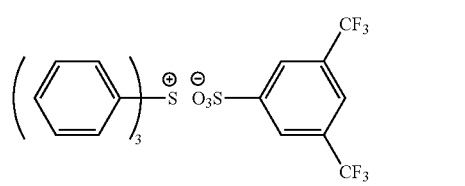
(z24)
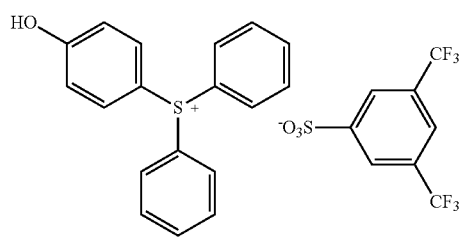
(z25)
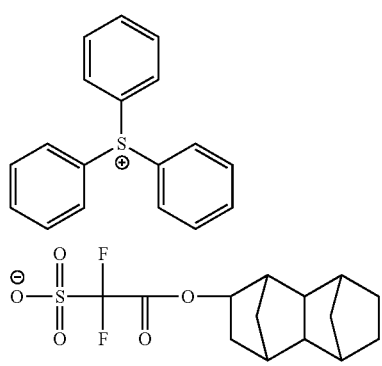
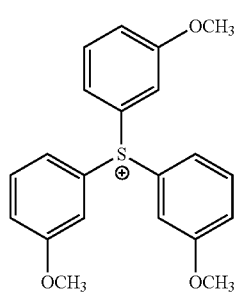
(z26)
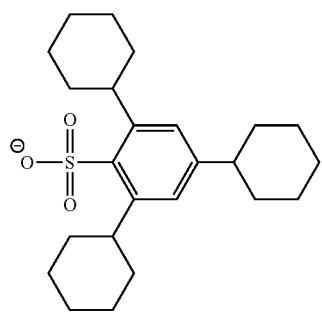
(z27)
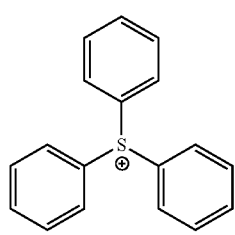
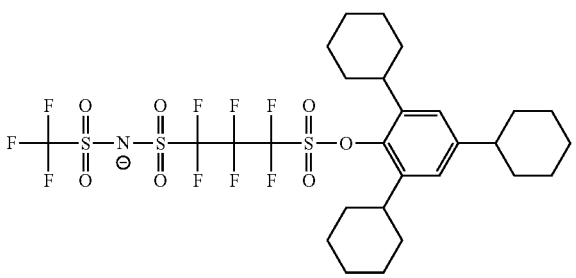
(z28)
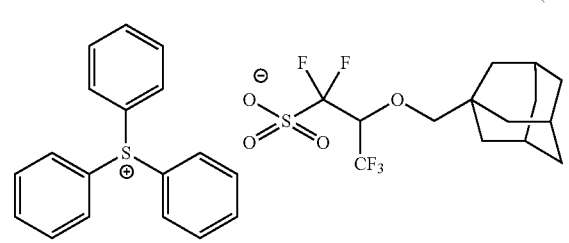
(z29)
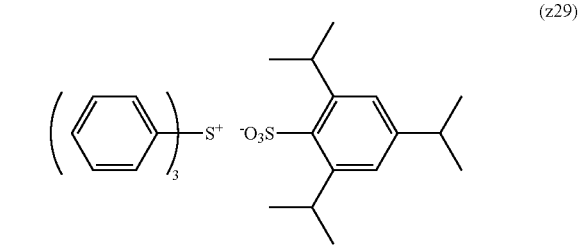
(z30)
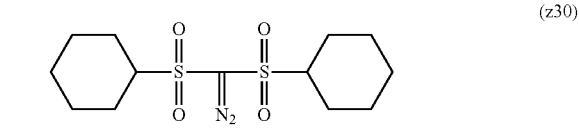
B-1
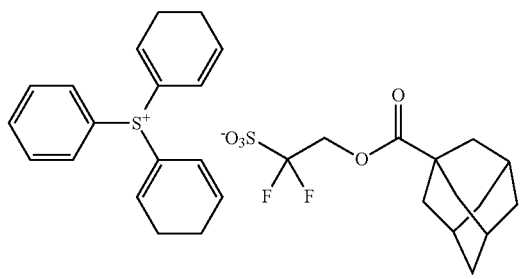
B-2
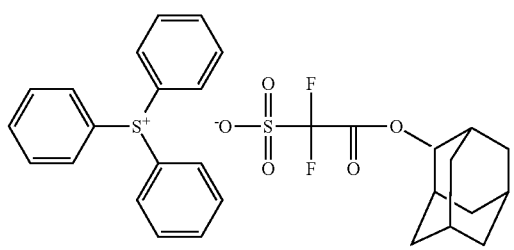

B-3
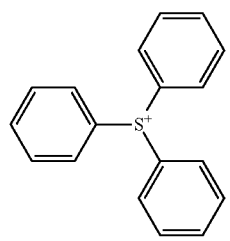
B-7
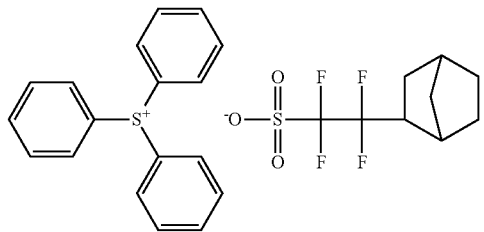
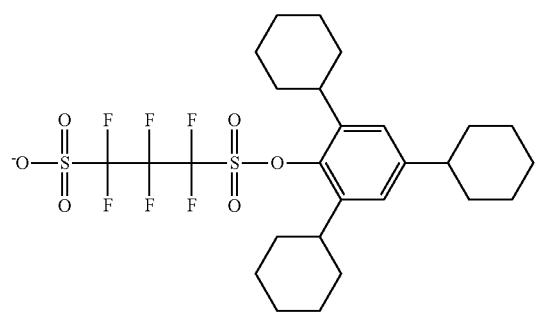
B-8
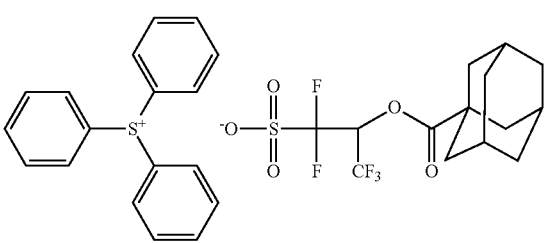
B-4
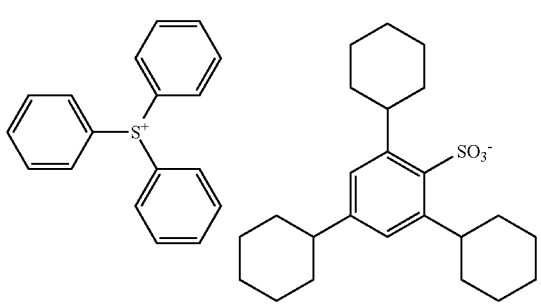
B-9
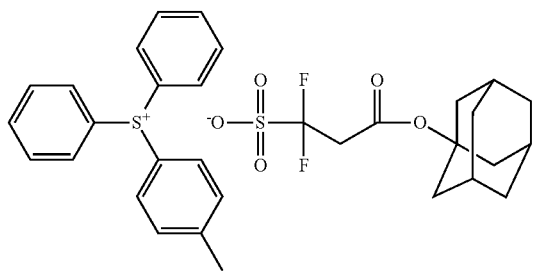
B-5
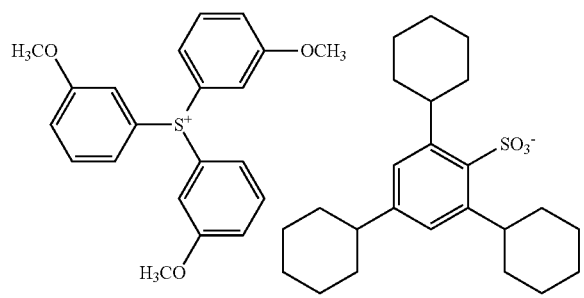
B-10
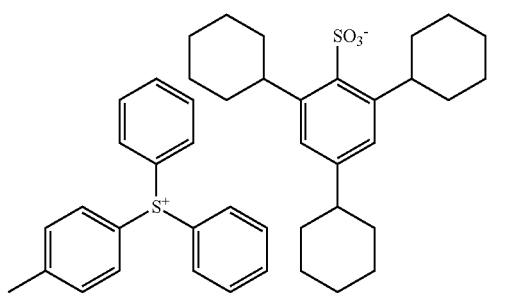
B-6
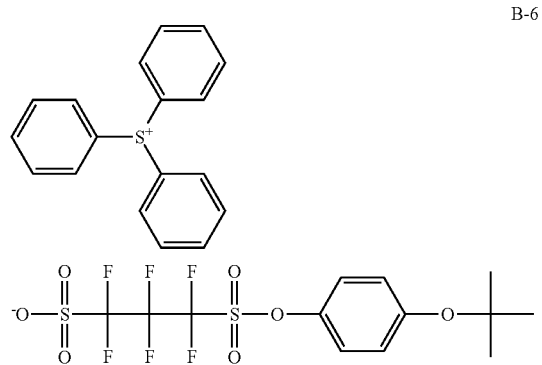
B-11
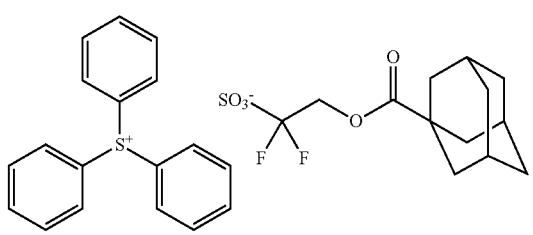
B-12
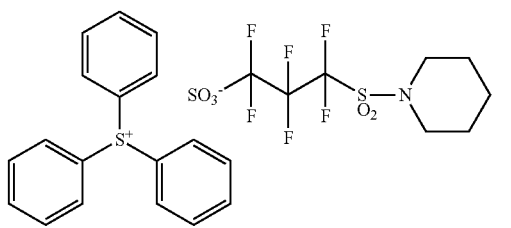

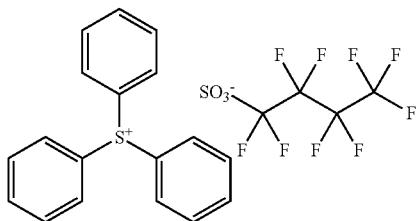

B-13

As the photoacid generator, one kind may be used alone, or two or more kinds may be used in combination.

The content of the photoacid generator in the actinic ray-sensitive or radiation-sensitive resin composition is preferably 0.1 to 50 mass %, more preferably 5 to 50 mass %, and still more preferably 8 to 40 mass % with respect to the total solid content of the composition. In particular, in order to simultaneously realize high sensitivity and high resolution during irradiation of an electron beam or an extreme ultraviolet ray, the content of the photoacid generator is preferably high, more preferably 10 to 40 mass %, and still more preferably 10 to 35 mass %.

(C) Solvent

In order to dissolve the respective components to prepare the actinic ray-sensitive or radiation-sensitive resin composition, a solvent can be used. Examples of the solvent used include an organic solvent such as alkylene glycol monoalkyl ether carboxylate, alkylene glycol monoalkyl ether, alkyl lactate, alkyl alkoxy propionate, cyclic lactone having 4 to 10 carbon atoms, a monoketone compound having 4 to 10 carbon atoms which may include a ring, alkylene carbonate, alkyl alkoxy acetate, or alkyl pyruvate.

Preferable examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferable examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferable examples of the alkyl lactate include methyl lactate, ethyl lactate, propyl lactate, and butyl lactate.

Preferable examples of the alkyl alkoxy propionate include ethyl 3-ethoxypropionate, methyl 3-methoxypropionate, methyl 3-ethoxypropionate, and ethyl 3-methoxypropionate.

Preferable examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferable examples of the monoketone compound having 4 to 10 carbon atoms which may include a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferable examples of the alkylene carbonate include propylene carbonate, vinylene carbonate, ethylene carbonate, and butylene carbonate.

Preferable examples of the alkyl alkoxy acetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferable examples of the alkyl pyruvate include methyl pyruvate, ethyl pyruvate, and propyl pyruvate.

Preferable examples of the solvent which can be used include a solvent having a boiling point of 130° C. or higher at a normal temperature under a normal pressure. Specific examples of the solvent include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

In the present invention, as the solvent, one kind may be used alone, or two or more kinds may be used in combination.

In the present invention, as the organic solvent, a mixed solvent in which a solvent having a hydroxyl group in a structure is mixed with a solvent having no hydroxyl group may be used.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Among these, propylene glycol monomethyl ether or ethyl lactate is preferable.

Examples of the solvent having no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Among these, propylene glycol monomethyl ether acetate, ethyl ethoxypropionate, 2-heptanone, γ-butyrolactone, cyclohexanone, or butyl acetate is more preferable, and propylene glycol monomethyl ether acetate, ethyl ethoxypropionate, 2-heptanone is most preferable.

A mixing ratio (mass) of the solvent having a hydroxyl group to the solvent having no hydroxyl group is preferably 1/99 to 99/1, more preferably 10/90 to 90/10, and still more preferably 20/80 to 60/40 by mass. In particular, a mixed solvent including 50 mass % or higher of the solvent having no hydroxyl group is preferable from the viewpoint of coating uniformity.

It is preferable that the solvent is a mixed solvent including two or more propylene glycol monomethyl ether acetates.

As the solvent, for example, a solvent described in paragraphs "0013" to "0029" of JP2014-219664A can also be used.

(D) Basic Compound

In order to reduce a change in performance with the lapse of time from exposure to heating, it is preferable that the actinic ray-sensitive or radiation-sensitive resin composition includes a basic compound (D).

Preferable examples of the basic compound (D) include compounds having structures represented by the following Formulae (A) to (E).

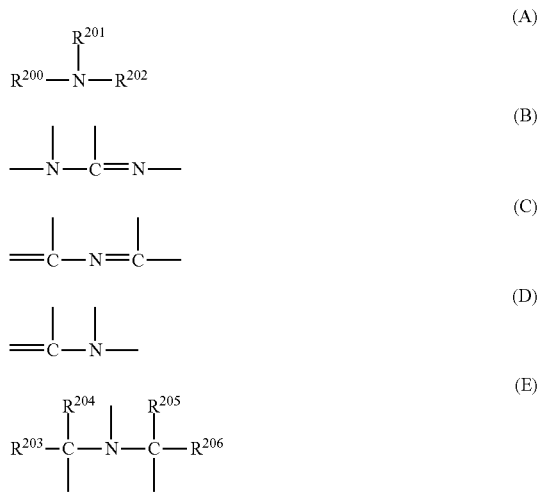

In Formulae (A) and (E), $R^{200}$, $R^{201}$, and $R^{202}$ may be the same as or different from each other and each independently represent a hydrogen atom, an alkyl group (preferably having 1 to 20 carbon atoms), a cycloalkyl group (preferably having 3 to 20 carbon atoms), or an aryl group (preferably having 6 to 20 carbon atoms). Here, $R^{201}$ and $R^{202}$ may be bonded to each other to form a ring.

As the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other and each independently represent an alkyl group having 1 to 20 carbon atoms.

It is more preferable that the alkyl group in the Formulae (A) and (E) is unsubstituted.

Examples of a preferable compound include guanidine, aminopyrrolidine, pyrazole, pyrazoline, piperazine, aminomorpholine, aminoalkylmorpholine, and piperidine. Examples of a more preferable compound include a compound having an imidazole structure, a diazabicyclo structure, an onium hydroxide structure, an onium carboxylate structure, a trialkylamine structure, an aniline structure, or a pyridine structure, an alkylamino derivative having a hydroxyl group and/or an ether bond, and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo [2,2,2]octane, 1,5-diazabicyclo[4,3,0]nonα-5-ene, and 1,8-diazabicyclo[5,4,0]undeca-7-ene. As the compound having an onium hydroxide structure, for example, triarylsulfonium hydroxide, phenacyl sulfonium hydroxide, or sulfonium hydroxide having a 2-oxoalkyl group can be used, and specific examples thereof include triphenylsulfonium hydroxide, tris(t-butylphenyl)sulfonium hydroxide, bis(t-butylphenyl)iodonium hydroxide, phenacyl thiophenium hydroxide, and 2-oxopropylthiophenium hydroxide. As the compound having an onium carboxylate structure, for example, a compound obtained by carboxylation of the anion site of a compound having an omnium hydroxide structure can be used, and examples thereof include acetate, adamantane-1-carboxylate, and perfluoroalkyl carboxylate. Examples of the compound having trialkylamine structure include tri-(n-butyl)amine and tri-(n-octyl)amine. Examples of the compound having an aniline structure include 2,6-diisopropylaniline, N,N-dimethylaniline, N,N-dibutylaniline, and N,N-dihexylaniline. Examples of the alkylamino derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Other preferable examples of the basic compound include an amine compound having a phenoxy group and an ammonium salt compound having a phenoxy group.

As the amine compound, a primary, secondary, or tertiary amine compound can be used, and an amine compound in which at least one alkyl group is bonded to a nitrogen atom is preferable. It is more preferable that the amine compound is a tertiary amine compound. In the amine compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

In addition, it is preferable that the amine compound has an oxygen atom at an alkyl chain to form an oxyalkylene group. The number of oxyalkylene groups is 1 or more, preferably 3 to 9, and still more preferably 4 to 6 in a molecule. Among the oxyalkylene groups, an oxyethylene group ($—CH_2CH_2O—$) or an oxypropylene group ($—CH(CH_3)CH_2O—$ or $—CH_2CH_2CH_2O—$) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. In the ammonium salt compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

In addition, it is preferable that the ammonium salt compound has an oxygen atom at an alkyl chain to form an oxyalkylene group. The number of oxyalkylene groups is 1 or more, preferably 3 to 9, and still more preferably 4 to 6 in a molecule. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

Examples of an anion of the ammonium salt compound include a halogen atom, a sulfonate, a borate, and a phosphate. Among these, a halogen atom or a sulfonate is preferable. As the halogen atom, a chloride, a bromide, or an iodide is preferable. As the sulfonate, an organic sulfonate having 1 to 20 carbon atoms is preferable. Examples of the organic sulfonate include an alkyl sulfonate having 1 to 20 carbon atoms and an aryl sulfonate. The alkyl group of the alkyl sulfonate may have a substituent, and examples of the substituent include fluorine, chlorine, bromine, an alkoxy group, an acyl group, and an aryl group. Specific examples of the alkyl sulfonate include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate. Examples of the aryl group of the aryl sulfonate include a benzene ring, a naphthalene ring, and an anthracene ring. The benzene ring, the naphthalene ring, and the anthracene ring may have a substituent. As the substituent, a linear or branched alkyl group having 1 to 6 carbon atoms or a cycloalkyl group having 3 to 6 carbon atoms is preferable. Specific examples of the linear or branched alkyl group and the cycloalkyl group include methyl, ethyl, n-propyl, isopropyl, n-butyl, i-butyl, t-butyl, n-hexyl, and cyclohexyl. Other examples of the substituent include an alkoxy group having 1 to 6 carbon atoms, a halogen atom, cyano, nitro, an acyl group, and an acyloxy group.

The amine compound having a phenoxy group or the ammonium salt compound having a phenoxy group denotes an amine compound or an ammonium salt compound having a phenoxy group at a terminal of an alkyl group opposite to a nitrogen atom. The phenoxy group may have a substituent. Examples of the substituent of the phenoxy group include an alkyl group, an alkoxy group, a halogen atom, a cyano group, a nitro group, a carboxyl group, a carboxylate group, a sulfonate group, an aryl group, an aralkyl group, an acyloxy group, and an aryloxy group. The substitution position of the substituent may be any one of the 2- to 6-position. The number of substituents is 1 to 5.

It is preferable that at least one oxyalkylene group is present between a phenoxy group and a nitrogen atom. The number of oxyalkylene groups is 1 or more, preferably 3 to 9, and still more preferably 4 to 6 in a molecule. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

The amine compound having a phenoxy group can be obtained by heating a primary or secondary amine having a phenoxy group and haloalkyl ether to react with each other, adding an aqueous solution of a strong base such as sodium hydroxide, potassium hydroxide, or tetraalkylammonium to the obtained reaction product, and performing extraction with an organic solvent such as ethyl acetate or chloroform. Alternatively, the amine compound having a phenoxy group can be obtained by heating a primary or secondary amine and haloalkyl ether having a phenoxy group at a terminal to react with each other, adding an aqueous solution of a strong base such as sodium hydroxide, potassium hydroxide, or tetraalkylammonium to the obtained reaction product, and performing extraction with an organic solvent such as ethyl acetate or chloroform.

(Compound (PA) having Proton-accepting Functional Group which is decomposed to generate Compound in which Proton Accepting Properties deteriorate, disappear, or change to Acidic Properties when irradiated with Actinic Ray or Radiation)

The composition according to the present invention may further include, as a basic compound, a compound [hereinafter, also referred to as "compound (PA)"] having a proton-accepting functional group which is decomposed to generate a compound in which proton accepting properties deteriorate, disappear, or change to acidic properties when irradiated with an actinic ray or radiation.

The proton-accepting functional group denotes a functional group having a group or an electron which can electrostatically interact with a proton, for example, a functional group which has a macrocyclic structure such as cyclic polyether or a functional group which has a nitrogen atom having an unshared electron pair not contributing to π-conjugation. Examples of the nitrogen atom having an unshared electron pair not contributing to π-conjugation include a nitrogen atom having a partial structure represented by the following formula.

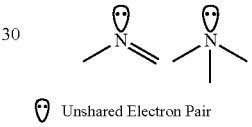

⦵ Unshared Electron Pair

Preferable examples of a partial structure of the proton-accepting functional group include crown ether, azacrown ether, primary to tertiary amine, pyridine, imidazole, and a pyrazine structure.

The compound (PA) is decomposed to generate a compound in which proton accepting properties deteriorate, disappear, or change to acidic properties when irradiated with an actinic ray or radiation. Here, proton accepting properties deteriorating, disappearing, or changing to acidic properties represents a change in proton accepting properties caused by adding a proton to the proton-accepting functional group, and specifically represents that, when a proton adduct is generated using the compound (PA) having a proton-accepting functional group and a proton, an equilibrium constant in the equilibrium constant is reduced.

Specific examples of the compound (PA) include the following compounds. Further, specific examples of the compound (PA) include compounds described in paragraphs "0421" to "0428" of JP2014-41328A and paragraphs "0108" to "0116" of JP2014-134686A, the content of which is incorporated herein by reference.

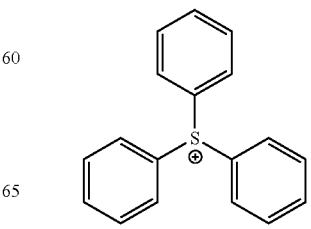

103
-continued
104
-continued
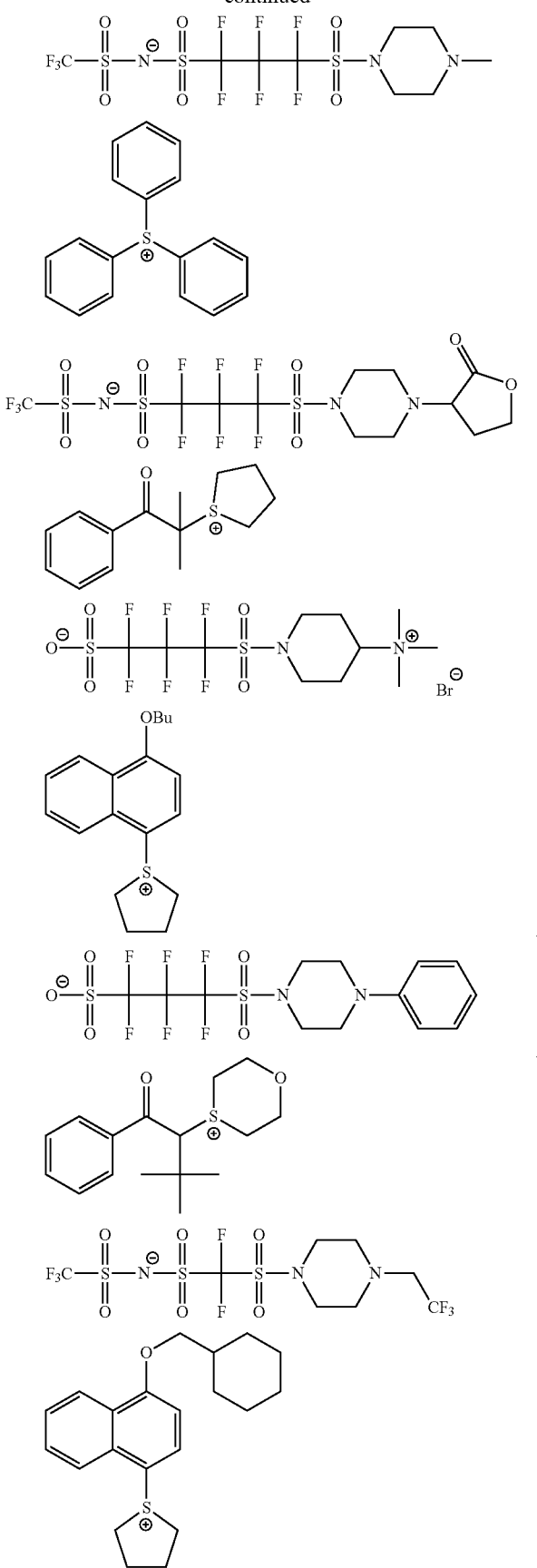
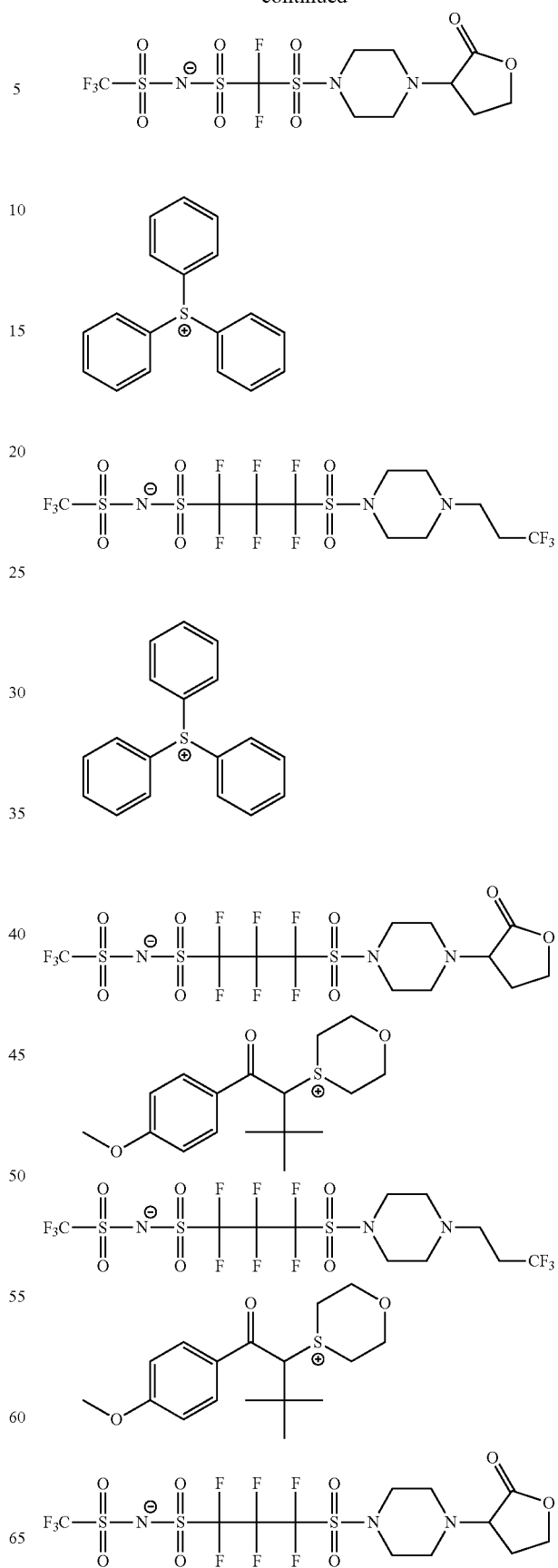

-continued

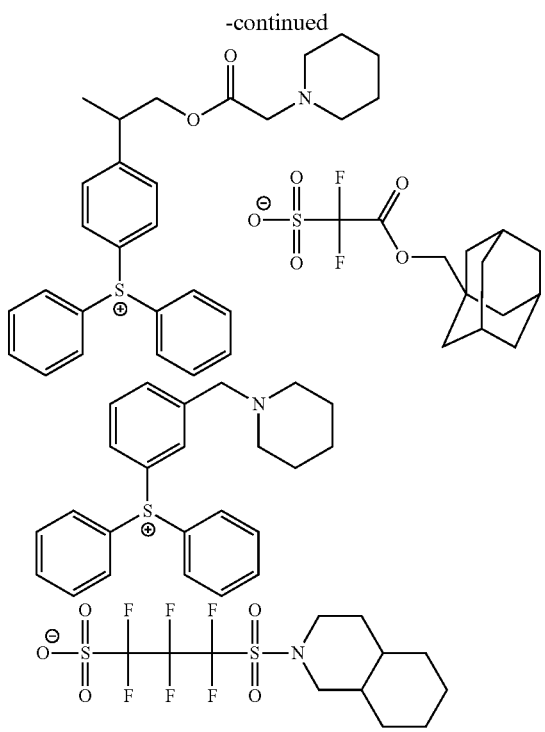

Among the basic compounds, one kind may be used alone, or two or more kinds may be used in combination.

The amount of the basic compound used is typically 0.001 to 10 mass % and preferably 0.01 to 5 mass % with respect to the solid content of the actinic ray-sensitive or radiation-sensitive composition.

It is preferable that a ratio (molar ratio; photoacid generator/basic compound) of the photoacid generator used to the basic compound used in the composition is 2.5 to 300. That is, the molar ratio is preferably 2.5 or higher from the viewpoints of sensitivity and resolution, and is preferably 300 or lower from the viewpoint of suppressing deterioration in resolution caused by thickening of a resist pattern with the lapse of time until a heating treatment after exposure. The molar ratio (photoacid generator/basic compound) is more preferably 5.0 to 200 and still more preferably 7.0 to 150.

As the basic compound, for example, a compound (for example, an amine compound, an amido group-containing compound, a urea compound, or a nitrogen-containing heterocyclic compound) described in paragraphs "0140" to "0144" of JP2013-11833A can be used.

(A') Hydrophobic Resin

The actinic ray-sensitive or radiation-sensitive resin composition may include a hydrophobic resin (A') in addition to the resin (A).

It is preferable that the hydrophobic resin is designed to be localized on a surface of a resist film. Unlike the surfactant, the hydrophobic resin does not necessarily have a hydrophilic group in a molecule and does not necessarily contribute to uniform mixing with a polar/non-polar material.

Examples of an effect obtained by the addition of the hydrophobic resin include an effect of suppressing a static/dynamic contact angle of a resist film surface with respect to water and an effect of suppressing out gas.

From the viewpoint of localization on the film surface layer, the hydrophobic resin includes preferably one or more kinds and more preferably two or more kinds among "a fluorine atom", "a silicon atom", and "a $CH_3$ partial structure included in a side chain of the resin". In addition, it is preferable that the hydrophobic resin includes a hydrocarbon group having 5 or more carbon atoms. These groups may be present at a main chain of the resin or may be substituted with a side chain.

In a case where the hydrophobic resin includes a fluorine atom and/or a silicon atom, the fluorine atom and/or the silicon atom in the hydrophobic resin may be present at a main chain or a side chain of the resin.

In a case where the hydrophobic resin includes a fluorine atom, it is preferable that a partial structure having a fluorine atom is a resin that has an alkyl group having a fluorine atom, a cycloalkyl group having a fluorine atom, or an aryl group having a fluorine atom.

The alkyl group having a fluorine atom (preferably having 1 to 10 carbon atoms and more preferably having 1 to 4 carbon atoms) is a linear or branched alkyl group in which at least one hydrogen atom is substituted with a fluorine atom and may further have a substituent other than a fluorine atom.

The cycloalkyl group having a fluorine atom is a monocyclic or polycyclic cycloalkyl group in which at least one hydrogen atom is substituted with a fluorine atom and may further have a substituent other than a fluorine atom.

Examples of the aryl group having a fluorine atom include an aryl group, such as a phenyl group or a naphthyl group, in which at least one hydrogen atom is substituted with a fluorine atom. The aryl group having a fluorine atom may further have a substituent other than a fluorine atom.

Examples of a repeating unit having a fluorine atom or a silicon atom include a repeating unit described in paragraph "0519" of US2012/0251948A1.

In addition, as described above, it is preferable that the hydrophobic resin includes a $CH_3$ partial structure at a side chain.

Here, examples of the $CH_3$ partial structure included at a side chain of the hydrophobic resin include a $CH_3$ partial structure such as an ethyl group or a propyl group.

On the other hand, a methyl group (for example, an α-methyl group of a repeating unit having a methacrylic acid structure) which is directly bonded to a main chain of the hydrophobic resin has little contribution to the surface localization of the hydrophobic resin caused by the effect of the main chain, and thus is not included in examples of the $CH_3$ partial structure according to the present invention.

The details of the hydrophobic resin can be found in paragraphs "0348" to "0415" of JP2014-010245A, the content of which is incorporated herein by reference.

As the hydrophobic resin, resins described in JP2011-248019A, JP2010-175859A, and JP2012-032544A can also be preferably used.

(E) Surfactant

The actinic ray-sensitive or radiation-sensitive resin composition may further include a surfactant (E). By the actinic ray-sensitive or radiation-sensitive composition including the surfactant, particularly in a case where an exposure light source having a wavelength of 250 nm or shorter, in particular, 220 nm or shorter is used, a pattern having adhesiveness and reduced development defects can be formed with high sensitivity and resolution.

As the surfactant, a fluorine surfactant and/or a silicon surfactant is preferably used.

Examples of the fluorine surfactant and/or the silicon surfactant include surfactants described in paragraph "0276" of US2008/0248425A. In addition, F-TOP EF301 or EF303

(manufactured by Shin-akita Chemical Co., Ltd.); FLUO-RAD $FC_{430, 431}$ or 4430 (manufactured by Sumitomo 3M Ltd.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); F-TOP EF121, EF122A, EF122B, RF122C, EF125M, EF135M, EF351, EF352, EF801, EF802, or EF601 (manufactured by Gemco Inc.); PF636, PF656, PF6320, or PF6520 (manufactured by OMNOVA Corp.); or FTX-204G, 208G, 218G, 230G, 204D, 208D, 212D, 218D, or 222D (manufactured by Neos Co., Ltd.) may be used. A polysiloxane polymer KP-341 (manufactured by Shin-Etsu Chemical Co., Ltd.) can also be used as the silicon surfactant.

In addition, in addition to the above-described surfactants, a surfactant may be synthesized using a fluoro aliphatic compound manufactured using a telomerization method (also referred to as a telomer method) or an oligomerization method (also referred to as an oligomer method). Specifically, a polymer including a fluoro aliphatic group derived from fluoro aliphatic compound may be used as the surfactant. This fluoro aliphatic compound can be synthesized, for example, using a method described in JP2002-90991A.

In addition, a surfactant other than a fluorine surfactant and/or a silicon surfactant which is described in paragraph "0280" of US2008/0248425A may be used.

Among these surfactants, one kind may be used alone, or two or more kinds may be used in combination.

In a case where the actinic ray-sensitive or radiation-sensitive resin composition includes the surfactant, the content of the surfactant is preferably 0 to 2 mass %, more preferably 0.0001 to 2 mass %, and still more preferably 0.0005 to 1 mass % with respect to the total solid content of the composition.

(F) Other Additives

The actinic ray-sensitive or radiation-sensitive resin composition may further include a dissolution inhibiting compound, a dye, a plasticizer, a photosensitizer, a light absorber, and/or a compound for promoting solubility in the developer (for example, a phenol compound having a molecular weight of 1000 or lower, or an aliphatic or alicyclic compound having a carboxy group).

The actinic ray-sensitive or radiation-sensitive resin composition may further include a dissolution inhibiting compound.

Here, "dissolution inhibiting compound" denotes a compound having a molecular weight of 3000 or lower which is decomposed by the action of an acid such that the solubility in the organic developer decreases.

[Upper Layer Film (Top Coat Film)]

In the pattern forming method according to the present invention, an upper layer film (top coat film) may be formed over the resist film It is preferable that the upper layer film is not mixed with the resist film and is uniformly formed above the resist film.

The upper layer film is not particularly limited, and well-known upper layer film of the related art can be formed using a well-known method of the related art. For example, the upper layer film can be formed based on the description of paragraphs "0072" to "0082" of JP2014-059543A. As a material forming the upper layer film, for example, a polymer described in paragraph "0072" of JP2014-059543A or a hydrophobic resin can be used. As the hydrophobic resin, for example, the above-described hydrophobic resin (A') can be used.

In a case where the developer including the organic solvent is used in the development step, it is preferable that, for example, an upper layer film including a basic compound described in JP2013-61648A is formed on the resist film. Specific examples of the basic compound which may be included in the upper layer film include a basic compound (E) described below.

In addition, it is preferable that the upper layer film includes a compound which includes at least one group or one bond selected from the group consisting of an ether bond, a thioether bond, a hydroxyl group, a thiol group, a carbonyl bond, and an ester bond.

Further, the upper layer film may include a photoacid generator. As the photoacid generator, the same photoacid generator (for example, the above-described photoacid generator (B)) which may be included in the actinic ray-sensitive or radiation-sensitive composition can be used.

Hereinafter, a preferable resin which can be used in the upper layer film (top coat film) will be described.

(Resin)

It is preferable that the upper layer film-forming composition includes a resin. The resin which may be included in the upper layer film-forming composition is not particularly limited, and the same resin as the hydrophobic resin which may be included in the actinic ray-sensitive or radiation-sensitive composition (for example, the above-described hydrophobic resin (A')) can be used.

The details of the hydrophobic resin can be found in paragraphs "0017" to "0023" of JP2013-61647A (corresponding to paragraphs "0017" to "0023" of US2013/244438A) and in paragraphs "0016" to "0165" of JP2014-56194A, the content of which is incorporated herein by reference.

In the present invention, it is preferable that the upper layer film-forming composition includes a resin that includes a repeating unit having an aromatic ring. By the upper layer film-forming composition including the repeating unit having an aromatic ring, in particular, during exposure of an electron beam or an EUV ray, the generation efficiency of secondary electrons and the generation of efficiency of an acid from the compound which generates an acid by actinic ray or radiation are improved, and an effect of improving sensitivity and resolution during the formation of a pattern can be expected.

The weight-average molecular weight of the resin is preferably 3000 to 100000, more preferably 3000 to 30000, and most preferably 5000 to 20000. The mixing amount of the resin in the upper layer film-forming composition is preferably 50 to 99.9 mass %, more preferably 60 to 99.0 mass %, still more preferably 70 to 99.7 mass %, and even still more preferably 80 to 99.5 mass % with respect to the total solid content.

In a case where the upper layer film-forming composition (top coat composition) includes a plurality of resins, it is preferable that upper layer film-forming composition includes at least one resin (XA) having a fluorine atom and/or a silicon atom.

Regarding a preferable range of the content of the fluorine atom and the silicon atom included in the resin (XA), the content of a repeating unit having a fluorine atom and/or a silicon atom in the resin (XA) is preferably 10 to 100 mass %, preferably 10 to 99 mol %, and more preferably 20 to 80 mol %.

In addition, it is more preferable that the upper layer film-forming composition includes at least one resin (XA) having a fluorine atom and/or a silicon atom and a resin (XB) in which the content of a fluorine atom and/or a silicon atom is lower than that of the resin (XA). As a result, during the formation of the upper layer film, the resin (XA) is eccentrically present on the surface of the upper layer film. Therefore, the performance such as developing characteristics or followability of immersion liquid can be improved.

The content of the resin (XA) is preferably 0.01 to 30 mass %, more preferably 0.1 to 10 mass %, still more preferably 0.1 to 8 mass %, and even still more preferably 0.1 to 5 mass % with respect to the total solid content of the upper layer film-forming composition. The content of the resin (XB) is preferably 50.0 to 99.9 mass %, more preferably 60 to 99.9 mass %, still more preferably 70 to 99.9 mass %, and even still more preferably 80 to 99.9 mass % with respect to the total solid content of the upper layer film-forming composition.

It is preferable that the resin (XB) does not substantially include a fluorine atom and a silicon atom. In this case, specifically, the total content of a repeating unit having a fluorine atom and a repeating unit having a silicon atom is preferably 0 to 20 mol %, more preferably 0 to 10 mol %, still more preferably 0 to 5 mol %, even still more preferably 0 to 3 mol %, and ideally 0 mol % (that is, a fluorine atom and a silicon atom are not included) with respect to all the repeating units of the resin (XB).

<Method of Preparing Upper Layer Film-Forming Composition (Top Coat Composition)>

It is preferable that the respective components of the upper layer film-forming composition are dissolved in a solvent and are filtered through a filter. As the filter, a filter formed of polytetrafluoroethylene, polyethylene, or nylon and having a pore size of preferably 0.1 μm or less, more preferably 0.05 μm or less, and still more preferably 0.03 μm or less is preferable. A plurality of filters may be connected in series or in parallel. In addition, the composition may be filtered multiple times, and a step of filtering various materials multiple times may be a cycle filtration step. Further, before and after the filter filtration, degassing or the like may be performed on the composition. It is preferable that the upper layer film-forming composition does not include impurities such as metal. The content of the metal components in the materials is preferably 10 ppm or lower, more preferably 5 ppm or lower, and still more preferably 1 ppm or lower, and it is still most preferable that the materials do not substantially include the metal components (the measured value is lower than a detection limit value of a measuring device).

In a case where immersion exposure is performed in the <exposure step>, the upper layer film is disposed between the actinic ray-sensitive or radiation-sensitive film and functions as a layer that prevents direct contact between the actinic ray-sensitive or radiation-sensitive film and the immersion liquid. In this case, preferable characteristics of the upper layer film (upper layer film-forming composition) include suitability for application to the actinic ray-sensitive or radiation-sensitive film, transparency to radiation, particularly, light at 193 nm, and insolubility in the immersion liquid (preferably water). In addition, it is preferable that the upper layer film is uniformly applied to the surface of the actinic ray-sensitive or radiation-sensitive film without being mixed with the actinic ray-sensitive or radiation-sensitive film.

In order to uniformly apply the upper layer film-forming composition to the surface of the actinic ray-sensitive or radiation-sensitive film without dissolving the actinic ray-sensitive or radiation-sensitive film, it is preferable that the upper layer film-forming composition includes a solvent in which the actinic ray-sensitive or radiation-sensitive film is not soluble. As the solvent in which the actinic ray-sensitive or radiation-sensitive film is not soluble, it is more preferable that a solvent having different components from those of a developer (organic developer) including an organic solvent is used.

An application method of the upper layer film-forming composition is not particularly limited, and a spin coating method, a spray coating method, a roller coating method, or a dipping method that is well-known in the related art can be used.

The thickness of the upper layer film is not particularly limited, and from the viewpoint of transparency to an exposure light source, is typically 5 nm to 300 nm, preferably 10 nm to 300 nm, more preferably 20 nm to 200 nm, and still more preferably 30 nm to 100 nm.

After the formation of the upper layer film, the substrate is optionally heated (PB).

From the viewpoint of resolution, it is preferable that the refractive index of the upper layer film is close to the refractive index of the actinic ray-sensitive or radiation-sensitive film.

It is preferable that the upper layer film is insoluble in the immersion liquid, and it is more preferable that the upper layer film is insoluble in water.

From the viewpoint of followability of immersion liquid, the receding contact angle (23° C.) of the immersion liquid on the upper layer film is preferably 50 to 100 degrees and more preferably 80 to 100 degrees.

During the immersion exposure, it is necessary that the immersion liquid moves on a wafer following a movement of an exposure head that scans the wafer with high speed to form an exposure pattern. Therefore, the contact angle of the immersion liquid on the actinic ray-sensitive or radiation-sensitive film in a dynamic state is important, and it is preferable that the receding contact angle is in the above-described range in order to obtain higher resist performance.

In a case where the upper layer film is peeled, an organic developer may be used, or a peeling liquid may be separately used. As the peeling liquid, a solvent having low permeability to the actinic ray-sensitive or radiation-sensitive film is preferable. From the viewpoint that the peeling of the upper layer film and the development of the actinic ray-sensitive or radiation-sensitive film can be performed at the same time, it is preferable that the upper layer film can be peeled off using the organic developer. The organic developer used for peeling is not particularly limited as long as it can dissolve and remove a low exposure portion of the actinic ray-sensitive or radiation-sensitive film.

From the viewpoint of peeling the upper layer film using the organic developer, the dissolution rate of the upper layer film in the organic developer is preferably 1 to 300 nm/sec and more preferably 10 to 100 nm/sec.

Here, the dissolution rate of the upper layer film in the organic developer is a rate at which the film thickness is reduced when the upper layer film is formed and then is exposed to the developer. In the present invention, the dissolution rate is a rate when the upper layer film is dipped in butyl acetate at 23° C.

By adjusting the dissolution rate of the upper layer film in the organic developer to be 1 nm/sec or higher and preferably 10 nm/sec or higher, an effect of reducing the occurrence of development defects after developing the actinic ray-sensitive or radiation-sensitive film can be obtained. In addition, by adjusting the dissolution rate of the upper layer film in the organic developer to be 300 nm/sec or lower and preferably 100 nm/sec or lower, an effect of further improving the line edge roughness of a pattern after developing the actinic ray-sensitive or radiation-sensitive film can be obtained due to the effect of reduced uneven exposure during immersion exposure.

The upper layer film may be removed using another well-known developer, for example, an alkali aqueous solution. Specific examples of the alkali aqueous solution that can be used include an aqueous solution of tetramethylammonium hydroxide.

In addition, the present invention relates to a method of manufacturing an electronic device including the pattern forming method according to the present invention.

An electronic device that is manufactured using the method of manufacturing an electronic device according to the present invention can be suitably mounted on electric and electronic apparatuses (home electronics, apparatuses relating to office automation (OA) and media, optical apparatuses, and communication apparatuses)

EXAMPLES

Hereinafter, the present invention will be described in detail using Examples, but the scope of the present invention is not limited thereto. Unless specified otherwise, "%", "ppb", and "ppt" are based on mass.

<<Preparation of Treatment Liquid for Manufacturing Semiconductor>>

Hereinafter, synthesis examples of various treatment liquids will be described. However, the present invention is not limited to the following synthesis examples, and the treatment liquid can be synthesized using a well-known method.

Examples 1 to 46 and Comparative Examples 1 and 2

<Purification of Raw Materials and the like>

Each of raw materials and each of catalysts used in each of the following Examples have a high purity of 99 mass % or higher and was purified in advance by distillation, ion exchange, filtration, or the like. In addition, a catalyst used for the following esterification reaction is sulfuric acid. Sulfuric acid used as the catalyst has a purity of 98 mass % or higher and can be used while dehydrating it to be in a predetermined concentration range by supplying dilute sulfuric acid.

Ultrapure water was purified using a method described in JP2007-254168A and was used for adjusting the treatment liquid after verifying that the content of each element of Na, Ca, and Fe was lower than 10 mass ppt with respect to the total mass of each of the treatment liquids in measurement using a SP-ICP-MS method described below.

All the preparation, filling, storage, analysis, and measurement of the treatment liquids were performed in a clean room satisfying a level of ISO Class 2 or lower. In addition, a container used in Examples was used after being cleaned using the treatment liquid according to the present invention.

Synthesis Example 1

Synthesis of Butyl Acetate-Containing Treatment Liquid (Treatment Liquid 1A)
(Step 1)
Acetic acid and n-butanol were caused to preliminarily react with each other in the presence of sulfuric acid as a catalyst using a continuous tank reactor. Next, in a continuous reactive distillation column, the obtained reaction solution 1a was caused to react while removing water, which was by-produced as an azeotropic mixture of butyl acetate, n-butanol, and water, from the top of the distillation column to the outside of the system. As a result, a crude liquid including butyl acetate (hereinafter, referred to as "butyl acetate crude liquid") 1b was obtained.

(Step 2)
Regarding the butyl acetate crude liquid 1b obtained in the step 1, sulfuric acid was neutralized with alkali. Next, the butyl acetate crude liquid 1b was cleaned with water, and the water is removed. As a result, a butyl acetate crude liquid 1c was extracted.

(Step 3)
The butyl acetate crude liquid 1c obtained in the step 2 was neutralized and cleaned with water, and most part of water and sulfuric acid were separated from each other using a decanter. Next, a butyl acetate crude liquid 1d including butyl acetate, n-butanol, water, sulfuric acid, and a small amount of by-products was supplied to the distillation column in order to remove low boiling point materials such as n-butanol and water of impurities. Next, by repeating distillation multiple times, a butyl acetate-containing treatment liquid (treatment liquid 1A) as a target product was obtained.

A compound (B) included in the obtained butyl acetate-containing treatment liquid (treatment liquid 1A) included the following compounds. The content of each of the compounds in the treatment liquid satisfied the requirement (b) (refer to Table 2).

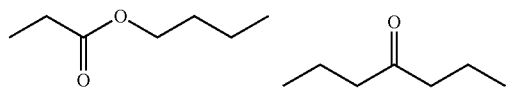

Using the same method as in Synthesis Example 1, other butyl acetate-containing treatment liquids (treatment liquids 1B to 1Q) were synthesized. The compound (B) included each of the obtained treatment liquids was the same as the treatment liquid 1A, and the content of each of the compounds (B) in the treatment liquid satisfied the requirement (b) (refer to Table 2).

Synthesis Example 2

Synthesis of 1-Hexanol-Containing Treatment Liquid (Treatment Liquid 2A) (Raw Materials and the Like)
1-hexanol was synthesized from the following two steps of reaction formulae.

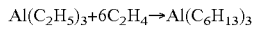

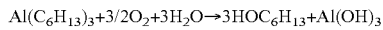

(Step 1)
Using a well-known method, $Al(C_6H_{15})_3$ polymerized using the first step of reaction was obtained. Next, by using this $Al(C_6H_{15})_3$ as a catalyst, 1-hexanol was synthesized using a well-known method in the coexistence of oxygen and water. The obtained solution was heated at 40° C. for 10 hours. As a result, a crude liquid including 1-hexanol (hereinafter, referred to as "1-hexanol crude liquid") 2a was obtained. Al was removed as aluminum hydroxide.

(Step 2)

The 1-hexanol crude liquid 2a obtained in the step 1 included a precipitate of Al(OH)$_3$, and thus Al(OH)$_3$ was removed by filtering. As a result, a 1-hexanol crude liquid 2b was obtained.

(Step 3)

The 1-hexanol crude liquid 2b obtained in the step 2 was supplied to the distillation column in order to remove a substituted isomer of the by-product, higher alcohol, or the like. Next, by repeating distillation multiple times, a 1-hexanol-containing treatment liquid (treatment liquid 2A) as a target product was obtained.

A compound (B) included in the 1-hexanol-containing treatment liquid (treatment liquid 2A) included the following compounds. The content of each of the compounds in the treatment liquid satisfied the requirement (b) (refer to Table 2).

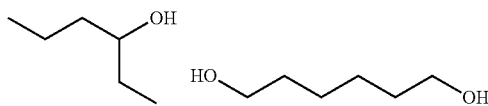

Synthesis Example 3

Synthesis of 4-Methyl-2-Pentanol-Containing Treatment Liquid (Treatment Liquid 3A)

(Step 1)

cis-4-methyl-2-pentene was treated using a well-known method in the presence of diisopinocampheylborane (Ipc$_2$BH) as a catalyst. As a result, 4-methyl-2-pentanol was synthesized. The obtained solution was heated at 80° C. for 4 hours. As a result, an intermediate in which cis-4-methyl-2-pentene and Ipc2BH were bonded to each other through boron was obtained, and then a crude liquid including 4-methyl-2-pentanol (hereinafter, referred to as "4-methyl-2-pentanol crude liquid") 3a was obtained.

(Step 2)

The 4-methyl-2-pentanol crude liquid 3a obtained in the step 1 included unreacted cis-4-methyl-2-pentene and a substituted isomer as an impurity.

This 4-methyl-2-pentanol crude liquid 3a was supplied to the distillation column for purification. Next, by repeating distillation multiple times, a 4-methyl-2-pentanol-containing treatment liquid (treatment liquid 3A) as a target product was obtained.

A compound (B) included in the 4-methyl-2-pentanol-containing treatment liquid (treatment liquid 3A) included the following compounds. The content of each of the compounds in the treatment liquid satisfied the requirement (b) (refer to Table 2).

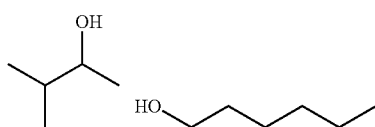

Using the same method as in Synthesis Example 3, other 4-methyl-2-pentanol-containing treatment liquids (treatment liquids 3B to 3G) were synthesized. The compound (B) included each of the obtained treatment liquids was the same as the treatment liquid 1A, and the content of each of the compounds (B) in the treatment liquid satisfied the requirement (b) (refer to Table 2).

Synthesis Example 4

Synthesis of Propylene Glycol Monomethyl Ether Acetate (PGMEA)-Containing Treatment Liquid (Treatment Liquid 4A)

(Step 1)

Propylene oxide, methanol, and acetic acid were caused to react with each other in the presence of sulfuric acid as a catalyst using a well-known method. As a result, PGMEA was synthesized (two-step synthesis). The obtained solution was heated at 80° C. for 8 hours. As a result, a crude liquid including PGMEA (hereinafter, referred to as "PGMEA crude liquid") 4a was obtained.

(Step 2)

The PGMEA crude liquid 4a obtained in the step 1 included unreacted propylene oxide, methanol, acetic acid, and a substituted isomer as an impurity.

This PGMEA crude liquid 4a was supplied to the distillation column for purification. Next, by repeating distillation multiple times, a PGMEA-containing treatment liquid (treatment liquid 4A) as a target product was obtained.

Compounds (B) included in the obtained PGMEA-containing treatment liquid (treatment liquid 4A) were the following compounds. The content of each of the compounds in the treatment liquid satisfied the requirement (b) (refer to Table 2).

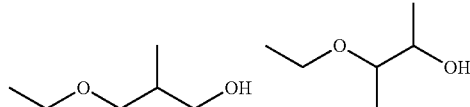

Using the same method as in Synthesis Example 4, other PGMEA-containing treatment liquids (treatment liquids 4B to 4E) were synthesized. The compounds (B) included each of the obtained treatment liquids were the same as the treatment liquid 4A, and the content of each of the compounds (B) in the treatment liquid satisfied the requirement (b) (refer to Table 2).

Synthesis Example 5

Synthesis of Isopropanol (IPA)-Containing Treatment Liquid (Treatment Liquid 5A)

(Step 1)

Using acetone and hydrogen, a reduction reaction of acetone was performed in the presence of copper oxide-zinc oxide-aluminum oxide as a catalyst according to a well-known method. The obtained solution was heated at 100° C. for 4 hours. As a result, a crude liquid including IPA (hereinafter, referred to as "IPA crude liquid") 5a was obtained.

(Step 2)

The IPA crude liquid 5a included unreacted acetone, a substituted isomer as an impurity, and the catalyst. This IPA crude liquid 5a was supplied to the distillation column for purification. Next, by repeating distillation multiple times, an IPA-containing treatment liquid (treatment liquid 5A) as a target product was obtained.

A compound (B) included in the obtained IPA-containing treatment liquid (treatment liquid 5A) was the following compound. The content of the compound in the treatment liquid satisfied the requirement (b) (refer to Table 2).

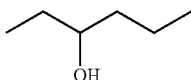

Using the same method as in Synthesis Example 5, other IPA-containing treatment liquids (treatment liquids 5B to 5E) were synthesized. The compound (B) included each of the obtained treatment liquids was the same as the treatment liquid 5A, and the content of each of the compounds (B) in the treatment liquid satisfied the requirement (b) (refer to Table 2).

Synthesis Example 6

Synthesis of Ethyl Lactate (EL)-Containing Treatment Liquid (Treatment Liquid 6A)

(Step 1)

Using lactic acid and ethanol, a crude liquid including ethyl lactate (hereinafter, referred to as "ethyl lactate crude liquid") 6a was obtained according to an esterification method described in JP1987-26249A (JP-S62-26249A).

(Step 2)

The ethyl lactate crude liquid 6a obtained in the step 1 included water or alcohol as a by-product and unreacted ethanol as a raw material.

This obtained ethyl lactate crude liquid 6a was supplied to the distillation column for purification. Next, by repeating distillation multiple times, an ethyl lactate-containing treatment liquid (treatment liquid 6A) was obtained.

Compounds (B) included in the obtained ethyl lactate-containing treatment liquid (treatment liquid 6A) were the following compounds. The content of each of the compounds in the treatment liquid satisfied the requirement (b) (refer to Table 2).

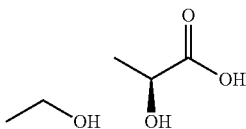

Using the same method as in Synthesis Example 6, other ethyl lactate-containing treatment liquids (treatment liquids 6B to 6E) were synthesized. The compounds (B) included each of the obtained treatment liquids were the same as the treatment liquid 6A, and the content of each of the compounds (B) in the treatment liquid satisfied the requirement (b) (refer to Table 2).

Synthesis Example 7

Synthesis of Cyclohexanone-Containing Treatment Liquid (Treatment Liquid 7A)

(Step 1)

Using a method described in JP2007-63209A, monochlorobenzene and hydrogen chloride were obtained from benzene and chlorine. Next, phenol and hydrogen chloride were obtained monochlorobenzene and water. Next, a crude liquid including cyclohexanone (hereinafter, referred to as "cyclohexanone crude liquid") 7a was obtained from phenol and hydrogen.

(Step 2)

The cyclohexanone crude liquid 7a obtained from a reaction column in the step 1 included unreacted benzene, monochlorobenzene, and phenol.

This obtained cyclohexanone crude liquid 7a was supplied to the distillation column for purification. Next, by repeating distillation multiple times, a cyclohexanone-containing treatment liquid (treatment liquid 7A) was obtained.

Compounds (B) included in the cyclohexanone-containing treatment liquid (treatment liquid 7A) were the following compounds. The content of each of the compounds in the treatment liquid satisfied the requirement (b) (refer to Table 2).

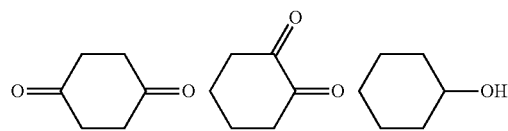

Using the same method as in Synthesis Example 7, another cyclohexanone-containing treatment liquid (treatment liquid 7E) was synthesized. In addition, regarding the treatment liquids 7B to 7D and 7F to 7G, the crude liquids 7a were purified using a method described below. The compounds (B) included each of the obtained treatment liquids was the same as the treatment liquid 7A, and the content of each of the compounds (B) in the treatment liquid satisfied the requirement (b) (refer to Table 2).

Synthesis Example 8

Synthesis of Propylene Glycol Monomethyl Ether (PGME)-Containing Treatment Liquid (Treatment Liquid 8A)

(Step 1)

Using a method described in JP2008-208035A, methanol and propylene oxide were caused to react with each other at 90° C. to 110° C. As a result, a crude liquid including PGME (hereinafter, referred to as "PGME crude liquid") 8a was obtained.

(Step 2)

The PGME crude liquid 8a obtained from a reaction column in the step 1 included unreacted methanol, propylene oxide, acetic acid, and tertiary amine as a catalyst.

The obtained PGME crude liquid 8a was supplied to the distillation column for purification. Next, by repeating distillation multiple times, a PGME-containing treatment liquid (treatment liquid 8A) was obtained.

Compounds (B) included in the obtained PGME-containing treatment liquid (treatment liquid 8A) were the following compounds. The content of each of the compounds in the treatment liquid satisfied the requirement (b) (refer to Table 2).

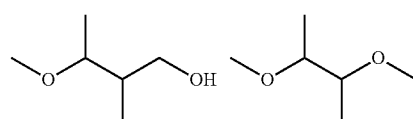

Synthesis Example 9

Synthesis of Methyl 3-Methoxypropionate (MMP)-Containing Treatment Liquid (Treatment Liquid 8A)

(Step 1)

Using a method described in JP2007-63209A, methanol, potassium t-butoxide (Kot-Bu) as a basic catalyst, and 74.0 g (0.86 mol) of methyl acrylate were weighed and were slowly added dropwise from a dropping funnel for about 1 hour. At this time, in a case where a small amount of methyl acrylate was added dropwise, heat was generated. Therefore, the reaction temperature was controlled at 40° C. while cooling the solution using iced water. After completion of the dropwise addition, the solution was heated and stirred at 40° C. for 1 hour, and the total reaction time was 2 hours.

Next, phosphoric acid was added, and the solution was stirred at room temperature for 30 minutes after verifying that the solution was neutral using pH test paper. After the neutralization, a solid matter of a neutral salt of the catalyst was separated by suction filtration. As a result, a crude liquid including MMP (hereinafter, referred to as "MMP crude liquid") 9a was obtained.

(Step 2)

The MMP crude liquid 9a obtained from a reaction column in the step 1 included unreacted methanol and methyl acrylate.

The obtained MMP crude liquid 9a was supplied to the distillation column for purification. Next, by repeating distillation multiple times, an MMP-containing treatment liquid (treatment liquid 9A) was obtained.

Compounds (B) included in the obtained MMP-containing treatment liquid (treatment liquid 9A) were the following compounds. The content of each of the compounds in the treatment liquid satisfied the requirement (b) (refer to Table 2).

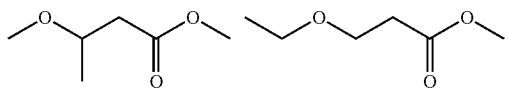

The obtained treatment liquids 1A to 1Q, 2A, 3A to 3G, 4A to 4E, 5A to 5E, 6A to 6E, 7A to 7G, 8A, and 9A are shown below in Tables 1-1 to 1-6. Hereinafter, Tables 1-1 to 1-6 will be collectively referred to as Table 1.

[Measurement using SP-ICP-MS Method]

1) Preparation of Standard Material

Ultrapure water was weighed and charged into a clean glass container, and measurement target metal particles having a median size of 50 nm were added thereto such that the concentration was 10000 atoms/ml. Next, the solution was treated using an ultrasonic cleaning machine for 30 minutes to obtain a dispersion. This dispersion was used as a standard material for transport efficiency measurement.

2) SNP-ICP-MS Device Used

Manufacturer: PerkinElmer

Model: NexION 350S

3) Measurement Conditions of SNP-ICP-MS

In SNP-ICP-MS, the measurement target liquid was aspirated at about 0.2 mL/min using a PFA coaxial nebulizer formed of PFA, a cyclonic spray chamber formed of quartz, and a torch injector having an inner diameter of 1 mm formed of quartz. The addition amount of oxygen was set as 0.1 L/min, the plasma power was set as 1600 W, and the inside of the cell was purged using ammonia gas. The temporal resolution was set as 50 μs for analysis.

The content of metal particles and the content of metal atoms were measured using the following analysis software manufactured by the manufacturers.

Content of Metal Particles: Syngistix Nano Application Module for "SP-ICP-MS", nanoparticle analysis Content of Metal Atoms: Syngistix for ICP-MS Software The results are shown in Table 1 below.

[Measurement of Contents of Compound (A), Compound (B), and Inorganic Matter (C)]

Each of components used in each of Examples and each of Comparative Examples was measured using a gas chromatograph/mass spectrometer (GC/MS), a liquid chromatograph/mass spectrometer (LC/MS), nuclear magnetic resonance (NMR), and ion chromatography (IC). The organic matter measurement was performed using GC/MS, LC/MS, and NMR, and the inorganic matter analysis was performed using IC.

[GC/MS] (Gas Chromatography-Mass Spectrometer)

(Measurement Conditions)

Device: "GCMS-2020" (manufactured by Shimadzu Corporation)

[LC/MS] (Liquid Chromatograph/Mass Spectrometer)

(Measurement Conditions)

Device: "UPLC-H-Class, Xevo G2-XS Qtof" (manufactured by Thermo Fisher Scientific Inc.)

[NMR] (Nuclear Magnetic Resonance)

(Measurement Conditions)

Device: AL400 (manufactured by JEOL Ltd.)

Measurement nucleus: $^1$H

Solvent: CDC13

[IC] (ion chromatography)

(Measurement Conditions)

Device: "HIC-SP" (manufactured by Shimadzu Corporation)

The content of each of the compounds is shown in Table 1 below.

In "Inorganic Matter (C)" of Table 1, the columns "S", "Al", "B", "N", and "K" represent the content of an inorganic matter including S, the content of an inorganic matter including Al, the content of an inorganic matter including B, the content of an inorganic matter including N, and the content of an inorganic matter including K, respectively.

[Measurement of dissolution rate (ER) of Resist Film]

An organic antireflection film ARC29A (manufactured by Nissan Chemical Industries Ltd.) was applied to a silicon wafer and was baked at 205° C. for 60 seconds to form an antireflection film having a thickness of 78 nm. Next, a commercially available product FAiRS-9101A12 (ArF resist composition, manufactured by Fujifilm Electronic Materials Co., Ltd.) was applied using a spin coater and was baked at 100° C. for 60 seconds. The entire surface of the obtained wafer was exposed at 25 [mJ/cm$^2$] using an ArF excimer laser scanner (NA: 0.75). Next, the wafer was heated at 120° C. for 60 seconds. This wafer was cut into a size of 2 cm×2 cm and was dipped in each of the treatment liquids shown in Table 1 at 23° C. for 10 minutes. The film thickness was measured before and after dipping by optical ellipsometry for film thickness measurement, and the dissolution rate (ER) was calculated.

The results are shown in Table 1.

[Defect Suppressing Performance (Measurement of Number of Defects)] Using a wafer surface inspection device (SP-5, manufactured by KLA-Tencor Corporation), the number of particles (hereinafter, referred to as "defects") having a diameter of 32 nm or more present on a silicon substrate surface having a diameter of 300 mm was calculated. Next, this silicon substrate was set on a spin discharge device, and various treatment liquids shown in Table 1 were discharged to the surface of the silicon substrate at a flow rate of 1.5 L/min while rotating the silicon substrate. Next, the silicon wafer was rinsed and dried. Regarding the obtained sample, the number of defects present on the silicon substrate surface was measured again using the device (SP-5), and a difference between the measured value and the initial value was calculated as the number of defects. The obtained number of defects was evaluated based on the following standards, and the results thereof are shown in Table 1. In the following standards, the evaluation D represents that the performance of suppressing defects that is required for the treatment liquid for manufacturing a semiconductor is achieved.

A: the number of defects was 50 or less

B: the number of defects was more than 50 and 100 or less

C: the number of defects was more than 100 and 500 or less

D: the number of defects was more than 500 and 1000 or less

E: the number of defects was more than 1000

TABLE 1

| Example | Treatment Liquid | Compound (A) Kind | Compound (A) Content | Compound (B) Total Content | Compound (B) B1 | Compound (B) B2 | Compound (B) B3 | Inorganic Matter (C) (ppb) S | Inorganic Matter (C) (ppb) Al | Inorganic Matter (C) (ppb) B | Inorganic Matter (C) (ppb) N | Inorganic Matter (C) (ppb) K | P Value (C)/(B) | Q Value (A)/(B) |
|---|---|---|---|---|---|---|---|---|---|---|---|---|---|---|
| Example 1 | Treatment Liquid 1A | Butyl Acetate | 99.9999999% | 0.0000001% | 0.00000005% | 0.00000005% | | 0.01 | — | — | — | — | $10^{-2}$ | $10^9$ |
| Example 2 | Treatment Liquid 1B | Butyl Acetate | 99.9999999% | 0.0000001% | 0.00000006% | 0.000000004% | | 0.01 | — | — | — | — | $10^{-2}$ | $10^9$ |
| Example 3 | Treatment Liquid 1C | Butyl Acetate | 99.9999999% | 0.0000001% | 0.00000004% | 0.00000006% | | 0.01 | — | — | — | — | $10^{-2}$ | $10^9$ |
| Example 4 | Treatment Liquid 1D | Butyl Acetate | 99.9999999% | 0.0000001% | 0.00000007% | 0.00000003% | | 0.01 | — | — | — | — | $10^{-2}$ | $10^9$ |
| Example 5 | Treatment Liquid 1E | Butyl Acetate | 99.999% | 0.0001% | 0.00005% | 0.00005% | | 0.01 | — | — | — | — | $10^{-5}$ | $10^6$ |
| Example 6 | Treatment Liquid 1F | Butyl Acetate | 99.9999999% | 0.0000001% | 0.00000003% | 0.00000007% | | 0.001 | — | — | — | — | $10^{-3}$ | $10^9$ |
| Example 7 | Treatment Liquid 1G | Butyl Acetate | 99.9999999% | 0.0000001% | 0.00000005% | 0.00000005% | | 1 | — | — | — | — | $10^0$ | $10^9$ |
| Example 8 | Treatment Liquid 1H | Butyl Acetate | 99.9999999% | 0.0000001% | 0.00000001% | 0.00000009% | | 100 | — | — | — | — | $10^2$ | $10^9$ |
| Example 9 | Treatment Liquid 1I | Butyl Acetate | 99.9999999% | 0.0000001% | 0.00000002% | 0.00000008% | | 1000 | — | — | — | — | $10^3$ | $10^9$ |
| Example 10 | Treatment Liquid 1J | Butyl Acetate | 99.9999999% | 0.0000001% | 0.00000001% | 0.00000009% | | 0.01 | — | — | — | — | $10^{-2}$ | $10^9$ |
| Example 11 | Treatment Liquid 2A | 1-Hexanol | 99.9999999% | 0.0000001% | 0.00000008% | 0.00000002% | | — | 0.01 | — | — | — | $10^{-2}$ | $10^9$ |
| Example 12 | Treatment Liquid 3A | 4-Methyl-2-Pentanol | 99.9999999% | 0.0000001% | 0.00000008% | 0.00000002% | | — | — | 0.01 | — | — | $10^{-2}$ | $10^9$ |
| Example 13 | Treatment Liquid 3B | 4-Methyl-2-Pentanol | 99.9999999% | 0.0000001% | 0.00000006% | 0.00000004% | | — | — | 0.01 | — | — | $10^{-2}$ | $10^9$ |
| Example 14 | Treatment Liquid 3C | 4-Methyl-2-Pentanol | 99.9999999% | 0.0000001% | 0.00000004% | 0.00000006% | | — | — | 0.01 | — | — | $10^{-2}$ | $10^9$ |
| Example 15 | Treatment Liquid 4A | PGMEA | 99.9999999% | 0.0000001% | 0.00000004% | 0.00000006% | | — | — | 0.01 | — | — | $10^{-2}$ | $10^9$ |
| Example 16 | Treatment Liquid 5A | IPA | 99.9999999% | 0.0000001% | 0.00000010% | 0.00000010% | | — | — | — | — | — | $10^{-2}$ | $10^9$ |
| Example 17 | Treatment Liquid 6A | Ethyl Lactate | 99.9999999% | 0.0000001% | 0.00000005% | 0.00000005% | | 0.01 | — | — | — | — | $10^{-2}$ | $10^9$ |
| Example 18 | Treatment Liquid 7A | Cyclohexanone | 99.9999999% | 0.0000001% | 0.00000002% | 0.00000002% | 0.00000003% | — | 0.01 | — | — | — | $10^{-2}$ | $10^9$ |
| Example 19 | Treatment Liquid 1M | Butyl Acetate | 99.99% | 0.000003% | 0.000002% | 0.000001% | | 0.001 | — | — | — | — | $3 \times 10^{-5}$ | $3 \times 10^7$ |
| Example 20 | Treatment Liquid 1N | Butyl Acetate | 99.99% | 0.000003% | 0.000002% | 0.0000001% | | 0.001 | — | — | — | — | $3 \times 10^{-4}$ | $3 \times 10^8$ |
| Example 21 | Treatment Liquid 1O | Butyl Acetate | 99.99% | 0.0000003% | 0.0000002% | 0.0000001% | | 0.0001 | — | — | — | — | $3 \times 10^{-4}$ | $3 \times 10^9$ |
| Example 22 | Treatment Liquid 1P | Butyl Acetate | 99.99% | 0.0000003% | 0.0000002% | 0.0000001% | | 0.0001 | — | — | — | — | $3 \times 10^{-4}$ | $3 \times 10^9$ |
| Example 23 | Treatment Liquid 1Q | Butyl Acetate | 99.99% | 0.0000003% | 0.0000002% | 0.0000001% | | 1 | — | — | — | — | $3 \times 10^0$ | $3 \times 10^9$ |
| Example 24 | Treatment Liquid 3D | 4-Methyl-2-Pentanol | 99.99% | 0.0000003% | 0.0000002% | 0.0000001% | | — | — | 0.001 | — | — | $3 \times 10^{-4}$ | $3 \times 10^9$ |
| Example 25 | Treatment Liquid 3E | 4-Methyl-2-Pentanol | 99.99% | 0.0000003% | 0.0000002% | 0.0000001% | | — | — | 0.0001 | — | — | $3 \times 10^{-4}$ | $3 \times 10^9$ |
| Example 26 | Treatment Liquid 3F | 4-Methyl-2-Pentanol | 99.99% | 0.0000003% | 0.0000002% | 0.0000001% | | — | — | 0.0001 | — | — | $3 \times 10^{-4}$ | $3 \times 10^9$ |
| Example 27 | Treatment Liquid 3G | 4-Methyl-2-Pentanol | 99.99% | 0.0000003% | 0.0000002% | 0.0000001% | | — | — | 1 | — | — | $3 \times 10^0$ | $3 \times 10^9$ |
| Example 28 | Treatment Liquid 4B | PGMEA | 99.99% | 0.0000003% | 0.0000002% | 0.0000001% | | 0.001 | — | — | — | — | $3 \times 10^{-4}$ | $3 \times 10^9$ |
| Example 29 | Treatment Liquid 4C | PGMEA | 99.99% | 0.0000003% | 0.0000002% | 0.0000001% | | 0.0001 | — | — | — | — | $3 \times 10^{-4}$ | $3 \times 10^9$ |
| Example 30 | Treatment Liquid 4D | PGMEA | 99.99% | 0.0000003% | 0.0000002% | 0.0000001% | | 0.0001 | — | — | — | — | $3 \times 10^{-4}$ | $3 \times 10^9$ |
| Example 31 | Treatment Liquid 4E | PGMEA | 99.99% | 0.0000003% | 0.0000002% | 0.0000001% | | 1 | — | — | — | — | $3 \times 10^0$ | $3 \times 10^9$ |
| Example 32 | Treatment Liquid 5B | IPA | 99.99% | 0.0000002% | 0.0000002% | 0.0000001% | | — | — | 0.001 | — | — | $5 \times 10^{-4}$ | $5 \times 10^8$ |

TABLE 1-continued

| Example | Treatment Liquid | | Purity | Content of Metal Atoms (%) | | | Content of Metal Particles (%) | | | | | | | |
|---|---|---|---|---|---|---|---|---|---|---|---|---|---|---|
| | | | | Na | Ca | Fe | Na | Ca | Fe | | | | | |
| Example 33 | Treatment Liquid 5C | IPA | 99.99% | 0.00000002% | 0.00000002% | 0.00000002% | — | — | — | — | — | — | $5 \times 10^{-4}$ | $5 \times 10^{9}$ |
| Example 34 | Treatment Liquid 5D | IPA | 99.99% | 0.00000002% | 0.00000002% | 0.00000002% | — | — | — | — | 0.0001 | — | $5 \times 10^{-4}$ | $5 \times 10^{9}$ |
| Example 35 | Treatment Liquid 5E | IPA | 99.99% | 0.00000002% | 0.00000002% | 0.00000002% | — | — | — | — | 0.0001, 1 | — | $5 \times 10^{0}$ | $5 \times 10^{9}$ |
| Example 36 | Treatment Liquid 6B | Ethyl Lactate | 99.99% | 0.0000003% | 0.0000002% | 0.0000001% | — | — | — | 0.001 | — | — | $3 \times 10^{-4}$ | $3 \times 10^{8}$ |
| Example 37 | Treatment Liquid 6C | Ethyl Lactate | 99.99% | 0.0000003% | 0.0000002% | 0.00000001% | — | — | — | 0.0001 | — | — | $3 \times 10^{-4}$ | $3 \times 10^{9}$ |
| Example 38 | Treatment Liquid 6D | Ethyl Lactate | 99.99% | 0.0000003% | 0.0000002% | 0.00000001% | — | — | — | 0.0001 | — | — | $3 \times 10^{-4}$ | $3 \times 10^{9}$ |
| Example 39 | Treatment Liquid 6E | Ethyl Lactate | 99.99% | 0.0000001% | 0.00000002% | 0.00000001% | — | — | — | 1 | — | — | $3 \times 10^{0}$ | $3 \times 10^{9}$ |
| Example 40 | Treatment Liquid 7B | Cyclohexanone | 99.99% | 0.0000001% | 0.00000002% | 0.00000001% | — | — | 0.0000007% | — | — | — | $10^{-4}$ | $10^{8}$ |
| Example 41 | Treatment Liquid 7C | Cyclohexanone | 99.99% | 0.0000001% | 0.00000002% | 0.00000001% | — | — | 0.0000007% | 0.001 | — | — | $10^{-4}$ | $10^{9}$ |
| Example 42 | Treatment Liquid 7D | Cyclohexanone | 99.99% | 0.0000001% | 0.00000002% | 0.00000001% | — | — | 0.0000007% | 0.0001 | — | — | $10^{-4}$ | $10^{8}$ |
| Example 43 | Treatment Liquid 7E | Cyclohexanone | 99.99% | 0.0000001% | 0.00000002% | 0.00000001% | — | — | 0.0000007% | 0.1 | — | — | $10^{-2}$ | $10^{9}$ |
| Example 44 | Treatment Liquid 7F | Cyclohexanone | 99.99% | 0.0000001% | 0.00000002% | 0.00000001% | — | — | 0.0000007% | 0.01 | — | — | $10^{-2}$ | $10^{9}$ |
| Example 45 | Treatment Liquid 7G | Cyclohexanone | 99.99% | 0.0000001% | 0.00000002% | 0.00000001% | — | — | 0.0000007% | 1 | — | — | $10^{0}$ | $10^{9}$ |
| Example 46 | Treatment Liquid 8A | PGME | 99.99% | 0.0000003% | 0.00000002% | 0.00000001% | — | — | — | — | — | 0.0001 | $3 \times 10^{-4}$ | $3 \times 10^{9}$ |
| Example 47 | Treatment Liquid 9A | MMP | 99.99% | 0.0000003% | 0.00000002% | 0.00000002% | — | — | — | — | — | 0.0001 | $3 \times 10^{-4}$ | $3 \times 10^{9}$ |
| Comparative Example 1 | Treatment Liquid 1K | Butyl Acetate | 99.999999% | — | — | — | 10000 | — | — | — | — | — | $10^{4}$ | $10^{3}$ |
| Comparative Example 2 | Treatment Liquid 1L | Butyl Acetate | 99.9% | 0.1% | 0.05% | 0.05% | 0.001 | — | — | — | — | — | $10^{-9}$ | $10^{3}$ |

| Example | Treatment Liquid | Content of Metal Atoms (ppt) | | | Content of Metal Particles (ppt) | | | ER (nm/s) | Defect Suppressing Performance |
|---|---|---|---|---|---|---|---|---|---|
| | | Na | Ca | Fe | Na | Ca | Fe | | |
| Example 1 | Treatment Liquid 1A | 10 | 6 | 3 | 3 | 1 | 1 | 0.00333 | A |
| Example 2 | Treatment Liquid 1B | 10 | 6 | 3 | 3 | 1 | 1 | 0.00333 | A |
| Example 3 | Treatment Liquid 1C | 10 | 6 | 3 | 3 | 1 | 1 | 0.00333 | A |
| Example 4 | Treatment Liquid 1D | 10 | 9 | 3 | 3 | 1 | 1 | 0.00333 | A |
| Example 5 | Treatment Liquid 1E | 16 | — | 6 | 5 | 2 | 1 | 0.01667 | B |
| Example 6 | Treatment Liquid 1F | 20 ppt | 12 ppt | 5 ppt | 9 ppt | 5 ppt | 4 | 0.02167 | B |
| Example 7 | Treatment Liquid 1F | 4 | 3 | 0.5 | 1 | 1 | 1 | 0.00333 | A |
| Example 8 | Treatment Liquid 1G | 19 | 10 | 7 | 10 | 6 | 4 | 0.00667 | B |
| Example 9 | Treatment Liquid 1H | 56 | 32 | 21 | 23 | 15 | 13 | 0.01333 | C |
| Example 10 | Treatment Liquid 1I | 123 | 98 | 56 | 85 | 65 | 30 | 0.04167 | D |
| Example 11 | Treatment Liquid 1J | 10 | 6 | 3 | 3 | 1 | 1 | 0.00333 | A |
| | Treatment Liquid 2A | 8 | 4 | 1 | 2 | 1 | 1 | 0.00667 | A |

TABLE 1-continued

| | | | | | | | | |
|---|---|---|---|---|---|---|---|---|
| Example 12 | Treatment Liquid 3A | 20 | 12 | 10 | 9 | 6 | 3 | 0.005 | A |
| Example 13 | Treatment Liquid 3B | 20 | 12 | 10 | 9 | 6 | 3 | 0.005 | A |
| Example 14 | Treatment Liquid 3C | 20 | 12 | 10 | 9 | 6 | 3 | 0.005 | A |
| Example 15 | Treatment Liquid 4A | 15 | 12 | 6 | 6 | 4 | 1 | 0.01333 | A |
| Example 16 | Treatment Liquid 5A | 9 | 6 | 3 | 3 | 1 | 1 | 0.01333 | A |
| Example 17 | Treatment Liquid 6A | 14 | 10 | 5 | 4 | 2 | 2 | 0.01333 | A |
| Example 18 | Treatment Liquid 7A | 13 | 9 | 8 | 4 | 2 | 2 | 0.00333 | A |
| Example 19 | Treatment Liquid 1M | 0.04 | 0.03 | 0.05 | 0.01 | 0.01 | 0.01 | 0.00133 | A |
| Example 20 | Treatment Liquid 1N | 0.02 | 0.04 | 0.02 | 0.02 | 0.02 | 0.02 | 0.00133 | A |
| Example 21 | Treatment Liquid 1O | 0.005 | 0.003 | 0.006 | 0.001 | 0.001 | 0.001 | 0.00133 | A |
| Example 22 | Treatment Liquid 1P | 0.003 | 0.002 | 0.003 | 0.001 | 0.001 | 0.001 | 0.00133 | A |
| Example 23 | Treatment Liquid 1Q | 19 | 10 | 7 | 10 | 6 | 4 | 0.00667 | B |
| Example 24 | Treatment Liquid 3D | 0.02 | 0.04 | 0.02 | 0.02 | 0.02 | 0.02 | 0.00133 | A |
| Example 25 | Treatment Liquid 3E | 0.005 | 0.003 | 0.006 | 0.001 | 0.001 | 0.001 | 0.00133 | A |
| Example 26 | Treatment Liquid 3F | 0.003 | 0.002 | 0.003 | 0.001 | 0.001 | 0.001 | 0.00133 | A |
| Example 27 | Treatment Liquid 3G | 19 | 10 | 7 | 10 | 6 | 4 | 0.00667 | B |
| Example 28 | Treatment Liquid 4B | 0.02 | 0.04 | 0.02 | 0.02 | 0.02 | 0.02 | 0.00133 | A |
| Example 29 | Treatment Liquid 4C | 0.005 | 0.003 | 0.006 | 0.001 | 0.001 | 0.001 | 0.00133 | A |
| Example 30 | Treatment Liquid 4D | 0.003 | 0.002 | 0.003 | 0.001 | 0.001 | 0.001 | 0.00133 | A |
| Example 31 | Treatment Liquid 4E | 19 | 10 | 7 | 10 | 6 | 4 | 0.00667 | B |
| Example 32 | Treatment Liquid 5B | 0.02 | 0.04 | 0.02 | 0.02 | 0.02 | 0.02 | 0.00133 | A |
| Example 33 | Treatment Liquid 5C | 0.005 | 0.003 | 0.006 | 0.001 | 0.001 | 0.001 | 0.00133 | A |
| Example 34 | Treatment Liquid 5D | 0.003 | 0.002 | 0.003 | 0.001 | 0.001 | 0.001 | 0.00133 | A |
| Example 35 | Treatment Liquid 5E | 19 | 10 | 7 | 10 | 6 | 4 | 0.00667 | B |
| Example 36 | Treatment Liquid 6B | 0.02 | 0.04 | 0.02 | 0.02 | 0.02 | 0.02 | 0.00133 | A |
| Example 37 | Treatment Liquid 6C | 0.005 | 0.003 | 0.006 | 0.001 | 0.001 | 0.001 | 0.00133 | A |
| Example 38 | Treatment Liquid 6D | 0.003 | 0.002 | 0.003 | 0.001 | 0.001 | 0.001 | 0.00133 | A |
| Example 39 | Treatment Liquid 6E | 19 | 10 | 7 | 10 | 6 | 4 | 0.00667 | B |
| Example 40 | Treatment Liquid 7B | 0.02 | 0.04 | 0.02 | 0.02 | 0.02 | 0.02 | 0.00133 | A |
| Example 41 | Treatment Liquid 7C | 0.005 | 0.003 | 0.006 | 0.001 | 0.001 | 0.001 | 0.00133 | A |
| Example 42 | Treatment Liquid 7D | 0.003 | 0.002 | 0.003 | 0.001 | 0.001 | 0.001 | 0.00133 | A |
| Example 43 | Treatment Liquid 7E | 2 | 4 | 2 | 2 | 2 | 2 | 0.00133 | B |
| Example 44 | Treatment Liquid 7F | 0.005 | 0.00 | 0.05 | 0.02 | 0.01 | 0.02 | 0.00133 | A |
| Example 45 | Treatment Liquid 7G | 0.02 | 0.02 | 0.03 | 0.01 | 0.01 | 0.01 | 0.00133 | A |
| Example 46 | Treatment Liquid 8A | 0.003 | 0.002 | 0.003 | 0.001 | 0.001 | 0.001 | 0.00133 | A |
| Example 47 | Treatment Liquid 9A | 0.003 | 0.002 | 0.003 | 0.001 | 0.001 | 0.001 | 0.00133 | A |
| Comparative Example 1 | Treatment Liquid 1K | 1135 | 1083 | 936 | 321 | 264 | 185 | 0.04167 | E |
| Comparative Example 2 | Treatment Liquid 1L | 860 | 620 | 312 | 256 | 163 | 149 | 0.01333 | E |

TABLE 2

| Treatment Liquid | Compound (A) | Compound (B) | | |
|---|---|---|---|---|
| | | B1 | B2 | B3 |
| 1A TO 1Q | Butyl Acetate | 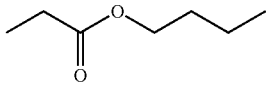 | 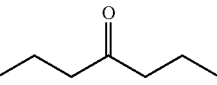 | |
| 2A | 1-Hexanol | 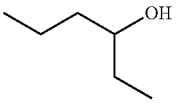 |  | |
| 3A TO 3G | 4-Methyl-2-Pentanol | 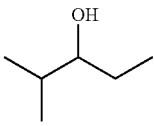 | 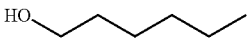 | |
| 4A TO 4E | PGMEA | 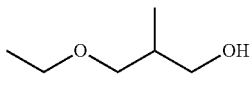 | 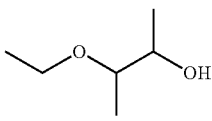 | |
| 5A TO 5E | IPA | 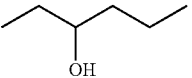 | | |
| 6A TO 6E | Butyl Acetate |  | 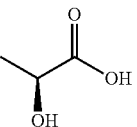 | |
| 7A TO 7G | Ethyl Acetate |  | 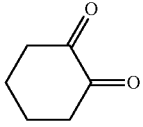 | 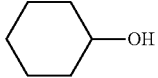 |
| 8A | PGME | 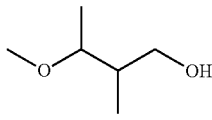 | 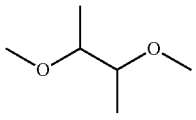 | |
| 9A | MMP | 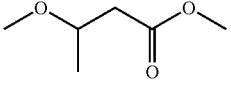 | 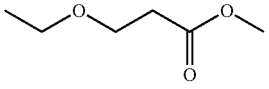 | |

<Purification Method of Treatment Liquids 7B to 7D and 7F to 7G>

By purifying the cyclohexanone (CyHx) crude liquid 7a obtained as described above using the following method, the treatment liquids 7B to 7D and 7F to 7G shown in Table 1 were obtained.

In the purification method, a manufacturing device having a structure corresponding to the manufacturing device shown in FIG. 2 was used, and the number of distillation steps or a filtration method (pore size, material) was selected so as to obtain the treatment liquids 7B to 7D and 7F to 7G having different purities. In the filtration method, as a filter used in the filtration device included in the manufacturing device, a filter shown in Table 3 below was used to adjust the purity of the treatment liquid.

Before purifying the crude liquid 7a using the purification method, the manufacturing device was cleaned with a cleaning liquid. In a cleaning method, the treatment liquid 7E (cyclohexanone) shown in Table 1 was used as the cleaning liquid, and the treatment liquid 7E was circulated through the filter 10 times. This operation was set as one set and was repeated three times.

TABLE 3

|  | Cleaning Liquid of Filter | Filter First | Filter Second | Filter Third | Treatment Liquid after Purification | Defect Suppressing Performance |
|---|---|---|---|---|---|---|
| Example 40 | CyHx (Treatment Liquid 7E) | IEX-PTFE(10 nm) surfric acid | PTFE(10 nm) | UPE(3 nm) | CyHx (Treatment Liquid 7B) | A |
| Example 41 | CyHx (Treatment Liquid 7E) | IEX-PTFE(10 nm) surfric acid | PTFE(10 nm) | Nylon(5 nm) | CyHx (Treatment Liquid 7C) | A |
| Example 42 | CyHx (Treatment Liquid 7E) | IEX-PTFE(10 nm) carboxylic acid | PTFE(10 nm) | Nylon(5 nm) | CyHx (Treatment Liquid 7D) | A |
| Example 44 | CyHx (Treatment Liquid 7E) | PTFE(10 nm) | Nylon(5 nm) |  | CyHx (Treatment Liquid 7F) | A |
| Example 45 | CyHx (Treatment Liquid 7E) | Nylon(5 nm) |  |  | CyHx (Treatment Liquid 7G) | A |

In Table 3, Nylon, polytetrafluoroethylene (PTFE), and ultra high molecular weight polyethylene (UPE) represent a filter including nylon as a major component, a filter including PTFE as a major component, and a filter including UPE as a major component, respectively. In addition, IEX-PTFE sulfuric acid and IEX-PTFE carboxylic acid (where IEX represents an ion exchange group) represent a filter in which the surface of PTFE was modified with sulfonic acid and a filter in which the surface of PTFE was modified with carboxylic acid, respectively.

<Preparation of Resist Patterns>

[Examples 101 to 112 and Comparative Examples 101 and 102] An organic antireflection film ARC29A (manufactured by Nissan Chemical Industries Ltd.) was applied to a silicon wafer and was baked at 205° C. for 60 seconds to form an antireflection film having a thickness of 78 nm. Next, a commercially available product FAiRS-9101A12 (ArF resist composition, manufactured by Fujifilm Electronic Materials Co., Ltd.) was applied to the organic antireflection film using a spin coater and was baked at 100° C. for 60 seconds. As a result, a resist film having a thickness of 150 nm was formed. The obtained wafer was exposed at 25 [mJ/cm$^2$] using an ArF excimer laser scanner (NA: 0.75) in a pattern shape. Next, the wafer was heated at 120° C. for 60 seconds and then was developed (negative type development) using each of the treatment liquids shown in Table 4 for 30 seconds. As a result, an L/S pattern was obtained.

After the development, the pattern according to each of Examples 105 to 107 was rinsed using each of the treatment liquids shown in Table 4 for 30 seconds. As a result, an L/S pattern was obtained.

[Examples 113 to 119] An organic antireflection film ARC29A (manufactured by Nissan Chemical Industries Ltd.) was applied to a silicon wafer and was baked at 205° C. for 60 seconds to form an antireflection film having a thickness of 78 nm. Next, in order to improve coating properties, a pre-wet step of applying the treatment liquid shown in Table 3 in advance was performed. Next, a commercially available product FAiRS-9101A12 (ArF resist composition, manufactured by Fujifilm Electronic Materials Co., Ltd.) was applied using a spin coater and was baked at 100° C. for 60 seconds. As a result, a resist film having a thickness of 150 nm was formed. The obtained wafer was exposed at 25 [mJ/cm$^2$] using an ArF excimer laser scanner (NA: 0.75) in a pattern shape. Next, the wafer was heated at 120° C. for 60 seconds and then was developed (negative type development) using each of the treatment liquids shown in Table 4 for 30 seconds. The obtained pattern was rinsed with the treatment liquid shown in Table 1. As a result, an L/S pattern was obtained.

[Lithographic Performance]

After the formation of the pattern, a line pattern upper surface and a space portion were observed using a critical dimension scanning electron microscope (S9380 II, manufactured by Hitachi Ltd.). The less the value of the dimension of the formed pattern, the better the performance. In the following standards, the evaluation D achieves the lithographic performance required for the resist pattern.

The evaluation results are shown in Table 4.

A: L/S=less than 80 nm
B: L/S=80 nm or more and less than 120 nm
C: L/S=120 nm or more and less than 150 nm
D: L/S=150 nm or more and less than 200 Dm
E: L/S=200 nm or more

TABLE 4

|  | Pre-Wet Step | Development Step | Rinsing Step | Lithographic Performance |
|---|---|---|---|---|
| Example 101 |  | Treatment Liquid 1A (Butyl Acetate) |  | B |
| Example 102 |  | Treatment Liquid 2A (1-Hexanol) |  | C |
| Example 103 |  | Treatment Liquid 3A (4-Methyl-2-Pentanol) |  | B |
| Example 104 |  | Treatment Liquid 6A (Ethyl Acetate) |  | C |
| Example 105 |  | Treatment Liquid 1B (Butyl Acetate) | Treatment Liquid 3B (4-Methyl-2-Pentanol) | B |
| Example 106 |  | Treatment Liquid 1C (Butyl Acetate) | Treatment Liquid 5A (IPA) | B |
| Example 107 |  | Treatment Liquid 1D (Butyl Acetate) | Treatment Liquid 4A (PGMEA) | B |
| Example 108 |  | Treatment Liquid 1E (Butyl Acetate) |  | C |
| Example 109 |  | Treatment Liquid 1F (Butyl Acetate) |  | C |
| Example 109 |  | Treatment Liquid 1F (Butyl Acetate) |  | B |
| Example 110 |  | Treatment Liquid 1G (Butyl Acetate) |  | C |
| Example 111 |  | Treatment Liquid 1H (Butyl Acetate) |  | C |
| Example 112 |  | Treatment Liquid 1I (Butyl Acetate) |  | D |
| Example 113 | Treatment Liquid 7A (Cyclohexanone) | Treatment Liquid 1J (Butyl Acetate) | Treatment Liquid 3C (4-Methyl-2-Pentanol) | A |

TABLE 4-continued

| | Pre-Wet Step | Development Step | Rinsing Step | Lithographic Performance |
|---|---|---|---|---|
| Example 114 | Treatment Liquid 7D (Cyclohexanone) | Treatment Liquid 1P (Butyl Acetate) | Treatment Liquid 3F (4-Methyl-2-Pentanol) | A |
| Example 115 | Treatment Liquid 7D (Cyclohexanone) | Treatment Liquid 4D (PGMEA) | Treatment Liquid 3F (4-Methyl-2-Pentanol) | A |
| Example 116 | Treatment Liquid 7D (Cyclohexanone) | Treatment Liquid 5D (IPA) | Treatment Liquid 3F (4-Methyl-2-Pentanol) | A |
| Example 117 | Treatment Liquid 7D (Cyclohexanone) | Treatment Liquid 6D (Ethyl Acetate) | Treatment Liquid 3F (4-Methyl-2-Pentanol) | A |
| Example 118 | Treatment Liquid 4D (PGMEA) | Treatment Liquid 1P (Butyl Acetate) | Treatment Liquid 3F (4-Methyl-2-Pentanol) | A |
| Example 119 | Treatment Liquid 9A (MMP) | Treatment Liquid 1P (Butyl Acetate) | Treatment Liquid 3F (4-Methyl-2-Pentanol) | A |
| Comparative Example 101 | | Treatment Liquid 1K (Butyl Acetate) | | E |
| Comparative Example 102 | | Treatment Liquid 1L (Butyl Acetate) | | E |

Examples 201 and 202 and Comparative Example 201

Dimethyl sulfoxide (manufactured by Wako Pure Chemical Industries, Ltd.) was prepared, was purified using a method described in JP2007-254168A, and was used for adjusting the treatment liquid after verifying that the content of each of Na, Ca, and Fe in the treatment liquid was lower than 10 mass ppb.

Example 201

90.5 parts by mass of the treatment liquid 1A according to Example 1 and 9.5 parts by mass of dimethyl sulfoxide obtained as described above were mixed with each other. As a result, a treatment liquid X-1 was prepared.

The treatment liquid X-1 included two or more compounds (B) satisfying the requirement (b) and the inorganic matter (C) in addition to the treatment liquid 1A and the dimethyl sulfoxide, the total content of the compound (B) was $10^{-10}$ to 0.1 mass %, and a ratio P of the inorganic matter (C) to the compounds (B) represented by Expression I was $10^3$ to $10^{-6}$. In a case where the treatment liquid X-1 was evaluated using the same method as in Example 1 and Example 101, the same defect suppressing performance as in Example 1 and the same lithographic performance as in Example 101 were obtained.

Example 202

95 parts by mass of the treatment liquid 1A according to Example 1 and 5 parts by mass of dimethyl sulfoxide obtained as described above were mixed with each other. As a result, a treatment liquid X-2 was prepared.

The treatment liquid X-2 included two or more compounds (B) satisfying the requirement (b) and the inorganic matter (C) in addition to the treatment liquid 1A and the dimethyl sulfoxide, the total content of the compound (B) was $10^{10}$ to 0.1 mass %, and a ratio P of the inorganic matter (C) to the compounds (B) represented by Expression I was $10^3$ to $10^{-6}$. In a case where the treatment liquid X-2 was evaluated using the same method as in Example 1 and Example 101, the same defect suppressing performance as in Example 1 and the same lithographic performance as in Example 101 were obtained.

Comparative Example 201

85 parts by mass of the treatment liquid 1A according to Example 1 and 15 parts by mass of dimethyl sulfoxide obtained as described above were mixed with each other. As a result, a treatment liquid X-3 was prepared. In a case where the treatment liquid X-3 was evaluated using the same method as in Example 1 and Example 101, the same result as in Example 1 was obtained. However, the treatment liquid remained after rinsing, and a long period of time was required for drying.

Examples 301 to 307

A first treatment liquid and a second treatment liquid shown in Table 5 below were mixed with each other at a ratio shown in Table 4. As a result, treatment liquids 101 to 106 were prepared. In addition, a treatment liquid 107 shown in Table 5 was the treatment liquid 9A prepared as described above. Regarding each of the treatment liquids 101 to 107, the defect suppressing performance was evaluated using the same method as described above. In addition, in a case where each of the treatment liquids was used as the pre-wet liquid, the resist saving performance was evaluated. In addition, in a case where each of the treatment liquids was used as the rinsing liquid after ashing or after p-CMP, the performance was evaluated. The results are shown in Table 5.

[Resist Saving Performance]

In a case where each of the treatment liquids was used as the pre-wet liquid, the resist saving performance was evaluated using the following method. In this specification, higher resist saving performance represent a state where the uniformity and the film thickness controllability were excellent. It can be seen that, in this state, deterioration of the lithographic performance and the occurrence of defects can be suppressed.

The resist composition 1 used is as follows.

<Resist Composition 1>

The following acid decomposable resin, a photoacid generator, a quencher, a hydrophobic resin, and a solvent were mixed with each other to prepare a resist composition 1 having a solid content concentration of 3.5 mass %.

The following acid decomposable resin: 100 parts by mass

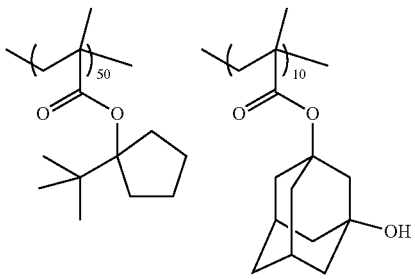

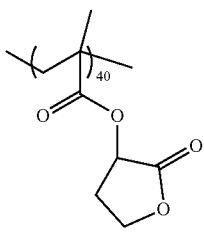

The weight-average molecular weight (Mw) of the acid decomposable resin was 7500, and a numerical value described in each repeating unit refers to mol %.

The following photoacid generator: 8 parts by mass

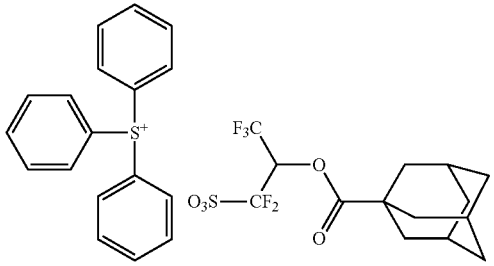

The following four kinds of quenchers: 5 parts by mass (total)

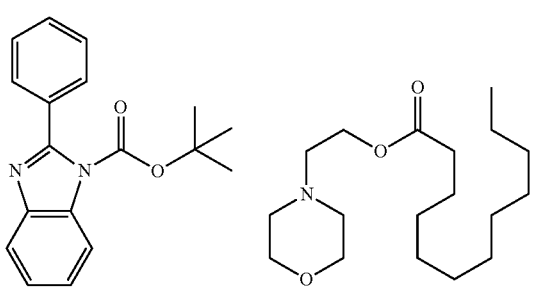

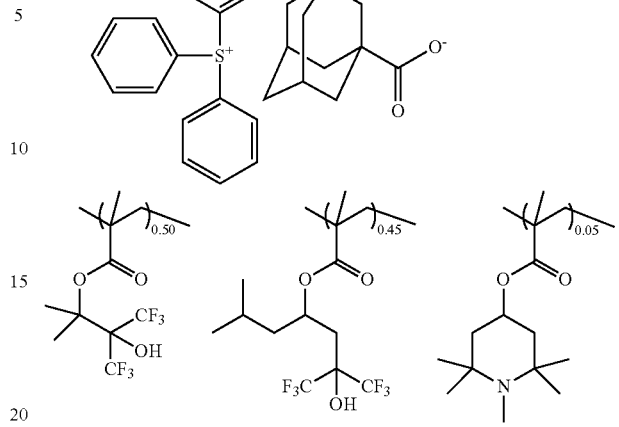

The mass ratio of the quenchers was 0.1:0.3:0.3:0.2 in order from the left. Among the four kinds of quenchers, the weight-average molecular weight (Mw) of the right polymer type quencher was 5000. In addition, a numerical value described in each repeating unit represents a molar ratio.

The following two kinds of hydrophobic resins: 4 parts by mass (total)

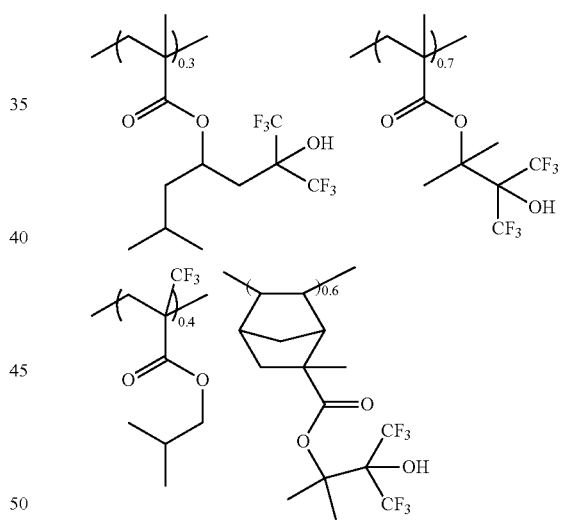

The mass ratio of the hydrophobic resins was 0.5:0.5 in order from the left. Among the two kinds of hydrophobic resins, the weight-average molecular weight (Mw) of the left hydrophobic resin was 7000, and the weight-average molecular weight (Mw) of the right hydrophobic resin was 8000. In each of the hydrophobic resins, a numerical value described in each repeating unit represents a molar ratio.

Solvent 1:

PGMEA (manufactured by Wako Pure Chemical Industries, Ltd.): 3 parts by mass

CyHx (cyclohexanone; manufactured by Wako Pure Chemical Industries, Ltd.): 600 parts by mass GBL (γ-butyrolactone; manufactured by Wako Pure Chemical Industries, Ltd.): 100 parts by mass <Resist Composition 2>

A resist composition 2 was prepared under the same conditions as those of the resist composition 1, except that the following solvent 2 was used instead of the solvent 1 (PGMEA:CyHx:GBL=3 parts by mass:600 parts by mass: 100 parts by mass).

Solvent 2:

Treatment liquid 4A (PGMEA): 3 parts by mass

Treatment liquid 7D (CyHx): 600 parts by mass

GBL (γ-butyrolactone; manufactured by Wako Pure Chemical Industries, Ltd.): 100 parts by mass <Uniformity>

First, for comparison, the resist composition 1 (or the resist composition 2) was directly applied to a silicon wafer having a diameter of about 30 cm (12 inch) including an antireflection film. For the application, a spin coater (trade name: "LITHIUS", manufactured by Tokyo Electron Ltd.) was used. The obtained resist film was baked at 90° C. Regarding the baked resist film, 59 points were mapped using a film thickness measuring device Lambda Ace (manufactured by Screen Holdings Co., Ltd.) to verify that coating unevenness did not occur. No coating unevenness represents a state where there was no unevenness in the thickness of a resist film as a measurement target in a case where 59 measurement points in a circular shape were extracted from the resist film of the measurement target and the results of measuring the thickness of the resist film at each of the measurement points were two-dimensionally disposed for each of the measurement points.

Next, a silicon wafer having a diameter of about 30 cm (12 inch) including an antireflection film was separately prepared, and each of the treatment liquids was added dropwise thereto. Next, the same amount of the resist composition 1 (or the resist composition 2) as that used for comparison was applied to the silicon wafer and was baked at 90° C. The obtained resist film was observed using the same method as described above and verified that coating unevenness did not occur. Next, the amount of the resist composition 1 (or the resist composition 2) used was reduced to be 50 mass % or 30 mass % with respect to the amount used for comparison, and then the same test as described above was performed to determine whether or not coating unevenness occurred.

The results were evaluated based on the following standards, and the evaluation results are shown in Table 5.

AA: in either case where the amount of the resist composition used was reduced to be 30 mass % or 50 mass % with respect to the amount used for comparison, coating unevenness did not occur.

A: in a case where the amount of the resist composition used was reduced to be 50 mass % with respect to the amount used for comparison, coating unevenness did not occur; however, in a case where the amount of the resist composition used was reduced to be 30 mass % with respect to the amount used for comparison, coating unevenness occurred.

B: in either case where the amount of the resist composition used was reduced to be 30 mass % or 50 mass % with respect to the amount used for comparison, coating unevenness occurred.

<Film Thickness Controllability>

Each of the treatment liquids was added dropwise to a silicon wafer having a diameter of about 30 cm (12 inch) including an antireflection film. Next, the resist composition 1 (or the resist composition 2) was directly applied such that the thickness of the obtained resist film was 8.5 nm. For the application, a spin coater (trade name: "LITHIUS", manufactured by Tokyo Electron Ltd.) was used. The obtained resist film was baked at 90° C. Regarding the baked resist film, 59 points were mapped using a film thickness measuring device Lambda Ace (manufactured by Screen Holdings Co., Ltd.) to obtain a standard deviation (hereinafter, also referred to as "σ") of the thickness of the resist film Next, 3σ was obtained from the standard deviation.

The results were evaluated based on the following standards, and the evaluation results are shown in Table 5.

A: 3σ was less than 0.15 nm

B: 3σ was 0.15 nm or more and less than 0.2 nm

C: 3σ was 0.2 nm or more

[Rinsing Performance after Removal by Ashing]

The resist composition 1 (or the resist composition 2) was applied to the silicon wafer, was exposed (50 mJ), and was dried by heating (220° C.). As a result, the 12-inch wafer including the resist film (thickness: 0.5 μm) was prepared. Next, using plasma gas, the resist film was removed by ashing under the following conditions. Next, the wafer was cleaned using each of the treatment liquids (treatment liquids 101 to 107) shown in Table 5 to remove residues (ashing residues) after the removal by ashing. Next, by counting the number of defects in the cleaned wafer using SP-2 (manufactured by KLA-Tencor Corporation), the rinsing performance of each of the treatment liquids with respect to the ashing residues was evaluated.

[Conditions of Removal by Ashing]

Wafer Temperature: 250° C.

$O_2$ gas flow rate: 1000 sccm

Pressure: 70 Pa

Microwave power: 1 kW

Evaluation Standards

AA: the number of defects was 50 or less

A: the number of defects was more than 50 and 80 or less

B: the number of defects was more than 80 and 100 or less

C: the number of defects was more than 100 and 150 or less

D: the number of defects was more than 150

[Rinsing Performance after p-CMP]

Using CSL9044C (slurry manufactured by FFPS), a surface of SEMATECH 845 (copper wiring, barrier metal: TaN, oxide film: TEOS; manufactured by SEMATECH) having a diameter of 12 inch was polished to be planarized. Next, the surface of SEMATECH 845 was finish-polished using BSL8178C (slurry manufactured by FFPS).

Next, the surface of SEMATECH 845 was cleaned using Clean 100 (manufactured by Wako Pure Chemical Industries, Ltd.), and each of the treatment liquids was used as a rinsing liquid. Next, using a pattern defect inspection device (ComPLUS, manufactured by AMAT), the number of defects on the pattern of SEMATECH 854 was measured. The results were evaluated based on the following standards.

Evaluation Standards

AA: the number of defects was 50 or less

A: the number of defects was more than 50 and 80 or less

B: the number of defects was more than 80 and 100 or less

C: the number of defects was more than 100 and 150 or less

D: the number of defects was more than 150

TABLE 5

| | | First Treatment Liquid | | Second Treatment Liquid | | Defect | Resist Saving Performance Resist Composition 1 | |
|---|---|---|---|---|---|---|---|---|
| | | Kind | Content (mass %) | Kind | Content (mass %) | Suppressing Performance | Uniformity | Film Thickness Controllability |
| Example 301 | Treatment Liquid 101 | PGME (Treatment Liquid 8A) | 30 | PGME (Treatment Liquid 4A) | 70 | B | A | A |
| Example 302 | Treatment Liquid 102 | PGME (Treatment Liquid 8A) | 30 | CyHe (Treatment Liquid 7D) | 70 | A | AA | A |
| Example 303 | Treatment Liquid 103 | PGME (Treatment Liquid 8A) | 30 | EL (Treatment Liquid 6A) | 70 | A | AA | A |
| Example 304 | Treatment Liquid 104 | nBA (Treatment Liquid 1P) | 30 | PGMEA (Treatment Liquid 4A) | 70 | B | A | A |
| Example 305 | Treatment Liquid 105 | nBA (Treatment Liquid 1P) | 30 | CyHe (Treatment Liquid 7D) | 70 | A | AA | A |
| Example 306 | Treatment Liquid 106 | nBA (Treatment Liquid 1P) | 30 | EL (Treatment Liquid 6A) | 70 | A | AA | A |
| Example 307 | Treatment Liquid 107 | MMP (Treatment Liquid 9A) | 100 | | | A | AA | A |

| | Resist Saving Performance Resist Composition 2 | | Rinsing Performance after Removal by Ashing | | Rinsing Performance after p-CMP |
|---|---|---|---|---|---|
| | Uniformity | Film Thickness Controllability | Resist Composition 1 | Resist Composition 2 | |
| Example 301 | A | A | A | A | A |
| Example 302 | AA | A | A | A | AA |
| Example 303 | AA | A | A | A | AA |
| Example 304 | A | A | A | A | A |
| Example 305 | AA | A | A | A | AA |
| Example 306 | AA | A | A | A | AA |
| Example 307 | AA | A | A | A | AA |

What is claimed is:

1. A treatment liquid for manufacturing a semiconductor comprising:
   one compound (A) that satisfies the following requirement (a);
   one compound (B) or two or more compounds (B) that satisfy the following requirement (b); and
   one inorganic matter (C) or two or more inorganic matters (C) having any element selected from the group consisting of Al, B, S, N, and K,
   wherein a total content of the compound (B) in the treatment liquid is $10^{-10}$ to 0.1 mass %,
   a ratio P of the inorganic matter (C) to the compound (B) represented by the following Expression I is $10^3$ to $10^{-6}$,
   the requirement (a): a compound that is selected from the group consisting of a first alcohol compound, a first ketone compound, and a first ester compound and of which a content in the treatment liquid is 90.0 to 99.9999999 mass %,
   the requirement (b): a compound that is selected from the group consisting of a second alcohol compound having 6 or more carbon atoms, a second ketone compound, a second ester compound, an ether compound, and an aldehyde compound, wherein the second ester compound is represented by the following Formula I:

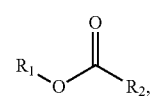

wherein in Formula I, $R_1$ and $R_2$ each independently represents an alkyl group or a cycloalkyl group,
   and of which a content in the treatment liquid is $10^{-11}$ to 0.1 mass %, and Q=[Total Mass of Inorganic Matter (C)]/[Total Mass of Compound (B)]   Expression I, wherein the first alcohol compound is different from the second alcohol compound, the first ketone compound is different from the second ketone compound, and the first ester compound is different from the second ester compound.

2. The treatment liquid for manufacturing a semiconductor according to claim 1, wherein the inorganic matter (C) is a compound having any element selected from the group consisting of Al, B, and S.

3. The treatment liquid for manufacturing a semiconductor according to claim 1,
wherein a content of the one inorganic matter (C) or each of the two or more inorganic matters (C) in the treatment liquid for manufacturing a semiconductor is 0.0001 to 100 mass ppb.

4. The treatment liquid for manufacturing a semiconductor according to claim 1,
wherein a content of the one inorganic matter (C) or each of the two or more inorganic matters (C) in the treatment liquid for manufacturing a semiconductor is 0.001 to 100 mass ppb.

5. The treatment liquid for manufacturing a semiconductor according to claim 1,
wherein the treatment liquid for manufacturing a semiconductor comprises Na, Ca, and Fe, and
a content of each of Na, Ca, and Fe is 0.01 mass ppt to 1000 mass ppb.

6. The treatment liquid for manufacturing a semiconductor according to claim 1,
wherein the treatment liquid for manufacturing a semiconductor comprises metal atoms, and
a total content of metal particles derived from the metal atoms measured by a SNP-ICP-MS method is 0.001 to 100 mass ppt.

7. The treatment liquid for manufacturing a semiconductor according to claim 1,
wherein the treatment liquid for manufacturing a semiconductor comprises metal atoms, and
a total content of metal particles derived from the metal atoms measured by a SNP-ICP-MS method is 1 to 100 mass ppt.

8. The treatment liquid for manufacturing a semiconductor according to claim 1,
wherein the treatment liquid for manufacturing a semiconductor comprises at least one of compounds represented by the following Formulae I to V as the compound (B),

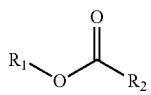

I

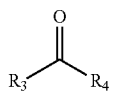

II

III

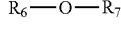

IV

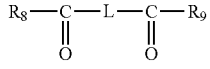

V in Formula I, $R_1$ and $R_2$ each independently represent an alkyl group or a cycloalkyl group, in Formula II, $R_3$ and $R_4$ each independently represent a hydrogen atom, an alkyl group, an alkenyl group, a cycloalkyl group, or a cycloalkenyl group or may be bonded to each other to form a ring, and both $R_3$ and $R_4$ do not represent a hydrogen atom,
in Formula III, $R_5$ represents an alkyl group or a cycloalkyl group,
in Formula IV, $R_6$ and $R_7$ each independently represent an alkyl group or a cycloalkyl group or may be bonded to each other to form a ring,
in Formula V, $R_8$ and $R_9$ each independently represent an alkyl group or a cycloalkyl group or may be bonded to each other to form a ring, and L represents a single bond or an alkylene group.

9. The treatment liquid for manufacturing a semiconductor according to claim 1,
wherein a ratio Q of the compound (A) to the compound (B) represented by the following Expression II is $10^4$ to $10^{10}$, $$Q = [\text{Total Mass of Compound (A)}]/[\text{Total Mass of Compound (B)}] \quad \text{Expression II.}$$

10. A treatment liquid for manufacturing a semiconductor comprising:
two or more treatment liquids for manufacturing a semiconductor according to claim 1.

11. The treatment liquid for manufacturing a semiconductor according to claim 1,
wherein the treatment liquid for manufacturing a semiconductor is a developer.

12. The treatment liquid for manufacturing a semiconductor according to claim 1,
wherein the treatment liquid for manufacturing a semiconductor is a rinsing liquid.

13. The treatment liquid for manufacturing a semiconductor according to claim 1,
wherein the treatment liquid for manufacturing a semiconductor is a pre-wet liquid.

14. A method of manufacturing the treatment liquid for manufacturing a semiconductor according to claim 1, the method comprising:
obtaining a crude liquid including the compound (A), the compound (B), and the inorganic matter (C) by causing one raw material or two or more raw materials to react with each other in the presence of a catalyst so as to synthesize the compound (A); and
purifying the crude liquid.

15. A pattern forming method comprising:
a step of applying an actinic ray-sensitive or radiation-sensitive resin composition to a substrate to form an actinic ray-sensitive or radiation-sensitive film;
a step of exposing the actinic ray-sensitive or radiation-sensitive film; and
a step of treating the substrate or the actinic ray-sensitive or radiation-sensitive film using the treatment liquid for manufacturing a semiconductor according to claim 1.

16. The pattern forming method according to claim 15, wherein the pattern forming method comprises at least a step of developing the actinic ray-sensitive or radiation-sensitive film by using the treatment liquid for manufacturing a semiconductor as a developer as the step of treating the substrate or the actinic ray-sensitive or radiation-sensitive film using the treatment liquid for manufacturing a semiconductor.

17. The pattern forming method according to claim 15, wherein the pattern forming method comprises at least a step of cleaning the actinic ray-sensitive or radiation-sensitive film by using the treatment liquid for manufacturing a semiconductor as a rinsing liquid as the step of treating the substrate or the actinic ray-sensitive or radiation-sensitive film using the treatment liquid for manufacturing a semiconductor.

18. The pattern forming method according to claim 15, wherein the pattern forming method comprises at least a step of treating the substrate by using the treatment liquid for manufacturing a semiconductor as a pre-wet liquid as the step of treating the substrate or the actinic ray-sensitive or radiation-sensitive film using the treatment liquid for manufacturing a semiconductor.

19. The pattern forming method according to claim 15, wherein in a case where the actinic ray-sensitive or radiation-sensitive film before exposure is dipped in the treatment liquid for manufacturing a semiconductor, a dissolution rate of the actinic ray-sensitive or radiation-sensitive film at 23° C. is 0.0 016 to 0.33 nm/sec.

20. A method of manufacturing an electronic device comprising:
the pattern forming method according to claim 15.

21. A treatment liquid for manufacturing a semiconductor comprising:
one compound (A) that satisfies the following requirement (a);
one compound (B) or two or more compounds (B) that satisfy the following requirement (b);
one inorganic matter (C) or two or more inorganic matters (C) having any element selected from the group consisting of Al, B, S, N, and K; and
metal atoms,
wherein a total content of the compound (B) in the treatment liquid is $10^{-10}$ to 0.1 mass %,
a ratio P of the inorganic matter (C) to the compound (B) represented by the following Expression I is $10^3$ to $10^{-6}$,
a total content of metal particles derived from the metal atoms measured by a SNP-ICP-MS method is 0.001 to 100 mass ppt,
the requirement (a): a compound that is selected from the group consisting of a first alcohol compound, a first ketone compound, and a first ester compound and of which a content in the treatment liquid is 90.0 to 99.9999999 mass %,
the requirement (b): a compound that is selected from the group consisting of a second alcohol compound having 6 or more carbon atoms, a second ketone compound, a second ester compound, an ether compound, and an aldehyde compound, wherein the second ester compound is represented by the following Formula I:

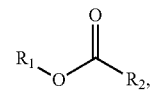

wherein in Formula I, $R_1$ and $R_2$ each independently represents an alkyl group or a cycloalkyl group,
and of which a content in the treatment liquid is $10^{-11}$ to 0.1 mass %, and P=[Total Mass of Inorganic Matter (C)]/[Total Mass of Compound (B)] Expression I, wherein the first alcohol compound is different from the second alcohol compound, the first ketone compound is different from the second ketone compound, and the first ester compound is different from the second ester compound.

22. A treatment liquid for manufacturing a semiconductor comprising:
one compound (A) that satisfies the following requirement (a);
one compound (B) or two or more compounds (B) that satisfy the following requirement (b); and
one inorganic matter (C) or two or more inorganic matters (C) having any element selected from the group consisting of Al, B, S, N, and K,
wherein a total content of the compound (B) in the treatment liquid is $10^{-10}$ to 0.1 mass %,
a ratio P of the inorganic matter (C) to the compound (B) represented by the following Expression I is $10^3$ to $10^{-6}$,
the requirement (a): a compound that is selected from the group consisting of a first alcohol compound, a first ketone compound, and a first ester compound and of which a content in the treatment liquid is 90.0 to 99.9999999 mass %,
the requirement (b): a compound that is selected from the group consisting of a second alcohol compound having 6 or more carbon atoms, a second ketone compound, a second ester compound, an ether compound, and an aldehyde compound and of which a content in the treatment liquid is $10^{-11}$ to 0.1 mass %, and P=[Total Mass of Inorganic Matter (C)]/[Total Mass of Compound (B)] Expression I, wherein the first alcohol compound is different from the second alcohol compound, the first ketone compound is different from the second ketone compound, and the first ester compound is different from the second ester compound, and
the first ketone compound is selected from the group consisting of acetone, 1-hexanone, 2-hexanone, cyclohexanone, methyl isobutyl ketone, acetylacetone, acetonylacetone, acetyl carbinol, propylene carbonate, γ-butyrolactone and a diketone compound.

23. A treatment liquid for manufacturing a semiconductor comprising:
one compound (A) that satisfies the following requirement (a);
one compound (B) or two or more compounds (B) that satisfy the following requirement (b); and one inorganic matter (C) or two or more inorganic matters (C) having any element selected from the group consisting of Al, B, S, N, and K, wherein a total content of the compound (B) in the treatment liquid is $10^{-10}$ to 0.1 mass %, a ratio P of the inorganic matter (C) to the compound (B) represented by the following Expression I is $10^3$ to $10^{-6}$, the requirement (a): a compound that is selected from the group consisting of a first alcohol compound, a first ketone compound, and a first ester compound and of which a content in the treatment liquid is 99.999 to 99.9999999 mass %, the requirement (b): a compound that is selected from the group consisting of a second alcohol compound having 6 or more carbon atoms, a second ketone compound, a second ester compound, an ether compound, and an aldehyde compound and of which a content in the treatment liquid is $10^{-11}$ to 0.1 mass %, and P=[Total Mass of Inorganic Matter (C)]/[Total Mass of Compound (B)]  Expression I, wherein the first alcohol compound is different from the second alcohol compound, the first ketone compound is different from the second ketone compound, and the first ester compound is different from the second ester compound.

24. A treatment liquid for manufacturing a semiconductor comprising:

one compound (A) that satisfies the following requirement (a);

one compound (B) or two or more compounds (B) that satisfy the following requirement (b); and one inorganic matter (C) or two or more inorganic matters (C) having any element selected from the group consisting of Al, B, S, N, and K, wherein a total content of the compound (B) in the treatment liquid is $10^{-10}$ to 0.1 mass %, a ratio P of the inorganic matter (C) to the compound (B) represented by the following Expression I is $10^3$ to $10^{-6}$, the requirement (a): a compound that is selected from the group consisting of a first alcohol compound, a first ketone compound, and a first ester compound and of which a content in the treatment liquid is 90.0 to 99.9999999 mass %, the requirement (b): a compound that is selected from the group consisting of a second alcohol compound having 6 or more carbon atoms, a second ketone compound, a second ester compound, an ether compound, and an aldehyde compound and of which a content in the treatment liquid is $10^{-10}$ to $10^{-4}$ mass %, and P=[Total Mass of Inorganic Matter (C)]/[Total Mass of Compound (B)]  Expression I, wherein the first alcohol compound is different from the second alcohol compound, the first ketone compound is different from the second ketone compound, and the first ester compound is different from the second ester compound.

25. A treatment liquid for manufacturing a semiconductor comprising:

one compound (A) that satisfies the following requirement (a);

one compound (B) or two or more compounds (B) that satisfy the following requirement (b); and one inorganic matter (C) or two or more inorganic matters (C) having any element selected from the group consisting of Al, B, S, N, and K, wherein a total content of the compound (B) in the treatment liquid is $10^{-10}$ to 0.1 mass %, a ratio P of the inorganic matter (C) to the compound (B) represented by the following Expression I is $10^3$ to $10^{-6}$, the requirement (a): a compound that is selected from the group consisting of a first alcohol compound, a first ketone compound, and a first ester compound and of which a content in the treatment liquid is 90.0 to 99.9999999 mass %, the requirement (b): a compound that is selected from the group consisting of a second alcohol compound having 6 or more carbon atoms, a second ketone compound, a second ester compound, an ether compound, and an aldehyde compound and of which a content in the treatment liquid is $10^{-11}$ to 0.1 mass %, and P=[Total Mass Inorganic Matter (C)]/[Total Mass of Compound (B)]  Expression I, wherein the first alcohol compound is different from the second alcohol compound, the first ketone compound is different from the second ketone compound, and the first ester compound is different from the second ester compound, and wherein the treatment liquid for manufacturing a semiconductor does not contain an acid.

* * * * *